United States Patent
Shinkai et al.

(10) Patent No.: US 8,847,211 B2
(45) Date of Patent: Sep. 30, 2014

(54) DEVICE, THIN FILM TRANSISTOR, METHOD FOR MANUFACTURING THE DEVICE AND METHOD FOR MANUFACTURING THE THIN FILM TRANSISTOR

(75) Inventors: Seiji Shinkai, Fukuoka (JP); Shuichi Haraguchi, Machida (JP); Tomohiro Shiraki, Champaign, IL (US); Masashi Ogawa, Fukuoka (JP); Shuhei Nakatani, Osaka (JP); Kei Sakanoue, Fukuoka (JP); Osamu Goto, Tsukuba (JP); Hidenobu Kakimoto, Tsukuba (JP)

(73) Assignees: Panasonic Corporation, Osaka (JP); Sumitomo Chemical Company, Limited, Tokyo (JP)

( * ) Notice: Subject to any disclaimer, the term of this patent is extended or adjusted under 35 U.S.C. 154(b) by 312 days.

(21) Appl. No.: 13/510,178

(22) PCT Filed: Nov. 18, 2010

(86) PCT No.: PCT/JP2010/070574
§ 371 (c)(1),
(2), (4) Date: Sep. 4, 2012

(87) PCT Pub. No.: WO2011/062226
PCT Pub. Date: May 26, 2011

(65) Prior Publication Data
US 2012/0319090 A1 Dec. 20, 2012

(30) Foreign Application Priority Data
Nov. 18, 2009 (JP) ................. 2009-263201

(51) Int. Cl.
*H01L 35/24* (2006.01)

(52) U.S. Cl.
USPC .................. 257/40; 257/E51.001

(58) Field of Classification Search
USPC ............................... 257/40, E51.001
See application file for complete search history.

(56) References Cited

U.S. PATENT DOCUMENTS

| | | |
|---|---|---|
| 2002/0067123 A1 | 6/2002 | Seki et al. |
| 2009/0011227 A1 | 1/2009 | Furukawa |
| 2010/0108999 A1 | 5/2010 | Mueller et al. |

FOREIGN PATENT DOCUMENTS

| | | |
|---|---|---|
| EP | 1651013 A1 | 4/2006 |
| JP | 09-197658 A | 7/1997 |

(Continued)

OTHER PUBLICATIONS

Notification of Reasons for Rejection issued Jan. 7, 2014 in corresponding Japanese Patent Application No. 2009-263201 with English translation.

(Continued)

*Primary Examiner* — Anthony Ho
(74) *Attorney, Agent, or Firm* — Sughrue Mion, PLLC

(57) ABSTRACT

A problem of the present invention is to provide a device having good characteristics and long life, wherein a functional thin film is formed in a desired region by a coating method; a thin film transistor; a method for producing the device; and a method for producing the thin film transistor. This problem can be solved by a device comprising: a substrate, a first electrode formed on the substrate, a functional thin film formed above the first electrode, and a second electrode disposed above the functional thin film, characterized by further comprising, in a region surrounding the region where the functional thin film is formed, a film containing a compound in which a group containing fluorine and a π-conjugated system are bound together by a cycloalkene structure or a cycloalkane structure.

21 Claims, 5 Drawing Sheets

(56) References Cited

FOREIGN PATENT DOCUMENTS

| | | |
|---|---|---|
| JP | 11-344804 A | 12/1999 |
| JP | 2000-282240 A | 10/2000 |
| JP | 2003-257656 A | 9/2003 |
| JP | 2009-070729 A | 4/2009 |
| JP | 2009-087996 A | 4/2009 |
| WO | 01/74121 A1 | 10/2001 |
| WO | 2006/046699 A1 | 5/2006 |
| WO | 2007/102487 A1 | 9/2007 |
| WO | 2008/131836 A1 | 11/2008 |
| WO | 2009/122445 A2 | 10/2009 |

OTHER PUBLICATIONS

Extended European Search Report issued Aug. 19, 2013 in corresponding European Patent Application No. 10831619.1.

International Search Report of PCT/JP2010/070574 dated Feb. 22, 2011.

First Office Action issued Jul. 16, 2014 in corresponding Chinese Patent Application No. 201080052072.0 with English translation.

DEVICE, THIN FILM TRANSISTOR, METHOD FOR MANUFACTURING THE DEVICE AND METHOD FOR MANUFACTURING THE THIN FILM TRANSISTOR

CROSS REFERENCE TO RELATED APPLICATIONS

This application is a National Stage of International Application No. PCT/JP2010/070574 filed Nov. 18, 2010, claiming priority based on Japanese Patent Application No. 2009-263201 filed Nov. 18, 2009, the contents of all of which are incorporated herein by reference in their entirety.

TECHNICAL FIELD

The present invention relates to a device having a functional thin film, a thin film transistor, a method for producing the device and a method for producing the thin film transistor.

BACKGROUND ART

In the field of an organic thin film transistor device, an organic thin film solar cell, an organic EL display and the like, many functional thin films are investigated. The functional thin film is a thin film subjected to so-called fine patterning, which includes a material exhibiting various functions and is arranged at locations where the functions needs to be exhibited in a device with precision required for exhibiting the functions. Examples of the functions to be exhibited by patterning include functions of wiring, an electrode, an insulating layer, a light-emitting layer, a charge transporting layer and the like. As a technique of performing such patterning, an ink-jet method, a nozzle coating method, and various roll printing methods, for example, a method of directly patterning a substrate by using flexo printing or reversing, are proposed. These printing methods use an ink which is usually relatively low in concentration and viscosity.

In the case where an ink of a high-molecular weight organic material is applied to produce an organic EL display, there is known a method of disposing a so-called bank serving as a separating wall for separation of pixels. This is a method in which functional thin films such as a charge injection layer, an intermediate layer (interlayer), a light-emitting layer and the like are applied to the inside of the bank by an ink-jet method or some other coating method, and dried to apply the functional thin films separately, and for example, a method of forming a bank using an inorganic insulating film ($SiO_2$) and an organic insulating film formed thereon is proposed (Patent Document 1). However, in this method, there is a problem that the applied ink rises and spreads along the bank, and therefore a film having a sufficient thickness cannot be obtained. As a method for solving this problem, there is proposed a method in which a surface of the bank is subjected to processing for imparting liquid-repellency to suppress rising of the ink along the bank (Patent Document 2). This is a method in which a fluorine-based ($CF_4$) plasma treatment is performed to enhance surface tension of the bank and improve ink retention force to obtain a desired thickness of the functional thin film.

As a specific example of a method in which a lyophilic region and a liquid-repellent region are formed by performing processing for imparting liquid-repellency on a surface of a substrate such a bank surface, there is known a method in which a liquid-repellent substance such as a fluorine-containing silane coupling agent is applied onto a surface of a lyophilic thin film to form a liquid-repellent thin film, a part of the liquid-repellent thin film is irradiated with light having a wavelength less than 200 nm to decompose the liquid-repellent substance, and then the decomposed product is removed. In the substrate obtained by this method, only a site irradiated with light becomes a lyophilic surface (Patent Document 3).

Further, as a method of using light with a relatively long wavelength, there is a method in which a thin film of a liquid-repellent composition, containing a compound having a liquid-repellent group and a photopolymerization initiator, is formed on a lyophilic substrate, and a part of the thin film is irradiated with light to polymerize the liquid-repellent composition and make the composition insoluble in a solvent, and an unpolymerized portion of the composition is removed by use of a solvent to pattern a lyophilic region (Patent Document 4).

Moreover, as a method of using ultraviolet light with a relatively long wavelength, there is also known a method in which a liquid-repellent thin film containing a photocatalyst such as titanium oxide is formed on a lyophilic layer and a part of the thin film is irradiated with light to decompose the liquid-repellent thin film and to pattern a lyophilic region (Patent Document 5).

PRIOR ART DOCUMENTS

Patent Documents

Patent Document 1: International Publication WO 01/074121
Patent Document 2: Japanese Patent Laid-open Publication No. 2003-257656
Patent Document 3: Japanese Patent Laid-open Publication No. 2000-282240
Patent Document 4: International Publication WO 2007/102487
Patent Document 5: Japanese Patent Laid-open Publication No. H11 (1999)-344804

SUMMARY OF THE INVENTION

Problems to be Solved by the Invention

However, in the above-mentioned conventional techniques, there were the following problems.

A method of radiating light with a wavelength less than 200 nm is a method of radiating light with high energy for a long time and requires large-scale facilities and special apparatuses such as vacuum equipment, a high-energy light source and the like, and therefore it has a problem that production cost increases. Further, when a surface of a substrate such as a bank is subjected to processing for imparting liquid-repellency by high-energy irradiation, a member composing the substrate or the substrate surface is damaged at the molecular level. As a result of this, there is a problem that the damaged molecules on the surface of the substrate diffuse in the functional thin film applied onto the substrate and this degrades properties of the functional thin film and causes characteristics and life of the functional thin film to deteriorate. Specifically, since a part of a surface of a substrate such as a bank is damaged, moisture and oxygen during a production process and the like tend to adsorb on and penetrate into the substrate surface. Thereby, the moisture and oxygen having penetrated into the substrate penetrate into the functional thin film with time and have a detrimental effect on the characteristics of the functional thin film.

Also, since the method of using light with a relatively long wavelength uses light with relatively low energy, a photopolymerization initiator needs to be applied onto the surface of the substrate though damages to the surface of the substrate can be reduced. In this case, since the photopolymerization initiator is also applied to the functional thin film formed in the substrate, there is a problem that a reaction residue of the photopolymerization initiator causes the characteristics of the functional thin film to deteriorate.

Also, the method of using ultraviolet light with a relatively long wavelength has a problem that a photocatalyst causes the characteristics of a functional thin film formed thereon to deteriorate.

Thus, devices, such as an organic EL display and a solar cell, produced by subjecting the functional thin film to fine patterning by a printing method, have problems of characteristics, life and the like.

The present invention was made to solve the above-mentioned problems, and it is an object of the present invention to provide a device having good characteristics and long life, in which a functional thin film is formed in a desired region by a coating method; a thin film transistor; a method for producing the device; and a method for producing the thin film transistor.

Means for Solving the Problems

In order to solve the above-mentioned problems, the device of an embodiment of the present invention comprises:
a substrate,
a first electrode formed on the substrate,
a functional thin film formed above the first electrode, and
a second electrode disposed above the functional thin film, and the device further comprises, in a region surrounding the region where the functional thin film is formed, a film containing a compound in which a group containing fluorine and a π-conjugated system are bound together by a cycloalkene structure or a cycloalkane structure.

Effects of the Invention

In accordance with an embodiment of the present invention, since processing for imparting liquid-repellency can be performed with light with relatively low energy without applying a photopolymerization initiator or a photocatalyst, it is possible to prevent damages to a member composing a substrate or a substrate surface to which the functional thin film is applied and prevent the molecules in the damaged member from diffusing in the functional thin film. As a result of this, degradation of characteristics of the functional thin film or deterioration of life characteristics can be prevented and a device adequately exhibiting functions of the functional thin film can be constructed.

MODES FOR CARRYING OUT THE INVENTION

Figure 1:
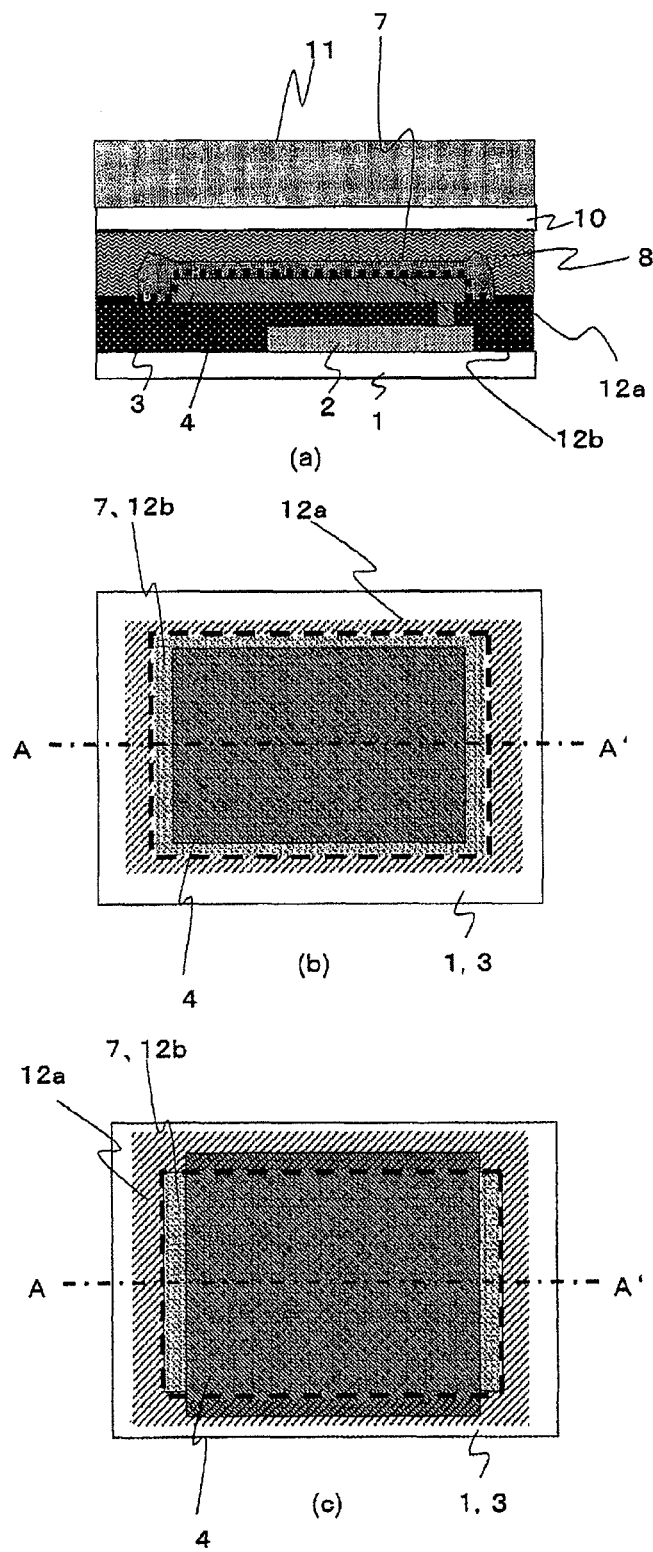
FIG. 1 is a structural drawing of an organic EL device in Embodiment 1.

A device in accordance with an embodiment of the present invention comprises: a substrate; a first electrode formed on the substrate, a functional thin film formed above the first electrode, and a second electrode disposed above the functional thin film, and the device further comprises, in a region surrounding the region where the functional thin film is formed, a film containing a compound in which a group containing fluorine and a π-conjugated system are bound together by a cycloalkene structure or a cycloalkane structure.

With this device, since processing for imparting liquid-repellency can be performed with light with relatively low energy without applying a photopolymerization initiator or a photocatalyst, it is possible to prevent damages to a member composing a substrate or a substrate surface to which the functional thin film is applied and prevent the molecules in the damaged member from diffusing in the functional thin film. As a result of this, degradation of characteristics of the functional thin film or deterioration of life characteristics can be prevented and a device adequately exhibiting functions of the functional thin film can be constructed.

Herein, the functional thin film may be present in a region of the first electrode, and the film containing the compound may be present in a region surrounding that region of the first electrode.

Further, the first electrode may be formed in a first region of the substrate, the functional thin film may cover at least part of the first electrode and be present in a second region that includes, in at least a portion thereof, the first region of the substrate, and the film containing the compound may be present in a region surrounding the second region of the substrate.

Further, the device of the present invention may have an organosilicon compound having a π-conjugated system between the functional thin film and the first electrode.

Further, the device of the present invention may have a charge injection layer comprising an inorganic oxide between the first electrode and the functional thin film, and may have an organosilicon compound having a π-conjugated system between the charge injection layer and the functional thin film.

Further, the device of the present invention has a regulating layer which is present on the substrate so as to cover at least part of the surrounding of the first electrode and regulates an effective region of the functional thin film, and the film containing the compound may be present in a region of the surface of the regulating layer, the region being present in a region surrounding the region where the functional thin film is present.

Further, the device of the present invention may have a charge injection layer comprising an inorganic oxide between the first electrode and the functional thin film, and may have an organosilicon compound having a π-conjugated system between the charge injection layer and the functional thin film.

Further, the functional thin film may contain a current injection light-emitting material.

Further, the functional thin film may contain a photoelectric conversion material.

Further, the compound may be a compound formed by irradiating, with light, a first film formed by applying a solution containing a compound (A) being an organosilicon compound having a π-conjugated system onto the substrate, and a second film formed by applying a solution containing a compound (B) containing a π-conjugated system and fluorine onto the first film to bind the π-conjugated system of the compound (A) with the π-conjugated system of the compound (B).

A thin film transistor of an embodiment of the present invention comprises: a substrate, a gate electrode formed on the substrate, an insulating film formed on the gate electrode, a source electrode formed on the insulating film, a drain electrode formed in a region on the insulating film, the region being separate from the region where the source electrode is formed, and a functional thin film formed so as to cover a region on the insulating film between the source electrode and the drain electrode and ends of the source electrode and the drain electrode, and the thin film transistor further comprises a film containing a compound in which a group containing fluorine and a π-conjugated system are bound together by a cycloalkene structure or a cycloalkane structure, in a region surrounding the region where the functional thin film on the source electrode and the drain electrode is formed.

With this thin film transistor, also in a bottom-gate type thin film transistor, since processing for imparting liquid-repellency can be performed with light with relatively low energy without applying a photopolymerization initiator or a photocatalyst, it is possible to prevent damages to a member composing a substrate or a substrate surface to which the functional thin film is applied and prevent the molecules in the damaged member from diffusing in the functional thin film. As a result of this, degradation of characteristics of the functional thin film or deterioration of life characteristics can be prevented and a thin film transistor adequately exhibiting functions of the functional thin film can be constructed.

A thin film transistor of another embodiment of the present invention comprises: a substrate, a source electrode formed on the substrate, a drain electrode formed in a region on the substrate, the region being separate from the region where the source electrode is formed, a functional thin film formed so as to cover a region on the substrate between the source electrode and the drain electrode and ends of the source electrode and the drain electrode, an insulating film formed so as to cover the functional thin film, and a gate electrode formed on the insulating film, and the thin film transistor further comprises a film containing a compound in which a group containing fluorine and a π-conjugated system are bound together by a cycloalkene structure or a cycloalkane structure, in a region surrounding the region where the functional thin film on the source electrode and the drain electrode is formed.

With this thin film transistor, also in a top-gate type thin film transistor, since processing for imparting liquid-repellency can be performed with light with relatively low energy without applying a photopolymerization initiator or a photocatalyst, it is possible to prevent damages to a member composing a substrate or a substrate surface to which the functional thin film is applied and prevent the molecules in the damaged member from diffusing in the functional thin film. As a result of this, degradation of characteristics of the functional thin film or deterioration of life characteristics can be prevented and a thin film transistor adequately exhibiting functions of the functional thin film can be constructed.

Herein, the compound may be a compound formed by irradiating, with light, a first film formed by applying a solution containing a compound (A) being an organosilicon compound having a π-conjugated system onto the substrate, and a second film formed by applying a solution containing a compound (B) containing a π-conjugated system and fluorine onto the first film to bind the π-conjugated system of the compound (A) with the π-conjugated system of the compound (B).

Further, a buffer layer may be included between the source electrode and the functional thin film or between the drain electrode and the functional thin film.

A method for producing a device of an embodiment of the present invention comprises a first step of applying a solution containing a compound (A) being an organosilicon compound having a π-conjugated system onto the surface of a substrate having a first electrode formed thereon to form a first film; a second step of subsequently applying a solution containing a compound (B) containing a π-conjugated system and fluorine to form a second film on the first film; a third step of irradiating the first film and the second film with light to bind the π-conjugated system of the compound (A) with the π-conjugated system of the compound (B) by a cycloalkene structure or a cycloalkane structure; a fourth step of applying a solution containing a functional material onto a base to form a functional thin film; and a fifth step of disposing a second electrode on the functional thin film. Herein, the base means a surface portion formed before the functional thin film is formed in the step of forming a functional thin film by use of a solution containing a functional material (that is, the fourth step), and the surface portion may be a surface of a substrate itself, or may be a substrate after being subjected to the first step, the second step and the third step, or may be a substrate after being subjected to other steps. The functional thin film may be formed on the entire base or only on a specific part of the base.

In accordance with the present embodiment, when processing for imparting liquid-repellency is performed on the surface of the substrate by use of light with a relatively long wavelength, for example, light with a wavelength of 200 nm or more and 380 nm or less, since the processing for imparting liquid-repellency can be performed without using a photopolymerization initiator or a photocatalyst, it is possible to prevent damages to a member composing a substrate or a substrate surface to which the functional thin film is applied and prevent the molecules in the damaged member from diffusing in the functional thin film. As a result of this, degradation of characteristics of the functional thin film or deterioration of life characteristics can be prevented and a device adequately exhibiting functions of the functional thin film can be constructed.

A method for producing a thin film transistor of an embodiment of the present invention comprises the steps of; forming a gate electrode on a substrate and forming a gate insulating film on the gate electrode; forming a drain electrode and a source electrode on the gate insulating film; applying a solution containing a compound (A) being an organosilicon compound having a π-conjugated system onto the gate insulating film, onto the drain electrode and onto the source electrode to form a first film; applying subsequently a solution containing a compound (B) containing a π-conjugated system and fluorine to form a second film on the first film; irradiating the first film and the second film with light to bind the π-conjugated system of the compound (A) with the π-conjugated system of the compound (B) by a cycloalkene structure or a cycloalkane structure; and forming a functional thin film in a region between the source electrode and the drain electrode.

In accordance with the present embodiment, also in a method for producing a thin film transistor having a bottom-gate structure, when processing for imparting liquid-repellency is performed on the surface of the substrate by use of light with a relatively long wavelength, for example, light with a wavelength of 200 nm or more and 380 nm or less, the processing for imparting liquid-repellency can be performed without using a photopolymerization initiator or a photocatalyst. Therefore, it is possible to prevent damages to a member composing a substrate or a substrate surface to which the functional thin film is applied and prevent the molecules in the damaged member from diffusing in the functional thin film. As a result of this, degradation of characteristics of the functional thin film or deterioration of life characteristics can be prevented and a thin film transistor adequately exhibiting functions of the functional thin film can be constructed.

A method for producing a thin film transistor of another embodiment of the present invention comprises the steps of; applying a solution containing a compound (A) being an organosilicon compound having a π-conjugated system onto a substrate having a source electrode and a drain electrode both formed on the substrate, to form a first film; applying subsequently a solution containing a compound (B) containing a π-conjugated system and fluorine to form a second film on the first film; irradiating the first film and the second film with light to bind the π-conjugated system of the compound (A) with the π-conjugated system of the compound (B); forming a functional thin film; and forming a gate insulating film on the functional thin film and subsequently forming a gate electrode.

In accordance with the present embodiment, also in a method for producing a thin film transistor having a top-gate structure, when processing for imparting liquid-repellency is performed on the surface of the substrate by use of light with a relatively long wavelength, for example, light with a wavelength of 200 nm or more and 380 nm or less, the processing for imparting liquid-repellency can be performed without using a photopolymerization initiator or a photocatalyst. Therefore, it is possible to prevent damages to a member composing a substrate or a substrate surface to which the functional thin film is applied and prevent the molecules in the damaged member from diffusing in the functional thin film. As a result of this, degradation of characteristics of the functional thin film or deterioration of life characteristics can be prevented and a thin film transistor adequately exhibiting functions of the functional thin film can be constructed.

Herein, light used in light irradiation may have a wavelength of 200 nm or more and 380 nm or less.

In accordance with this configuration, a good device can be produced without having an effect on the base.

Further, the present invention provides a device in which the compound in which a group containing fluorine and a π-conjugated system together by a cycloalkene structure or a cycloalkane structure is a compound obtained by a photodimerization reaction of a compound represented by the following general formula (1) and a compound represented by the following general formula (4):

[Chem. 1]

C-D  General Formula (1)

wherein C is a group represented by the following general formula (2-1) or the following general formula (2-2), and D represents a group represented by the following general formula (3):

[Chem. 2]

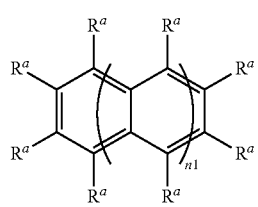

General Formula (2-1)

wherein $R^a$ independently at each occurrence represents a hydrogen atom, a substituent or a bond with D, any two adjacent $R^a$s may be coupled with each other to form a ring that is selected from among saturated hydrocarbon rings, unsaturated hydrocarbon rings, aromatic hydrocarbon rings and heterocycles and may have a substituent, at least one of the $R^a$s is a bond with D, and n1 represents an integer of 0 or more,

[Chem. 3]

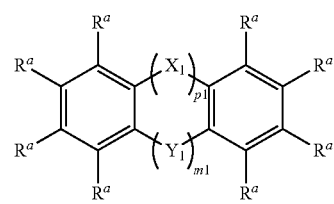

General Formula (2-2)

wherein $R^a$ independently at each occurrence represents a hydrogen atom, a substituent or a bond with D, $X_1$ and $Y_1$ may be the same or different and represent $—C(R^a)_2—$, $—N(R^a)—$, $—O—$, $—S—$, $—Si(R^a)_2—$, $—B(R^a)—$ or $—C(R^a)=C(R^a)—$, any two adjacent $R^a$s may be coupled with each other to form a ring that is selected from among saturated hydrocarbon rings, unsaturated hydrocarbon rings, aromatic hydrocarbon rings and heterocycles and may have a substituent, at least one of the $R^a$s is a bond with D, and p1 and m1 are the same or different and represent an integer of 0 or more, General Formula (3)

[Chem. 4]

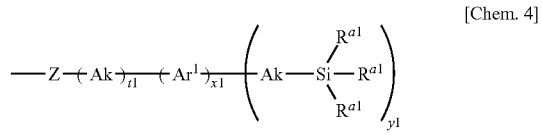

wherein Z represents $—C(=O)O—$, $—OC(=O)—$, $—OC(=O)O—$, $—C(=O)—$, $—N(R^c)—$, $—C(=O)N(R^c)—$, $—N(R^c)C(=O)—$, $—N(R^c)C(=O)N(R^c)—$, -Ak-C(=O)O—, -Ak-OC(=O)—, -Ak-C(=O)O—, -Ak-C(=O)—, -Ak-N(R^c)—, -Ak-C(=O)N(R^c)—, -Ak-N(R^c)C(=O)—, -Ak-N(R^c)C(=O)N(R^c)—, —O—, —S— or -Ak-, $Ar^1$ represents an aromatic hydrocarbon group having a valence of (1+y1) or a heterocyclic group having a valence of (1+y1), Ak represents an alkylene group having 1 to 12 carbon atoms, $R^{a1}$ represents a hydrogen atom, a halogen atom, a hydroxyl group, an alkoxy group or an alkyl group, $R^c$ represents a hydrogen atom or a substituent, and where there are a plurality of $R^c$s, these $R^c$s may be the same or different, t1 represents 0 or 1, x1 represents 0 or 1, and y1 represents an integer of 1 or more, the plurality of $R^{a1}$s may be the same or different, and where there are a plurality of Aks, these Aks may be the same or different,

[Chem. 5]

E-F  General Formula (4)

wherein E is a group represented by the following general formula (5-1) or the following general formula (5-2) or the following general formula (5-3), and F represents a group represented by the following general formula (6-1) or the following general formula (6-2):

[Chem. 6]

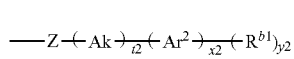

General Formula (5-1)

wherein Z represents —C(=O)O—, —OC(=O)—, —OC(=O)O—, —C(=O)—, —N(R$^c$)—, —C(=O)N(R$^c$)—, —N(R$^c$)C(=O)—, —N(R$^c$)C(=O)N(R$^c$)—, -Ak-C(=O)O—, -Ak-OC(=O)—, -Ak-C(=O)O—, -Ak-C(=O)—, -Ak-N(R$^c$)—, -Ak-C(=O)N(R$^c$)—, -Ak-N(R$^c$)C(=O)—, -Ak-N(R$^c$)C(=O)N(R$^c$)—, —O—, —S— or -Ak-, Ak represents an alkylene group having 1 to 12 carbon atoms, R$^c$ represents a hydrogen atom or a substituent, and where there are a plurality of R$^c$s, these R$^c$s may be the same or different, Ar$^2$ represents an aromatic hydrocarbon group having a valence of (1+y2) or a heterocyclic group having a valence of (1+y2), R$^{b1}$ represents a monovalent organic group containing a fluorine atom, t2 represents 0 or 1, x2 represents 0 or 1, and y2 represents an integer of 1 or more, and where there are a plurality of R$^{b1}$s, these R$^{b1}$s may be the same or different, General Formula (5-2)

[Chem. 7]

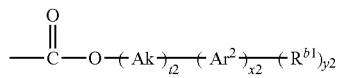

wherein Ar$^2$, R$^{b1}$, Ak, t2, x2 and y2 respectively represent the same meanings as those described above,

[Chem. 8]

General Formula (5-3)

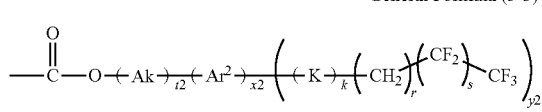

wherein Ar$^2$, Ak, t2, x2 and y2 respectively represent the same meanings as those described above, K represents —O—, —S—, —NH— or —NR—, R represents an alkyl group or an aryl group, k represents 0 or 1, r represents an integer of 0 to 3, s represents an integer of 0 to 15, and where there are a plurality of k's, these k's may be the same or different, where there are a plurality of r's, these r's may be the same or different, and where there are a plurality of s's, these s' may be the same or different,

[Chem. 9]

General Formula (6-1)

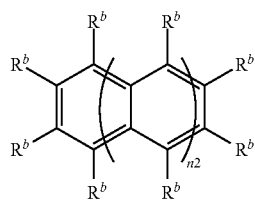

wherein R$^b$ independently at each occurrence represents a hydrogen atom, a substituent or a bond with E, any two adjacent R$^b$s may be coupled with each other to form a ring that is selected from among saturated hydrocarbon rings, unsaturated hydrocarbon rings, aromatic hydrocarbon rings and heterocycles and may have a substituent, at least one of the R$^b$s is a bond with E, and n2 represents an integer of 0 or more,

[Chem. 10]

General Formula (6-2)

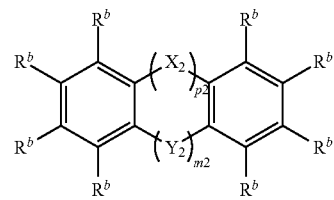

wherein R$^b$ independently at each occurrence represents a hydrogen atom, a substituent or a bond with E, X$_2$ and Y$_2$ may be the same or different and represent —C(R$^b$)$_2$—, —N(R$^b$)—, —O—, —S—, —Si(R$^b$)$_2$—, —B(R$^b$)— or —C(R$^b$)=C(R$^b$)—, any two adjacent R$^b$s may be coupled with each other to form a ring that is selected from among saturated hydrocarbon rings, unsaturated hydrocarbon rings, aromatic hydrocarbon rings and heterocycles and may have a substituent, at least one of the R$^b$ is a bond with E, and p2 and m2 are the same or different and represent an integer of 0 or more.

Further, the present invention provides a method for producing a device in which method the compound (A) being an organosilicon compound having a π-conjugated system is a compound represented by the following general formula (1) and the compound (B) containing a π-conjugated system and fluorine is a compound represented by the following general formula (4):

[Chem. 11]

C-D  General Formula (1)

wherein C is a group represented by the following general formula (2-1) or the following general formula (2-2) and D represents a group represented by the following general formula (3):

[Chem. 12]

General Formula (2-1)

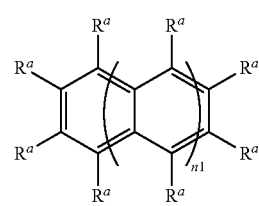

wherein R$^a$ independently at each occurrence represents a hydrogen atom, a substituent or a bond with D, the plurality of R$^a$s may be the same or different, any two adjacent R$^a$s may be coupled with each other to form a ring that is selected from among saturated hydrocarbon rings, unsaturated hydrocarbon rings, aromatic hydrocarbon rings and heterocycles and may have a substituent, at least one of the R$^a$s is a bond with D, and n1 represents an integer of 0 or more,

[Chem. 13]

General Formula (2-2)

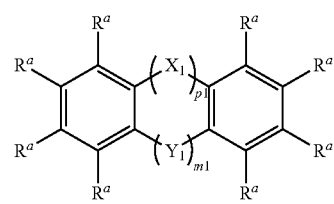

wherein R$^a$ independently at each occurrence represents a hydrogen atom, a substituent or a bond with D, X$_1$ and Y$_1$ may be the same or different and represent —C($R^a$)$_2$—, —N($R^a$)—, —O—, —S—, —B($R^a$)— or —C($R^a$)=C($R^a$)—, any two adjacent $R^a$s may be coupled with each other to form a ring that is selected from among saturated hydrocarbon rings, unsaturated hydrocarbon rings, aromatic hydrocarbon rings and heterocycles and may have a substituent, at least one of the $R^a$s is a bond with D, and p1 and m1 are the same or different and represent an integer of 0 or more, General Formula (3)

[Chem. 14]

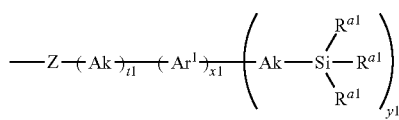

wherein Z represents —C(=O)O, —OC(=O)—, —OC(=O)O—, —C(=O)—, —N($R^c$)—, —C(=O)N($R^c$)—, —N($R^c$)C(=O)—, —N($R^c$)C(=O)N($R^c$)—, -Ak-C(=O)O—, -Ak-OC(=O)—, -Ak-OC(=O)O—, -Ak-C(=O)—, -Ak-N($R^c$)—, -Ak-C(=O)N($R^c$)—, -Ak-N($R^c$)C(=O)—, -Ak-N($R^c$)C(=O)N($R^c$)—, —O—, —S— or -Ak-, $Ar^1$ represents an aromatic hydrocarbon group having a valence of (1+y1) or a heterocyclic group having a valence of (1+y1), Ak represents an alkylene group having 1 to 12 carbon atoms, $R^{a1}$ represents a hydrogen atom, a halogen atom, a hydroxyl group, an alkoxy group or an alkyl group, $R^c$ represents a hydrogen atom or a substituent, and where there are a plurality of $R^c$s, these $R^c$s may be the same or different, t1 represents 0 or 1, x1 represents 0 or 1, y1 represents an integer of 1 or more, the plurality of $R^{a1}$s may be the same or different, and where there are a plurality of Aks, these Aks may be the same or different,

[Chem. 15]

E-F        General Formula (4)

wherein E is a group represented by the following general formula (5-1) or the following general formula (5-2) or the following general formula (5-3), and F represents a group represented by the following general formula (6-1) or the following general formula (6-2):

[Chem. 16]

General Formula (5-1)

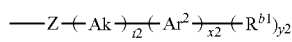

wherein Z represents —C(=O)O—, —OC(=O)—, —OC(=O)O—, —C(=O)—, —N($R^c$)—, —C(=O)N($R^c$)—, —N($R^c$)C(=O)—, —N($R^c$)C(=O)N($R^c$)—, -Ak-C(=O)O—, -Ak-OC(=O)—, -Ak-C(=O)O—, -Ak-C(=O)—, -Ak-N($R^c$)—, -Ak-C(=O)N($R^c$)—, -Ak-N($R^c$)C(=O)—, -Ak-N($R^c$)C(=O)N($R^c$)—, —O—, —S— or -Ak-, Ak represents an alkylene group having 1 to 12 carbon atoms, $R^c$ represents a hydrogen atom or a substituent, and where there are a plurality of $R^c$s, these $R^c$s may be the same or different, $Ar^2$ represents an aromatic hydrocarbon group having a valence of (1+y2) or a heterocyclic group having a valence of (1+y2), $R^{b1}$ represents a monovalent organic group containing a fluorine atom, t2 represents 0 or 1, x2 represents 0 or 1, y2 represents an integer of 1 or more, and where there are a plurality of $R^{b1}$s, these $R^{b1}$s may be the same or different, General Formula (5-2)

[Chem. 17]

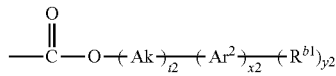

wherein $Ar^2$, $R^{b1}$, Ak, t2, x2 and y2 respectively represent the same meanings as those described above,

[Chem. 18]

General Formula (5-3)

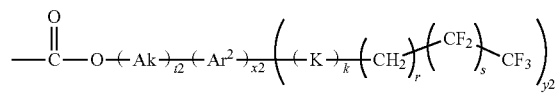

wherein $Ar^2$, Ak, t2, x2 and y2 respectively represent the same meanings as those described above, K represents —O—, —S—, —NH— or —NR—, R represents an alkyl group or an aryl group, k represents 0 or 1, r represents an integer of 0 to 3, s represents an integer of 0 to 15, and where there are a plurality of k's, these k's may be the same or different, where there are a plurality of groups r's, these r's may be the same or different, and where there are a plurality of s's, these s's may be the same or different, General Formula (6-1)

[Chem. 19]

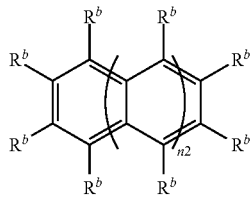

wherein $R^b$ independently at each occurrence represents a hydrogen atom, a substituent or a bond with E, any two adjacent $R^b$s may be coupled with each other to form a ring that is selected from among saturated hydrocarbon rings, unsaturated hydrocarbon rings, aromatic hydrocarbon rings and heterocycles and may have a substituent, at least one of the $R^b$s is a bond with E, and n2 represents an integer of 0 or more,

[Chem. 20]

General Formula (6-2)

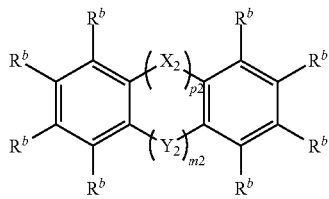

wherein $R^b$ independently at each occurrence represents a hydrogen atom, a substituent or a bond with E, $X_2$ and $Y_2$ may be the same or different and represent —C($R^b$)$_2$—, —N($R^b$)—, —O—, —S—, —B($R^b$)— or —C($R^b$)=C ($R^b$)—, any two adjacent $R^b$s may be coupled with each other to form a ring that is selected from among saturated hydrocarbon rings, unsaturated hydrocarbon rings, aromatic hydrocarbon rings and heterocycles and may have a substituent, at least one of the $R^b$s is a bond with E, and p2 and m2 are the same or different and represent an integer of 0 or more.

EXPLANATION OF TERMS

Hereinafter, terms used commonly in the present specification will be described. In the present specification, the term <Cm-Cn> (m and n are each a positive integer satisfying m<n) means that the number of carbon atoms of the group described together with this term is from m to n.

The substituent refers to, unless otherwise specified, a halogen group, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a hydroxyl group, an alkenyl group and an alkynyl group, shown below.

Examples of the halogen atom include a fluorine atom, a chlorine atom, a bromine atom and an iodine atom.

The alkyl group refers to unsubstituted alkyl groups and alkyl groups substituted with a halogen atom, an amino group, a mercapto group or the like, and includes both of linear alkyl groups and cyclic alkyl groups (cycloalkyl groups). The alkyl group may have a branch. The number of carbon atoms of the alkyl group is usually approximately from 1 to 20, preferably approximately from 1 to 15, and more preferably approximately from 1 to 10. Specific examples of the alkyl group include a methyl group, an ethyl group, a propyl group, an i-propyl group, a butyl group, an i-butyl group, a s-butyl group, a t-butyl group, a pentyl group, a hexyl group, a cyclohexyl group, a heptyl group, an octyl group, a 2-ethylhexyl group, a nonyl group, a decyl group, a 3,7-dimethyloctyl group, a lauryl group, a trifluoromethyl group, a pentafluoroethyl group, a perfluorobutyl group, a perfluorohexyl group, a perfluorooctyl group, a trifluoropropyl group, a tridecafluoro-1,1,2,2-tetrahydrooctyl group, a heptadecafluoro-1,1,2,2-tetrahydrodecyl group, an aminopropyl group, an aminooctyl group, an aminodecyl group, a mercaptopropyl group, a mercaptooctyl group, a mercaptodecyl group and the like. Examples of C1-C12 alkyl groups include a methyl group, an ethyl group, a propyl group, an i-propyl group, a butyl group, an i-butyl group, a s-butyl group, a t-butyl group, a pentyl group, an isoamyl group, a hexyl group, a cyclohexyl group, a heptyl group, an octyl group, a nonyl group, a decyl group, a dodecyl group and the like.

The alkoxy group refers to unsubstituted alkoxy groups and alkoxy groups substituted with a halogen atom, an alkoxy group or the like, and includes both of linear alkoxy groups and cyclic alkoxy groups (cycloalkoxy groups). The alkoxy group may have a branch. The number of carbon atoms of the alkoxy group is usually approximately from 1 to 20, preferably approximately from 1 to 15, and more preferably approximately from 1 to 10. Specific examples of the alkoxy group include a methoxy group, an ethoxy group, a propyloxy group, an i-propyloxy group, a butoxy group, an i-butoxy group, a s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyloxy group, a perfluorooctyloxy group, a methoxymethyloxy group, a 2-methoxyethyloxy group and the like. Examples of C1-C12 alkoxy groups include a methoxy group, an ethoxy group, a propyloxy group, an i-propyloxy group, a butoxy group, an i-butoxy group, a t-butoxy group, a pentyloxy group, a hexyloxy group, a cyclohexyloxy group, a heptyloxy group, an octyloxy group, 2-ethylhexyloxy group, a nonyloxy group, a decyloxy group, a 3,7-dimethyloctyloxy group, a lauryloxy group and the like.

The alkylthio group refers to unsubstituted alkylthio groups and alkylthio groups substituted with a halogen atom or the like, and includes both of linear alkylthio groups and cyclic alkylthio groups (cycloalkylthio groups). The alkylthio group may have a branch. The number of carbon atoms of the alkylthio group is usually approximately from 1 to 20, preferably approximately from 1 to 15, and more preferably approximately from 1 to 10. Specific examples of the alkylthio group include a methylthio group, an ethylthio group, a propylthio group, an i-propylthio group, a butylthio group, an i-butylthio group, a t-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group, a trifluoromethylthio group and the like. Examples of C1-C12 alkylthio groups include a methylthio group, an ethylthio group, a propylthio group, an i-propylthio group, a butylthio group, an i-butylthio group, a s-butylthio group, a t-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group and the like.

The aryl group is an atomic group obtained by excluding a hydrogen atom bonded to a carbon atom composing an aromatic ring from an aromatic hydrocarbon, and refers to unsubstituted aryl groups and aryl groups substituted with a halogen atom, an alkoxy group, an alkyl group or the like. The aryl group also includes groups having a benzene ring or a fused ring, and groups formed by binding two or more independent benzene rings or fused rings together with a single bond or a divalent group, for example, an alkenylene group such as a vinylene group or the like, interposed therebetween. The number of carbon atoms of the aryl group is usually approximately from 6 to 60, preferably approximately from 7 to 48, and more preferably approximately from 7 to 30. Examples of the aryl group include a phenyl group, a C1-C12 alkoxyphenyl group, a C1-C12 alkylphenyl group, a 1-naphthyl group, a 2-naphthyl group, a 1-anthracenyl group, a 2-anthracenyl group, a 9-anthracenyl group, a pentafluorophenyl group and the like, and the C1-C12 alkoxyphenyl group and the C1-C12 alkylphenyl group are preferred.

Specific examples of the C1-C12 alkoxyphenyl group include a methoxyphenyl group, an ethoxyphenyl group, a propyloxyphenyl group, an i-propyloxyphenyl group, a butoxyphenyl group, an i-butoxyphenyl group, a s-butoxyphenyl group, a t-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a lauryloxyphenyl group and the like.

Specific examples of the C1-C12 alkylphenyl group include a methylphenyl group, an ethylphenyl group, a dimethylphenyl group, a propylphenyl group, a mesityl group, a methylethylphenyl group, an i-propylphenyl group, a butylphenyl group, an i-butylphenyl group, a s-butylphenyl group, a t-butylphenyl group, a pentylphenyl group, an isoamylphenyl group, a hexylphenyl group, a heptylphenyl group, an octylphenyl group, a nonylphenyl group, a decylphenyl group, a dodecylphenyl group and the like.

The aryloxy group refers to unsubstituted aryloxy groups and aryloxy groups substituted with a halogen atom, an alkoxy group, an alkyl group or the like. The number of carbon atoms of the aryloxy group is usually approximately from 6 to 60, preferably approximately from 7 to 48, and more preferably approximately from 7 to 30. Specific examples of the aryloxy group include a phenoxy group, a C1-C12 alkoxyphenoxy group, a C1-C12 alkylphenoxy group, a 1-naphthyloxy group, a 2-naphthyloxy group, a pentafluorophenyloxy group and the like, and the C1-C12 alkoxyphenoxy group and the C1-C12 alkylphenoxy group are preferred.

Specific examples of the C1-C12 alkoxyphenoxy group include a methoxyphenoxy group, an ethoxyphenoxy group, a propyloxyphenoxy group, an i-propyloxyphenoxy group, a butoxyphenoxy group, an i-butoxyphenoxy group, a s-butoxyphenoxy group, a t-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, a lauryloxyphenoxy group and the like.

Specific examples of the C1-C12 alkylphenoxy group include a methylphenoxy group, an ethylphenoxy group, a dimethylphenoxy group, a propylphenoxy group, a 1,3,5-trimethylphenoxy group, a methylethylphenoxy group, an i-propylphenoxy group, a butylphenoxy group, an i-butylphenoxy group, a s-butylphenoxy group, a t-butylphenoxy group, a pentylphenoxy group, an isoamylphenoxy group, a hexylphenoxy group, a heptylphenoxy group, an octylphenoxy group, a nonylphenoxy group, a decylphenoxy group, a dodecylphenoxy group and the like.

The arylthio group refers to unsubstituted arylthio groups and arylthio groups substituted with a halogen atom, an alkoxy group, an alkyl group or the like. The number of carbon atoms of the arylthio group is usually approximately from 6 to 60, preferably approximately from 7 to 48, and more preferably approximately from 7 to 30. Specific examples of the arylthio group include a phenylthio group, a C1-C12 alkoxyphenylthio group, a C1-C12 alkylphenylthio group, a 1-naphthylthio group, a 2-naphthylthio group, a pentafluorophenylthio group and the like.

The arylalkyl group refers to unsubstituted arylalkyl groups and arylalkyl groups substituted with a halogen atom, an alkoxy group, an alkyl group or the like. The number of carbon atoms of the arylalkyl group is usually approximately from 7 to 60, preferably approximately from 7 to 48, and more preferably approximately from 7 to 30. Specific examples of the arylalkyl group include a phenyl-C1-C12 alkyl group, a C1-C12 alkoxyphenyl-C1-C12 alkyl group, a C1-C12 alkylphenyl-C1-C12 alkyl group, a 1-naphthyl-C1-C12 alkyl group, a 2-naphthyl-C1-C12 alkyl group and the like.

The arylalkoxy group refers to unsubstituted arylalkoxy groups and arylalkoxy groups substituted with a halogen atom, an alkoxy group, an alkyl group or the like. The number of carbon atoms of the arylalkoxy group is usually approximately from 7 to 60, preferably approximately from 7 to 48, and more preferably approximately from 7 to 30. Specific examples of the arylalkoxy group include a phenyl-C1-C12 alkoxy group, a C1-C12 alkoxyphenyl-C1-C12 alkoxy group, a C1-C12 alkylphenyl-C1-C12 alkoxy group, a 1-naphthyl-C1-C12 alkoxy group, a 2-naphthyl-C1-C12 alkoxy group and the like.

The arylalkylthio group refers to unsubstituted arylalkylthio groups and arylalkylthio groups substituted with a halogen atom, an alkoxy group, an alkyl group or the like. The number of carbon atoms of the arylalkylthio group is usually approximately from 7 to 60, preferably approximately from 7 to 48, and more preferably approximately from 7 to 30. Specific examples of the arylalkylthio group include a phenyl-C1-C12 alkylthio group, a C1-C12 alkoxyphenyl-C1-C12 alkylthio group, a C1-C12 alkylphenyl-C1-C12 alkylthio group, a 1-naphthyl-C1-C12 alkylthio group, a 2-naphthyl-C1-C12 alkylthio group and the like.

The arylalkenyl group refers to unsubstituted arylalkenyl groups and arylalkenyl groups substituted with a halogen atom, an alkoxy group, an alkyl group or the like. The number of carbon atoms of the arylalkenyl group is usually approximately from 8 to 60, preferably approximately from 8 to 48, and more preferably approximately from 8 to 30. Specific examples of the arylalkenyl group include a phenyl-C2-C12 alkenyl group, a C1-C12 alkoxyphenyl-C2-C12 alkenyl group, a C1-C12 alkylphenyl-C2-C12 alkenyl group, a 1-naphthyl-C2-C12 alkenyl group, a 2-naphthyl-C2-C12 alkenyl group and the like, and the C1-C12 alkoxyphenyl-C2-C12 alkenyl group and the C2-C12 alkylphenyl-C2-C12 alkenyl group are preferred.

Examples of the C2-C12 alkenyl group include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, a 1-octenyl group and the like.

The arylalkynyl group refers to unsubstituted arylalkynyl groups and arylalkynyl groups substituted with a halogen atom, an alkoxy group, an alkyl group or the like. The number of carbon atoms of the arylalkynyl group is usually approximately from 8 to 60, preferably approximately from 8 to 48, and more preferably approximately from 8 to 30. Specific examples of the arylalkynyl group include a phenyl-C2-C12 alkynyl group, a C1-C12 alkoxyphenyl-C2-C12 alkynyl group, a C1-C12 alkylphenyl-C2-C12 alkynyl group, a 1-naphthyl-C2-C12 alkynyl group, a 2-naphthyl-C2-C12 alkynyl group and the like, and the C1-C12 alkoxyphenyl-C2-C12 alkynyl group and the C1-C12 alkylphenyl-C2-C12 alkynyl group are preferred.

Examples of the C2-C12 alkynyl group include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, a 1-octynyl group and the like.

The monovalent heterocyclic group refers to an atomic group obtained by excluding a hydrogen atom from a heterocyclic compound, and refers to unsubstituted monovalent heterocyclic groups and monovalent heterocyclic groups substituted with a substituent such as an alkyl group. The number of carbon atoms of the monovalent heterocyclic group is usually approximately from 3 to 60, preferably approximately from 3 to 30, and more preferably approximately from 3 to 20, excluding the number of carbon atoms of the substituent. Herein, the heterocyclic compound refers to an organic compound having a cyclic structure, which contains not only a carbon atom but also a heteroatom such as an oxygen atom, a sulfur atom, a nitrogen atom, a phosphorus atom, a boron atom, a silicon atom, a selenium atom, a tellurium atom, an arsenic atom or the like as elements composing a ring. Among the monovalent heterocyclic groups, a monovalent aromatic heterocyclic group is preferred. Examples of the monovalent heterocyclic group include a thienyl group, a C1-C12 alkylthienyl group, a pyrrolyl group, a furyl group, a pyridyl group, a C1-C12 alkylpyridyl group, a pyridazinyl group, a pyrimidyl group, a pyrazinyl group, a triazinyl group, a pyrrolidyl group, a piperidyl group, a quinolyl group, an isoquinolyl group and the like, and among these, the thienyl group, the C1-C12 alkylthienyl group, the pyridyl group and the C1-C12 alkylpyridyl group are preferred.

The heterocyclic thio group refers to groups formed by substituting a monovalent heterocyclic group for a hydrogen atom of a mercapto group. Examples of the heterocyclic thio group include heteroarylthio groups such as a pyridylthio group, a pyridazinylthio group, a pyrimidylthio group, a pyrazinylthio group, a triazinylthio group and the like.

The amino group refers to unsubstituted amino groups and substituted amino groups having one or two substituents selected from an alkyl group, an aryl group, an arylalkyl group and a monovalent heterocyclic group (hereinafter, referred to as a substituted amino group). The substituent may further have a substituent (hereinafter, sometimes referred to as a secondary substituent). The number of carbon atoms of the substituted amino group is usually approximately from 1 to 60, preferably approximately from 2 to 48, and more preferably approximately from 2 to 40, excluding the number of carbon atoms of the secondary substituent. Examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a s-butylamino group, a t-butylamino group, a pentylamino group, a hexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, a C1-C12 alkoxyphenylamino group, a di(C1-C12 alkoxyphenyl)amino group, a C1-C12 alkylphenylamino group, a di(C1-C12 alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a phenyl-C1-C12 alkylamino group, a C1-C12 alkoxyphenyl-C1-C12 alkylamino group, a di(C1-C12 alkoxyphenyl-C1-C12 alkyl) amino group, a C1-C12 alkylphenyl-C1-C12 alkylamino group, a di(C1-C12 alkylphenyl-C1-C12 alkyl)amino group, a 1-naphthyl-C1-C12 alkylamino group, a 2-naphthyl-C1-C12 alkylamino group and the like.

The silyl group refers to unsubstituted silyl groups and substituted silyl groups having one, two or three substituents selected from an alkyl group, an aryl group, an arylalkyl group and a monovalent heterocyclic group (hereinafter, referred to as a substituted silyl group). The substituent may have a secondary substituent. The number of carbon atoms of the substituted silyl group is usually approximately from 1 to 60, preferably approximately from 3 to 48, and more preferably approximately from 3 to 40, excluding the number of carbon atoms of the secondary substituent. Examples of the substituted silyl group include a trimethylsilyl group, a triethylsilyl group, a tripropylsilyl group, a tri-isopropylsilyl group, a dimethylisopropylsilyl group, a diethylisopropylsilyl group, a t-butylsilyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyl-dimethylsilyl group, a dodecyldimethylsilyl group, a phenyl-C1-C12 alkylsilyl group, a C1-C12 alkoxyphenyl-C1-C12 alkylsilyl group, a C1-C12 alkylphenyl-C1-C12 alkylsilyl group, a 1-naphthyl-C1-C12 alkylsilyl group, a 2-naphthyl-C1-C12 alkylsilyl group, a phenyl-C1-C12 alkyldimethylsilyl group, a triphenylsilyl group, a tri-p-xylylsilyl group, a tribenzylsilyl group, a diphenylmethylsilyl group, a t-butyldiphenylsilyl group, a dimethylphenylsilyl group and the like.

The acyl group refers to unsubstituted acyl groups and acyl groups substituted with a halogen atom and the like. The number of carbon atoms of the acyl group is usually approximately from 1 to 20, preferably approximately from 2 to 18, and more preferably approximately from 2 to 16. Examples of the acyl group include a formyl group, an acetyl group, a propionyl group, a butyryl group, an isobutyryl group, a pivaloyl group, a benzoyl group, a trifluoroacetyl group, a pentafluorobenzoyl group and the like.

The acyloxy group refers to unsubstituted acyloxy groups and acyloxy groups substituted with a halogen atom or the like. The number of carbon atoms of the acyloxy group is usually approximately from 1 to 20, preferably approximately from 2 to 18, and more preferably approximately from 2 to 16. Examples of the acyloxy group include a formyloxy group, an acetoxy group, a propionyloxy group, a butyryloxy group, an isobutyryloxy group, a pivaloyloxy group, a benzoyloxy group, a trifluoroacetyloxy group, a pentafluorobenzoyloxy group and the like.

The imine residue refers to a residue obtained by excluding, from an imine compound having a structure represented by at least one of the formula: H—N=C< and the formula: —N=CH—, a hydrogen atom in the structure. Examples of such an imine compound include compounds formed by substituting an alkyl group, an aryl group, an arylalkyl group, an arylalkenyl group, an arylalkynyl group or the like for a hydrogen atom bonded to aldimine, ketimine or a nitrogen atom in aldimine. The number of carbon atoms of the imine residue is usually approximately from 2 to 20, preferably approximately from 2 to 18, and more preferably approximately from 2 to 16. Examples of the imine residue include a group represented by the general formula: —CR'=N—R' or the general formula: —N=C(R")$_2$ (wherein R' represents a hydrogen atom, an alkyl group, an aryl group, an arylalkyl group, an arylalkenyl group or an arylalkynyl group, R"s are the same or different and each represent an alkyl group, an aryl group, an arylalkyl group, an arylalkenyl group or an arylalkynyl group, and when two R"s are present, the two R"s may be coupled with each other to form a ring as a divalent group, for example, an alkylene group having 2 to 18 carbon atoms such as an ethylene group, a trimethylene group, a tetramethylene group, a pentamethylene group, a hexamethylene group or the like).

The amide group refers to unsubstituted amide groups and amide groups substituted with a halogen atom or the like. The number of carbon atoms of the amide group is usually approximately from 2 to 20, preferably approximately from 2 to 18, and more preferably approximately from 2 to 16. Examples of the amide group include a formamide group, an acetamide group, a propioamide group, a butyramide group, a benzamide group, a trifluoroacetamide group, a pentafluorobenzamide group, a diformamide group, a diacetamide group, a dipropioamide group, a dibutyramide group, a dibenzamide group, a ditrifluoroacetamide group, a dipentafluorobenzamide group and the like.

The acid imide group refers to a residue obtained by excluding, from an acid imide, a hydrogen atom bonded to a nitrogen atom of the acid imide. The number of carbon atoms of the acid imide group is usually approximately from 4 to 20, preferably approximately from 4 to 18, and more preferably approximately from 4 to 16.

The carboxyl group means unsubstituted carboxyl groups and substituted carboxyl groups having a substituent such as an alkyl group, an aryl group, an arylalkyl group, a monovalent heterocyclic group or the like (hereinafter, referred to as a substituted carboxyl group). The substituent may have a secondary substituent. The number of carbon atoms of the substituted carboxyl group is usually approximately from 1 to 60, preferably approximately from 2 to 48, and more preferably approximately from 2 to 45, excluding the number of carbon atoms of the secondary substituent. Examples of the substituted carboxyl group include a methoxycarbonyl group, an ethoxycarbonyl group, a propoxycarbonyl group, an isopropoxycarbonyl group, a butoxycarbonyl group, an isobutoxycarbonyl group, a s-butoxycarbonyl group, a t-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group a pyridyloxycarbonyl group and the like.

The aromatic hydrocarbon group having a valence of X refers to an atomic group obtained by excluding X hydrogen atoms from an aromatic hydrocarbon and includes groups having an independent benzene ring or fused ring. The number of carbon atoms of the aromatic hydrocarbon group is usually approximately from 6 to 60, preferably approximately from 6 to 48, more preferably approximately from 6 to 30, and moreover preferably 6 to 18. The number of carbon atoms does not include the number of carbon atoms of a substituent. Specific examples of the aromatic hydrocarbon group in the case of a divalent aromatic hydrocarbon group (arylene group) include unsubstituted or substituted phenylene groups such as a 1,4-phenylene group, a 1,3-phenylene group, a 1,2-phenylene group and the like; unsubstituted or substituted naphthalenediyl groups such as a 1,4-naphthalenediyl group, a 1,5-naphthalenediyl group, a 2,6-naphthalenediyl group and the like; unsubstituted or substituted anthracenediyl groups such as a 1,4-anthracenediyl group, a 1,5-anthracenediyl group, a 2,6-anthracenediyl group, a 9,10-anthracenediyl group and the like; unsubstituted or substituted phenanthrenediyl groups such as a 2,7-phenanthrenediyl group and the like; unsubstituted or substituted naphthacenediyl groups such as a 1,7-naphthacenediyl group, a 2,8-naphthacenediyl group, a 5,12-naphthacenediyl group and the like; unsubstituted or substituted fluorenediyl groups such as a 2,7-fluorenediyl group, a 3,6-fluorenediyl group and the like; unsubstituted or substituted pyrenediyl groups such as a 1,6-pyrenediyl group, a 1,8-pyrenediyl group, a 2,7-pyrenediyl group, a 4,9-pyrenediyl group and the like; unsubstituted or substituted perylenediyl groups such as a 3,9-perylenediyl group, a 3,10-perylenediyl group and the like; and the like, and the unsubstituted or substituted phenylene groups and the unsubstituted or substituted fluorenediyl groups are preferably used.

The heterocyclic group having a valence of X refers to an atomic group obtained by excluding X hydrogen atoms from a heterocyclic compound, and the number of carbon atoms of the heterocyclic group is usually approximately from 4 to 60, preferably from 4 to 30, and particularly preferably from 6 to 12. The number of carbon atoms does not include the number of carbon atoms of a substituent. Specific examples of the heterocyclic group having a valence of X in the case of a divalent heterocyclic group include unsubstituted or substituted pyridinediyl groups such as a 2,5-pyridinediyl group, a 2,6-pyridinediyl group and the like; unsubstituted or substituted thiophenediyl groups such as a 2,5-thiophenediyl group and the like; unsubstituted or substituted furandiyl groups such as a 2,5-furandiyl group and the like; unsubstituted or substituted quinolinediyl groups such as a 2,6-quinolinediyl group and the like; unsubstituted or substituted isoquinolinediyl groups such as a 1,4-isoquinolinediyl group, a 1,5-isoquinolinediyl group and the like; unsubstituted or substituted quinoxalinediyl groups such as a 5,8-quinoxalinediyl group and the like; unsubstituted or substituted benzo[1,2,5]thiadiazolediyl groups such as a 4,7-benzo[1,2,5]thiadiazolediyl group and the like; unsubstituted or substituted benzothiazolediyl groups such as a 4,7-benzothiazolediyl group and the like; unsubstituted or substituted carbazolediyl groups such as a 2,7-carbazolediyl group, a 3,6-carbazolediyl group and the like; unsubstituted or substituted phenoxazinediyl groups such as a 3,7-phenoxazinediyl group and the like; unsubstituted or substituted phenothiazinediyl groups such as a 3,7-phenothiazinediyl group and the like; unsubstituted or substituted dibenzosilolediyl groups such as a 2,7-dibenzosilolediyl group and the like; and the like, and the unsubstituted or substituted benzo[1,2,5]thiadiazolediyl groups, the unsubstituted or substituted phenoxazinediyl groups and the unsubstituted or substituted phenothiazinediyl groups are preferably used.

As the group, which has photosensitivity and can be photodimerized, a functional group can be used without constraints as long as it absorbs light energy in a range of wavelengths from ultraviolet light to visible light to initiate a dimerization reaction. The reason why absorption of light energy is required is that photosensitivity (photofunctionality) of a compound is used when so-called fine patterning is carried out. When the light energy which the functional group absorbs is high, it is not preferred since the cost required for light irradiation is high and surrounding organic materials may be degraded by exposure to high energy. Favorable light for the functional group to absorb has a wavelength of 200 nm or more, and preferably a wavelength of 200 to 380 nm.

The dimerization referred to herein means that two molecules of an organic compound are chemically bonded with each other. The molecules to be bonded with each other may be the same or different. Chemical structures of the functional groups in the two molecules may also be the same or different. However, the structures and the combination of the functional groups preferably cause a photodimerization reaction without use of reaction aids such as a catalyst, an initiator and the like. The reason for this is that if surrounding organic materials are brought into contact with residues of the reaction aids, they may be degraded.

As these functional groups, functional groups, which have a double bond capable of a photodimerization reaction or an aromatic fused ring having a site capable of a photodimerization reaction, are preferably used. Among these, an aromatic fused ring group is more preferably used since it absorbs light with relatively low energy. Specific examples of the functional group preferably used include a group having a cinnamic acid ester structure, a group having a chalcone structure, a group having a styrylpyridinium structure, a group having an α-phenylmaleimide structure, an anthryl group, a group having a coumalin structure and the like.

In the present invention, the terms "a group having liquid-repellency" and "a group having lyophilicity" are used in a relative sense. The group having liquid-repellency has only to be a group which is higher in degree of the liquid-repellency than the group having lyophilicity. The group having liquid-repellency provides a thin film composed of a compound containing the group with the liquid-repellency. For example, in a thin film composed of a compound containing a group having liquid-repellency, it is preferable that contact angle of a droplet of an aqueous ink formed on the thin film surface is 80° or more, and contact angle of a droplet of an organic solvent-based ink applied to the thin film composed of a compound containing the group is 40° or more.

The group having lyophilicity provides a thin film composed of a compound containing the group with the lyophilicity. For example, when a droplet of an organic solvent-based ink is formed on a surface of the thin film composed of a compound containing the group having lyophilicity, contact angle of the droplet on the thin film is preferably 5° or less.

As the compound (A) containing the group having lyophilicity, compounds having a partial structure represented by the following formula (2-1) or the following formula (2-1) are suitably used.

[Chem. 21]

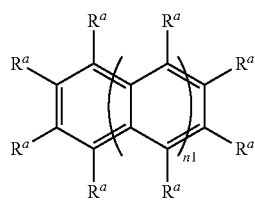

Formula (2-1)

In the formula (2-1), $R^a$ independently at each occurrence represents a hydrogen atom or a substituent. Further, any two adjacent $R^a$s may be coupled with each other to form a ring that is selected from among saturated hydrocarbon rings, unsaturated hydrocarbon rings, aromatic hydrocarbon rings and heterocycles and may have a substituent. At least one of $R^a$s is a group having lyophilicity. n1 represents an integer of 0 or more.

[Chem. 22]

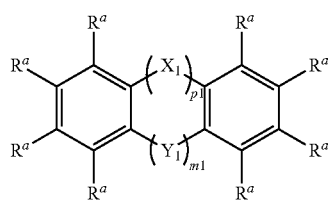

General Formula (2-2)

In the formula (2-2), $R^a$ independently at each occurrence represents a hydrogen atom or a substituent. $X_1$ and $Y_1$ may be the same or different and represent —$C(R^a)_2$—, —$N(R^a)$—, —O—, —S—, —$Si(R^a)_2$—, —$B(R^a)$— or —$C(R^a)$=$C(R^a)$—. Further, any two adjacent $R^a$s may be coupled with each other to form a ring that is selected from among saturated hydrocarbon rings, unsaturated hydrocarbon rings, aromatic hydrocarbon rings and heterocycles and may have a substituent. At least one of $R^a$s is a group having lyophilicity. p1 and m1 are the same or different and represent an integer of 0 or more.

As $R^a$, an alkyl group, an alkoxy group, an aryl group, an aryloxy group, an arylalkyl group, an arylalkoxy group, an arylalkenyl group, an arylalkynyl group, a monovalent heterocyclic group, an amino group, an acyl group, an acyloxy group, an amide group, a carboxyl group, an alkenyl group, an alkynyl group and an acrylic acid ester group are preferred. n1 is preferably 0 to 4. As $X_1$, —$C(R^a)_2$— and —$N(R^a)$— are preferred. As $Y_1$, —$C(R^a)_2$— and —$N(R^a)$— are preferred. p1 is preferably 0 to 2. m1 is preferably 0 to 2.

Specific examples of the compounds represented by the formulae (2-1) and (2-2) are as follows.

[Chem. 23]

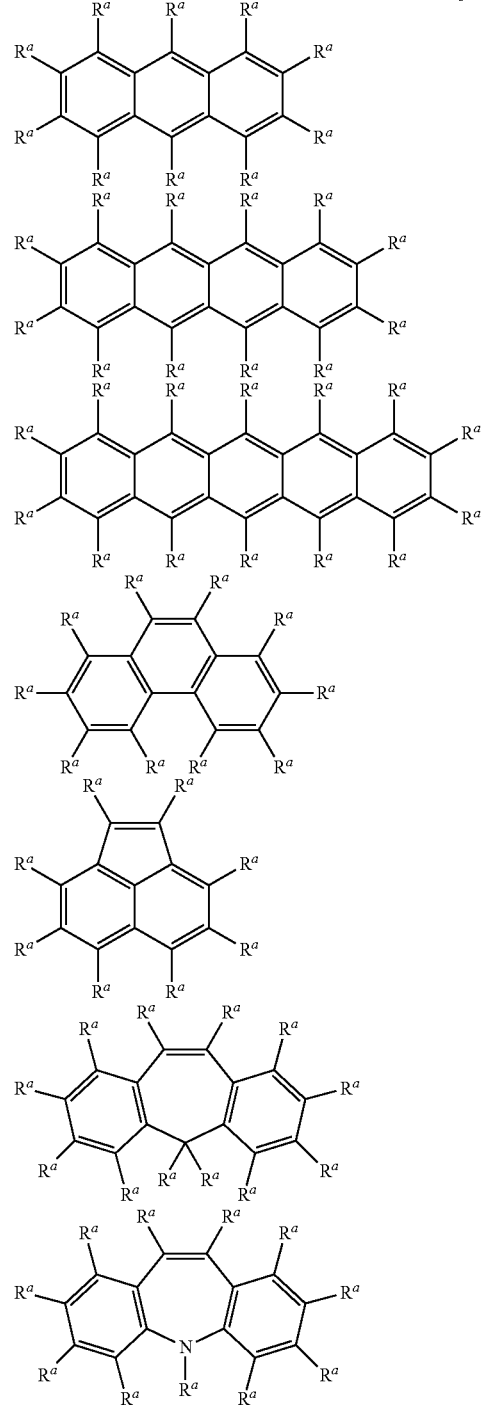

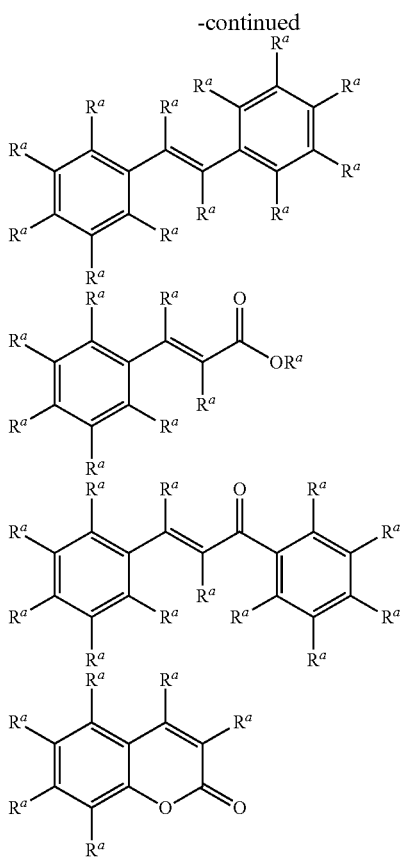

A group represented by W² is preferably contained in the group having lyophilicity. Examples of W² include a hydroxyl group, a carboxyl group, an acyl group, an acyloxy group, a halocarbonyl group (it means a group represented by the formula: —C(=O)-E (wherein E represents a halogen atom), and a group represented by the formula: —C(=O)—Cl and a group represented by the formula: —C(=O)—Br are preferred), a halogen atom, an alkoxy group, an aryloxy group, an arylalkoxy group, a phosphoric acid group (a group represented by the formula: (HO)₂P(=O)—O—), a group having a phosphate ester structure (a group represented by the formula: (R¹O)₂P(=O)—O— or the formula: (R¹O)(HO)P(=O)—O— (wherein R¹ represents an alkyl group, an aryl group, an arylalkyl group, an arylalkenyl group or an arylalkynyl group)), a phosphorous acid group (a group represented by the formula: (HO)₂P—O—), a group having a phosphite ester structure (a group represented by the formula: (R¹O)₂P—O— or the formula: (R¹O)(HO)P—O— (wherein R¹ is as described above)), a mercapto group, an alkylthio group, an arylthio group, an arylalkylthio group, a heterocyclic thio group, an amino group and the like. Among these, the halogen atom, the alkoxy group, the phosphoric acid group, the amino group and the hydroxyl group are preferred.

The group having lyophilicity is preferably a group containing an atom belonging to Group 4, 5, 6, 13, 14, 15 or 16 of the periodic table. Examples of the atoms belonging to Groups 4, 5, 6, 13, 14, 15 or 16 include atoms belonging to Group 4 such as a titanium atom, a zirconium atom, a hafnium atom and the like; atoms belonging to Group 5 such as a vanadium atom, a niobium atom, a tantalum atom and the like; atoms belonging to Group 6 such as a chromium atom, a molybdenum atom, a tungsten atom and the like; atoms belonging to Group 13 such as a boron atom, an aluminum atom, a gallium atom, an indium atom, a thallium atom and the like; atoms belonging to Group 14 such as a silicon atom, a germanium atom, a tin atom, a lead atom and the like; atoms belonging to Group 15 such as a phosphorus atom, an arsenic atom, an antimony atom, a bismuth atom and the like; atoms belonging to Group 16 such as an oxygen atom, a sulfur atom, a selenium atom, a tellurium atom, a polonium atom and the like; and the like, but the tin atom, the titanium atom, the zirconium atom, the aluminum atom, the niobium atom, the boron atom, the silicon atom, the phosphorus atom and the sulfur atom are preferred, the zirconium atom, the aluminum atom, the titanium atom, the silicon atom, the phosphorus atom and the sulfur atom are more preferred, the titanium atom and the silicon atom are furthermore preferred, and the silicon atom is particularly preferred.

As the group having lyophilicity, groups including a structure represented by the formula (3') are preferred and groups consisting of a structure represented by the formula (3') are more preferred.

[Chem. 24]

In the formula (3'), M¹ represents an atom belonging to Group 4, 5, 6, 13, 14 or 15 of the periodic table. W¹ represents a divalent organic group. W² represents the same meaning as that described above. Ra' represents an alkyl group, an alkoxy group, a hydroxyl group, a halogen atom, an alkenyl group, an alkynyl group, an aryl group, an arylalkyl group, an arylalkenyl group or an arylalkynyl group. v1 is an integer of 1 or more and (u−1) or less. u represents an atomic valence of M¹. Where there are a plurality of W²s, these W²s may be the same or different. Where there are a plurality of Ra's, these Ra's may be the same or different.

In the formula (3'), Ra' represents an alkyl group, an alkoxy group, a hydroxyl group, a halogen atom, an aryl group, an arylalkyl group, an arylalkenyl group or an arylalkynyl group, and Ra' is preferably an alkyl group, an alkoxy group, a hydroxyl group, a halogen atom, an aryl group or an arylalkyl group. The group represented by Ra' may have a substituent.

In the formula (3'), u represents an atomic valence of M¹. When M¹ is, for example, a silicon atom, a titanium atom, a zirconium atom or the like, u is 4, and when M¹ is a boron atom, an aluminum atom or the like, u is 3.

In the formula (3'), v1 is an integer of 1 or more and (u−1) or less. v1 is preferably an integer of 2 or more, and more preferably an integer of 3 or more.

Examples of a more preferable embodiment of the group having lyophilicity include a group represented by the following formula (3).

[Chem. 25]

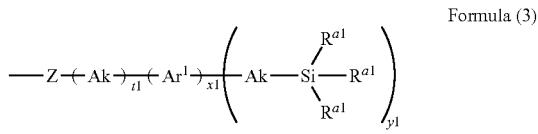

In the formula (3), Z represents —C(=O)O—, —OC(=O)—, —OC(=O)O—, —C(=O)—, —N(R^c)—, —C(=O)N(R^c)—, —N(R^c)C(=O)—, —N(R^c)C(=O)N(R^c)—, -Ak-C(=O)O—, -Ak-OC(=O)—, -Ak-OC(=O)O—, -Ak-C(=O)—, -Ak-N(R^c)—, -Ak-C(=O)N(R^c)—, -Ak-N(R^c)C(=O)—, -Ak-N(R^c)C(=O)N(R^c)—, —O—, —S— or -Ak-, Ar¹ represents an aromatic hydrocarbon group having a valence of (1+y1) or a heterocyclic group having a valence of (1+y1), Ak represents an alkylene group having 1 to 12 carbon atoms, $R^{a1}$ represents a hydrogen atom, a halogen atom, a hydroxyl group, an alkoxy group or an alkyl group, and $R^c$ represents a hydrogen atom or a substituent. Where there are a plurality of $R^c$s, these $R^c$s may be the same or different. t1 represents 0 or 1, x1 represents 0 or 1, and y1 represents an integer of 1 or more. The plurality of $R^{a1}$s may be the same or different. Where there are a plurality of Aks, these Aks may be the same or different.

As $R^{a1}$, a hydroxyl group, an alkoxy group and a halogen atom are preferred. As Ak, alkylene groups having 1 to 6 carbon atoms are preferred. Further, as Z, —C(=O)O—, —OC(=O)—, —C(=O)—, —N($R^c$)—, —C(=O)N($R^c$)—, —N($R^c$)C(=O)—, —O— and -Ak- are preferred. x1 is preferably 1, and y1 is preferably 1 to 3.

Specific examples of the compound containing a group having liquid-repellency are as follows.

[Chem. 26]

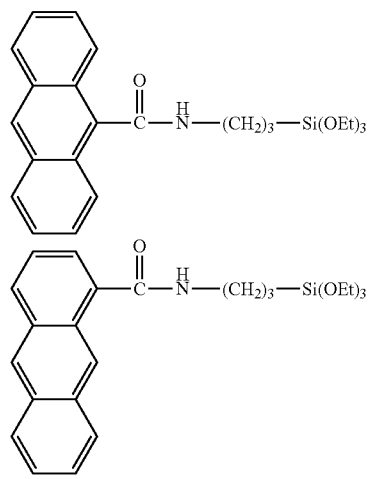

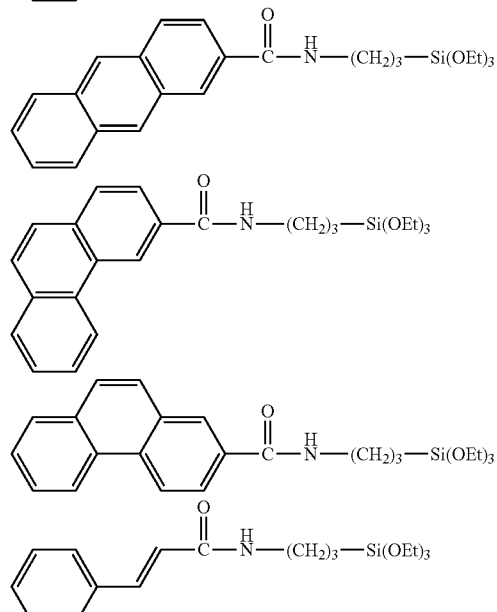

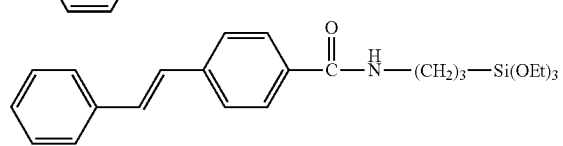

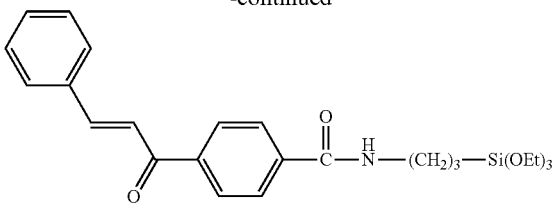

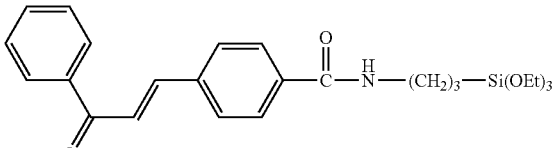

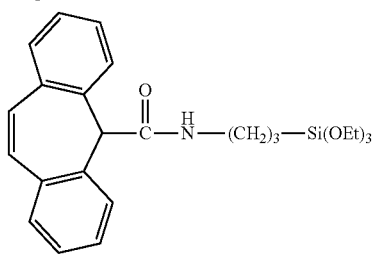

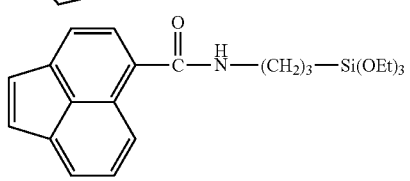

[Chem. 27]

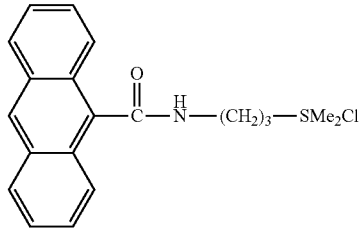

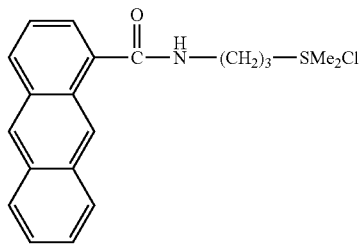

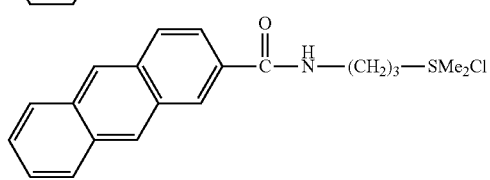

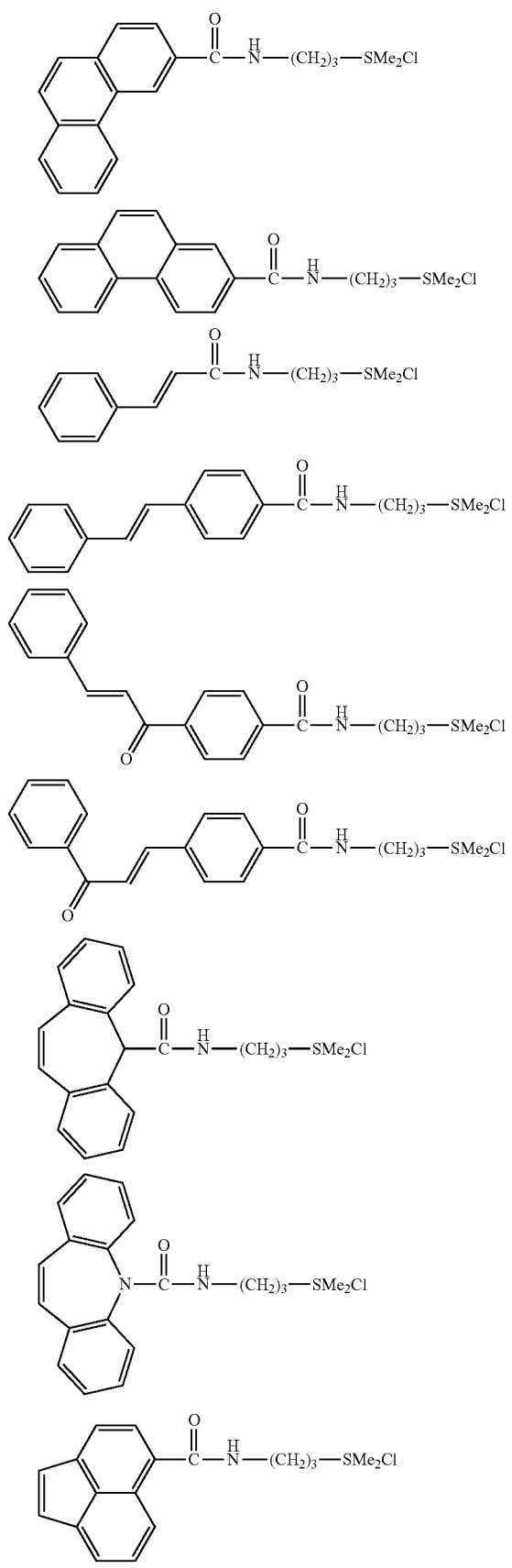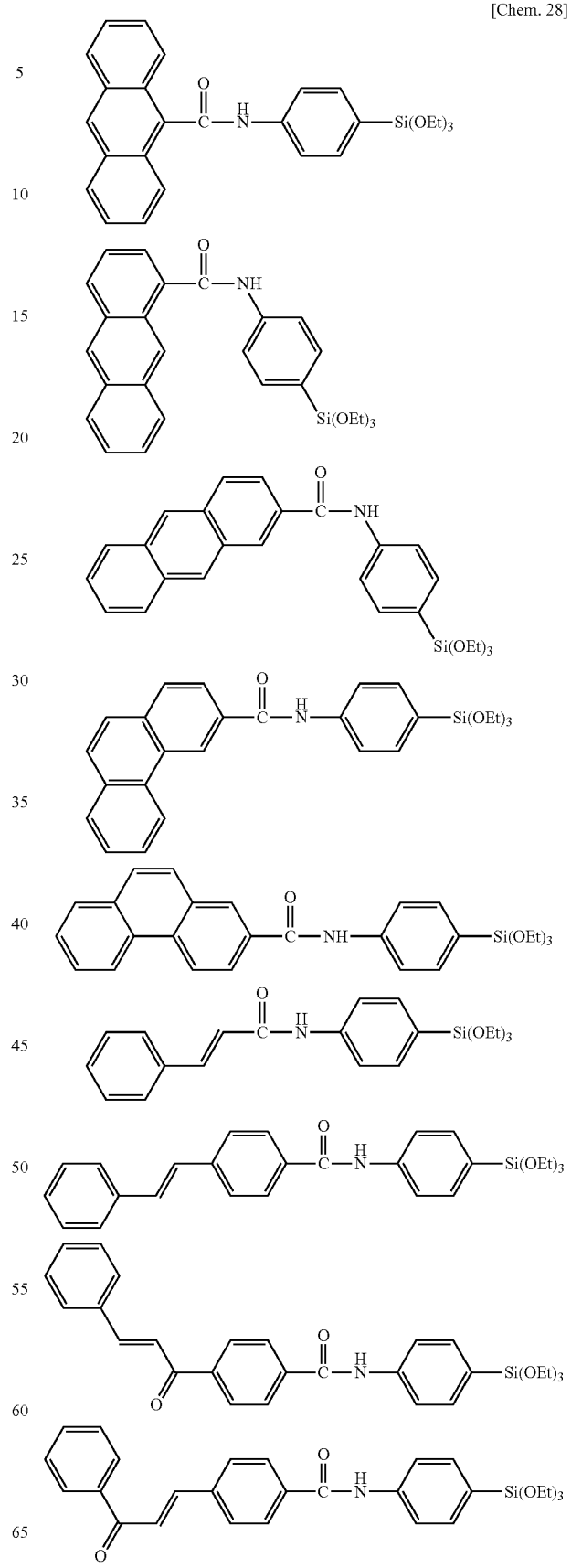

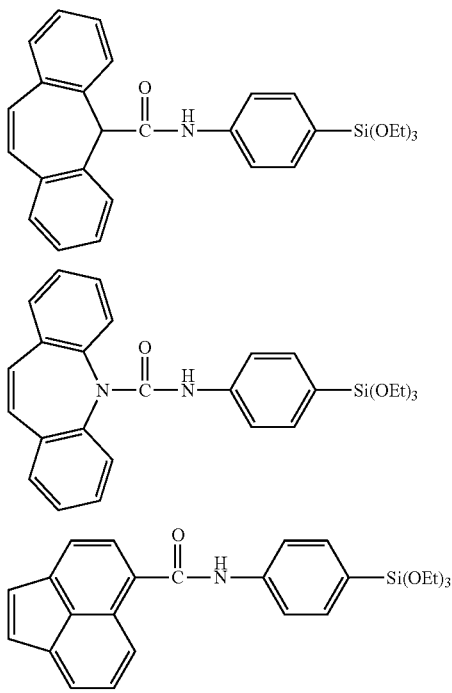

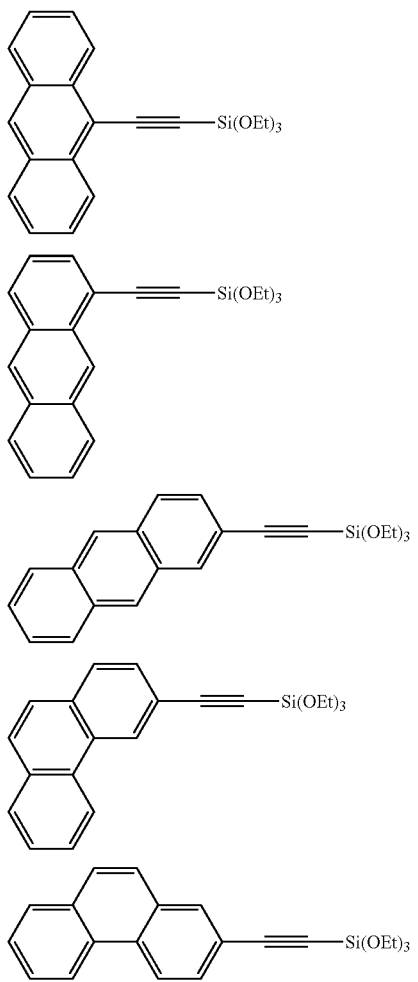

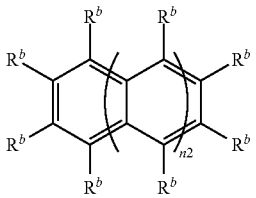

As the compound (B) containing the group having liquid-repellency, compounds having a partial structure represented by the following formula (6-1) are suitably used.

[Chem. 30]

Formula (6-1)

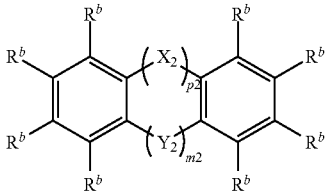

In the formula (6-1), $R^b$ independently at each occurrence represents a hydrogen atom or a substituent. Further, any two adjacent $R^b$s may be coupled with each other to form a ring that is selected from among saturated hydrocarbon rings, unsaturated hydrocarbon rings, aromatic hydrocarbon rings and heterocycles and may have a substituent. At least one of the $R^b$s is a group having liquid-repellency. N2 represents an integer of 0 or more.

Further, groups having a partial structure (6-2) represented by the following formula are also suitably used.

[Chem. 31]

General Formula (6-2)

In the formula (6-2), $R^b$ independently at each occurrence represents a hydrogen atom or a substituent. $X_9$ and $Y_2$ may be the same or different and represent —C(R$^b$)$_2$—, —N(R$^b$)—, —O—, —S—, —Si(R$^b$)$_2$—, —B(R$^b$)— or —C(R$^b$)=C(R$^b$)—. Further, any two adjacent R$^b$s may be coupled with each other to form a ring that is selected from among saturated hydrocarbon rings, unsaturated hydrocarbon rings, aromatic hydrocarbon rings and heterocycles and may have a substituent. At least one of the R$^b$s is a group having liquid-repellency. p2 and m2 are the same or different and represent an integer of 0 or more.

As R$^b$, an alkyl group, an alkoxy group, an aryl group, an aryloxy group, an arylalkyl group, an arylalkoxy group, an arylalkenyl group, an arylalkynyl group, a monovalent heterocyclic group, an amino group, an acyl group, an acyloxy group, an amide group, a carboxyl group, an alkenyl group, an alkynyl group and an acrylic acid ester group are preferred. n2 is preferably 0 to 4. As X$_2$, —C(R$^b$)$_2$— and —N(R$^b$)— are preferred. As Y$_2$, C(R$^b$)$_2$— and —N(R$^b$)— are preferred. p2 is preferably 0 to 2. m2 is preferably 0 to 2.

Specific examples of the compounds represented by the formulae (6-1) and (6-2) are as follows.

[Chem. 32]

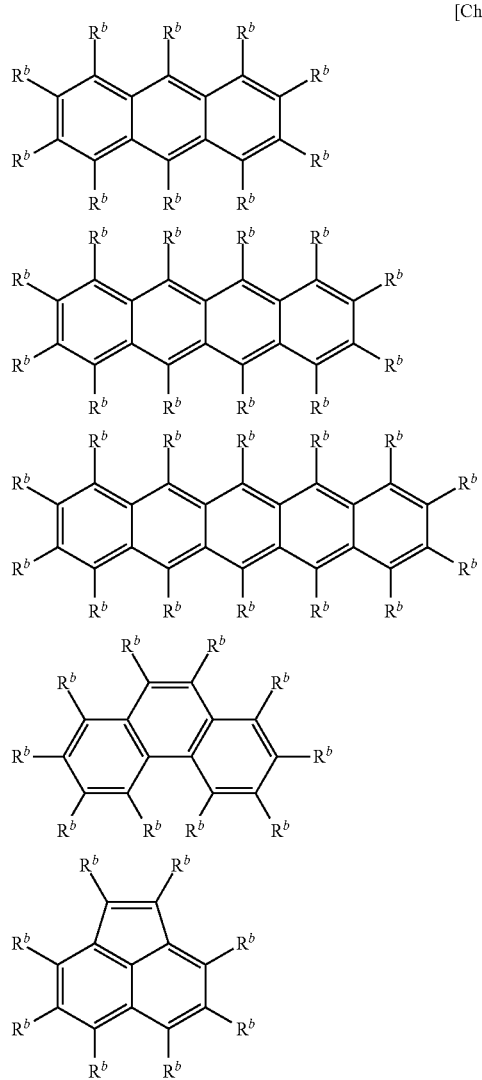

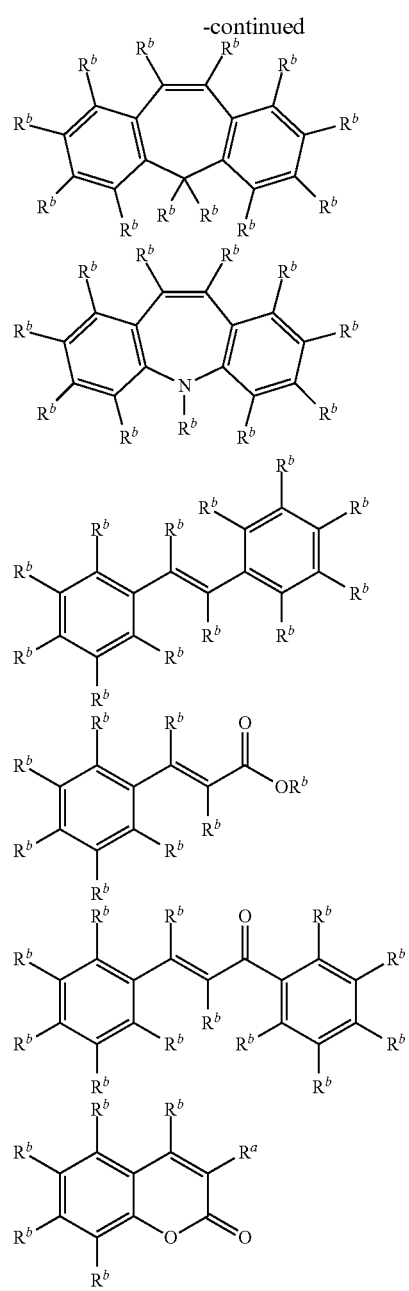

Examples of the compound (B) containing the group having liquid-repellency include groups including the following structure containing a fluorine atom.

[Chem. 33]

$$-(B)_{n3}-R^{b1} \qquad (5)$$

In the formula (5'), B represents a divalent group composed of atoms other than fluorine. Further, R$^{b1}$ represents a monovalent organic group containing a fluorine atom. n3 represents an integer of 0 to 3, and where there are a plurality of Bs, these Bs may be the same or different. B is preferably —O—, an aromatic hydrocarbon group, a heterocyclic group, an alkyl group or an alkyloxy group.

Examples of a preferable embodiment of the group having liquid-repellency include a group represented by the following formula (5-1) or the following formula (5-2).

[Chem. 34]

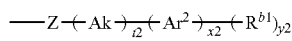

General Formula (5-1)

In the formula (5-1), Z represents —C(=O)O—, —OC(=O)—, —OC(=O)O—, —C(=O)—, —N($R^c$)—, —C(=O)N($R^c$)—, —N($R^c$)C(=O)—, —N($R^c$)C(=O)N($R^c$)—, -Ak-C(=O)O—, -Ak-C(=O)—, -Ak-OC(=O)O—, -Ak-C(=O)—, -Ak-N($R^c$)—, -Ak-C(=O)N($R^c$)—, -Ak-N($R^c$)C(=O)—, -Ak-N($R^c$)C(=O)N($R^c$)—, —O—, —S— or -Ak-, Ak represents an alkylene group having 1 to 12 carbon atoms, and $R^c$ represents a hydrogen atom or a substituent. Where there are a plurality of $R^c$s, these $R^c$s may be the same or different. $Ar^2$ represents an aromatic hydrocarbon group having a valence of (1+y2) or a heterocyclic group having a valence of (1+y2), $R^{b1}$ represents a monovalent organic group containing a fluorine atom, t2 represents 0 or 1, x2 represents 0 or 1, and y2 represents an integer of 1 or more. Where there are a plurality of $R^{b1}$s, these $R^{b1}$s may be the same or different.

[Chem. 35]

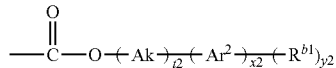

Formula (5-2)

In the formula (5-2), $Ar^2$, $R^{b1}$, Ak, t2, x2 and y2 respectively represent the same meanings as those described above.

$R^{b1}$, a monovalent organic group containing a fluorine atom, is a group in which a fluorine atom is substituted for one or more hydrogen atoms in the organic group. Particularly, the organic group is preferably an alkyl group, an aryl group, an arylalkyl group, an arylalkenyl group or an arylalkynyl group, and more preferably an alkyl group. The number of carbon atoms of the alkyl group is preferably from 1 to 20, more preferably from 4 to 18, and moreover preferably from 6 to 17 from the viewpoint of liquid-repellency.

With respect to the number of fluorine atoms in $R^{b1}$, a value obtained by dividing the number of fluorine atoms in $R^{b1}$ by the sum of the number of fluorine atoms in $R^{b1}$ and the number of hydrogen atoms in $R^{b1}$ (substitutional rate) is preferably 50% or more, and more preferably 70% or more from the viewpoint of liquid-repellency. Particularly, when the organic group is an alkyl group, a so-called perfluoroalkyl group, in which fluorine atoms are substituted for all hydrogen atoms of the organic group, is preferred from the viewpoint of liquid-repellency.

As $Ar^2$, a phenylene group, a phenyltriyl group, a phenyltetrayl group, a naphthalenediyl group, a naphthalenetriyl group, a naphthalenetetrayl group, an anthracenediyl group, an anthracenetetrayl group, a fluorenediyl group and a fluorenetriyl group are preferred. t2 is preferably 1. x2 is preferably 1. y2 is preferably from 1 to 5.

Examples of a more preferable embodiment of the group having liquid-repellency include a group represented by the following formula (5-3).

[Chem. 36]

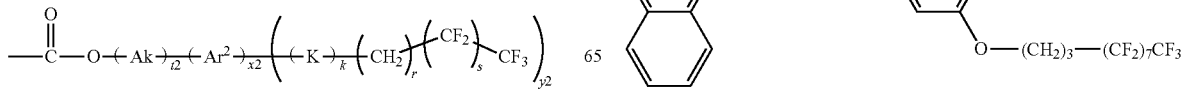

General Formula (5-3)

In the formula (5-3), $Ar^2$, Ak, t2, x2 and y2 respectively represent the same meanings as those described above. K represents —O—, —S—, —NH— or —NR—. R represents an alkyl group or an aryl group. k represents 0 or 1, r represents an integer of 0 to 6, and s represents an integer of 0 to 16. Where there are a plurality of k's, these k's may be the same or different. Where there are a plurality of r's, these r's may be the same or different. Where there are a plurality of s's, these s's may be the same or different.

As K, —O—, —S— and —NR— are preferred. k is preferably 1. r is preferably from 0 to 3. s is preferably from 1 to 10.

Specific examples of the compound containing a group having liquid-repellency are as follows.

[Chem. 37]

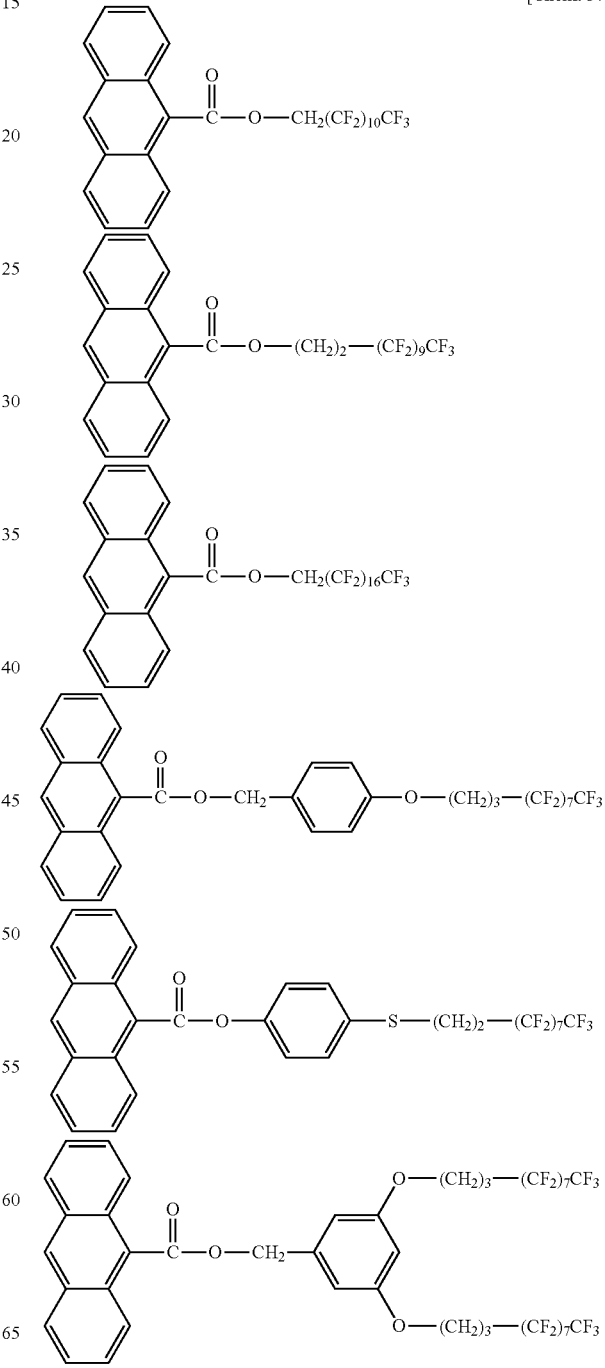

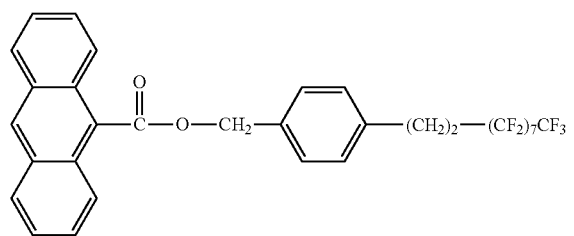
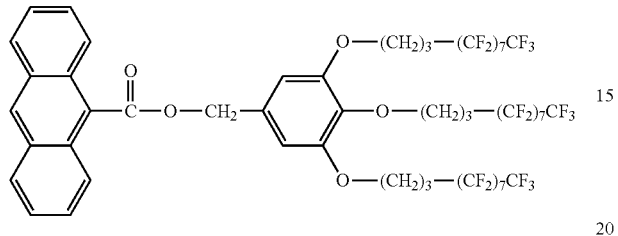
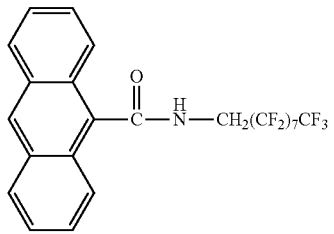
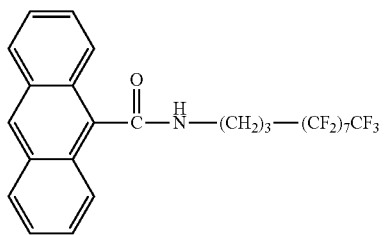
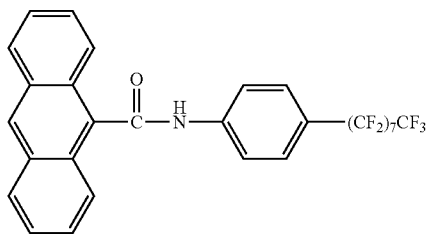
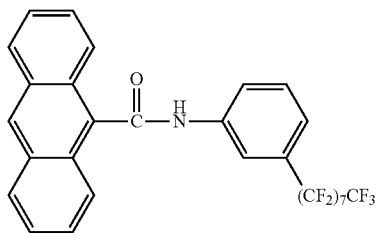
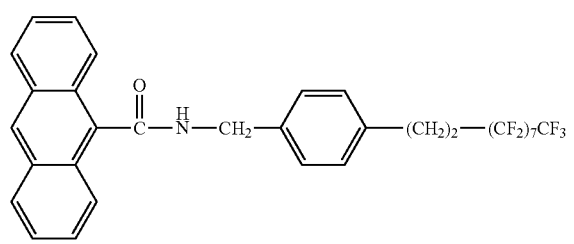
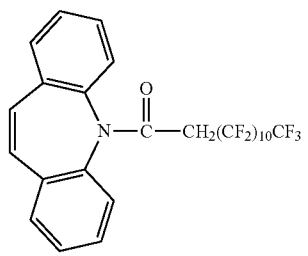
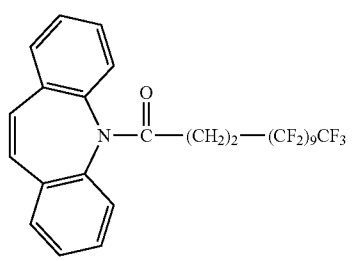
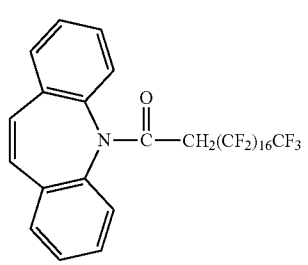
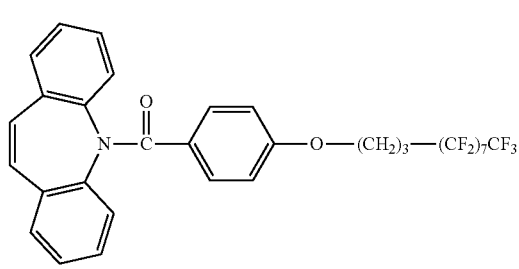
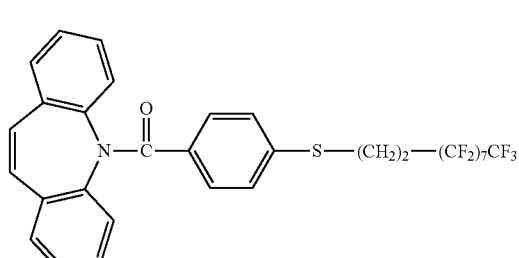
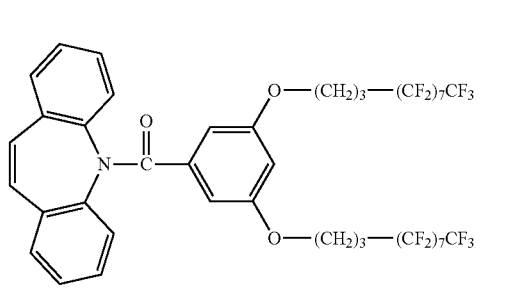

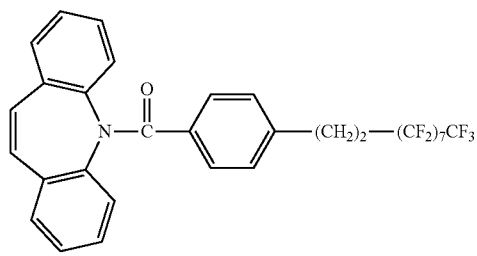
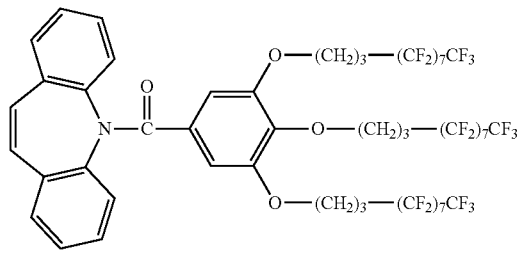
[Chem. 40]
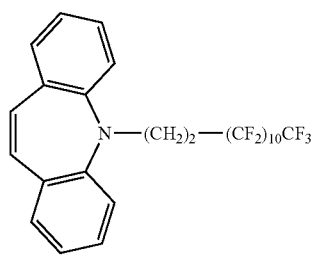
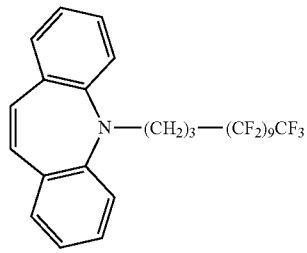
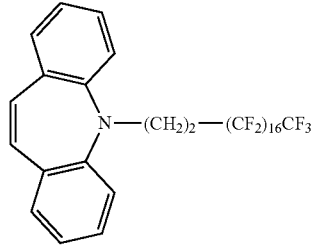
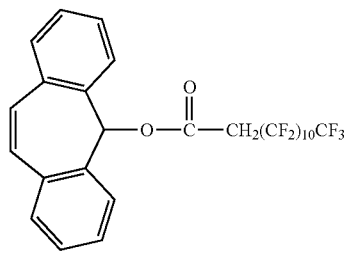
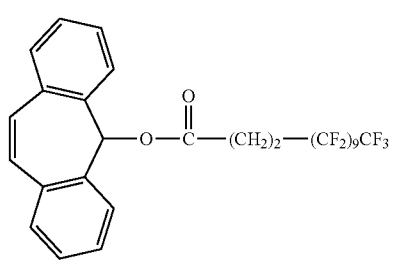
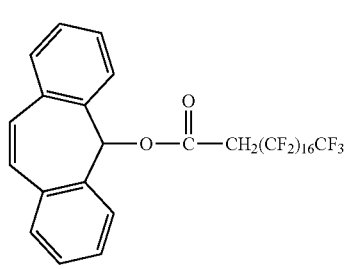
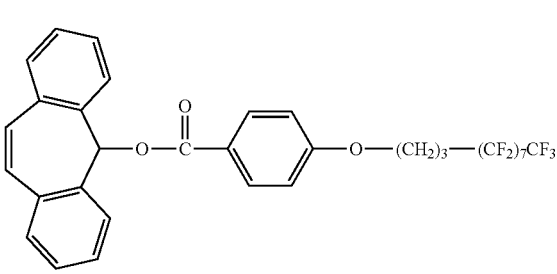
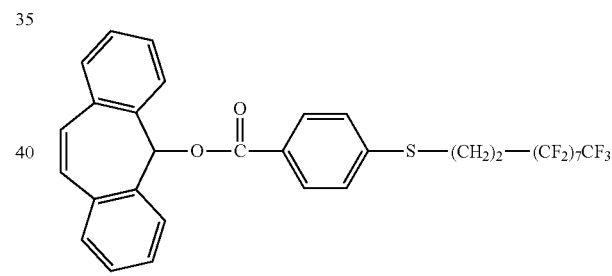
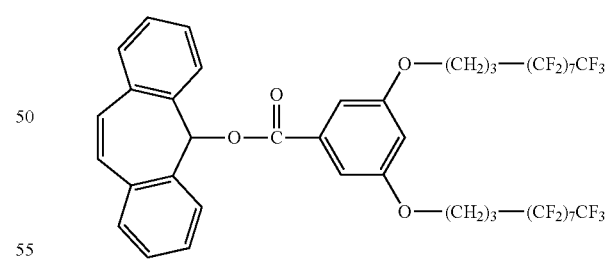
[Chem. 41]
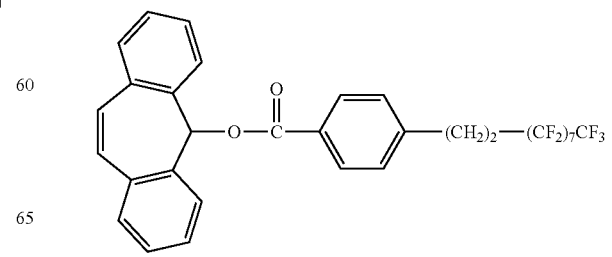

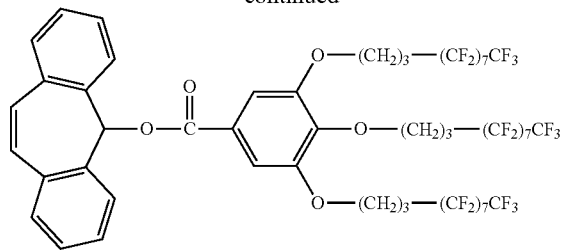
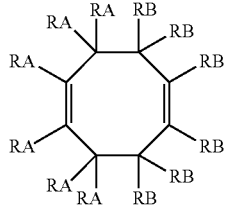

In the formulae, RA is a group derived from the compound (A) and RB is a group derived from the compound (B).

[Chem. 43]

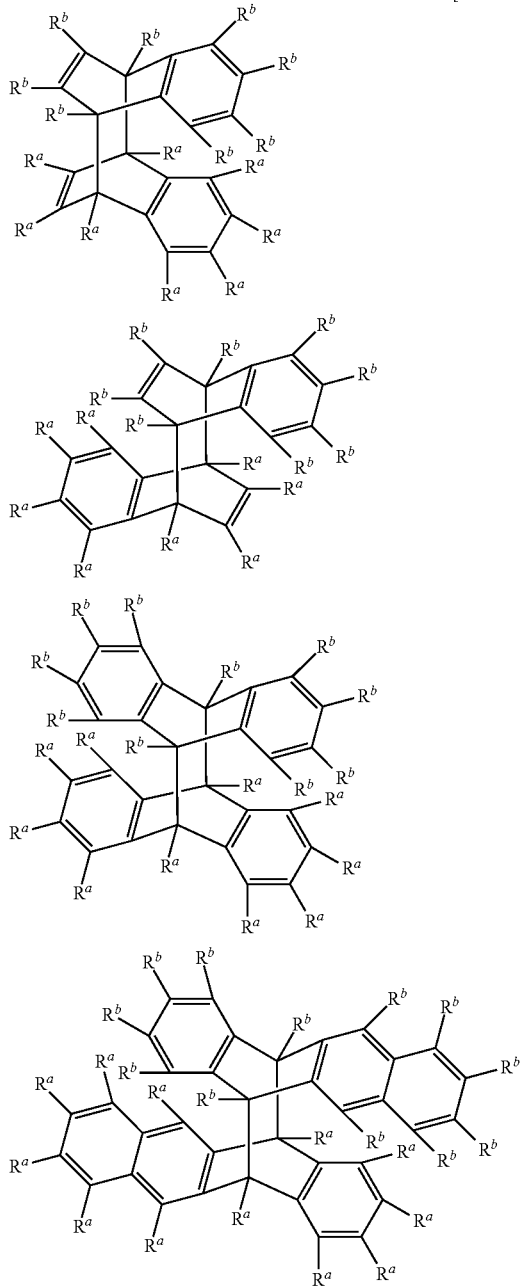

In the present invention, the method of dimerizing the compound (A) and the compound (B) is carried out by light irradiation. Light used in the light irradiation is not particularly limited as long as it is light in a range of wavelengths where this compound absorbs its light energy and initiate a dimerization reaction. For example, light having a wavelength of 200 nm or more and 380 nm or less is preferred. Since light having a wavelength less than 200 nm has very intense energy, there is a possibility of causing decomposition of a member composing a substrate or a substrate surface or this compound. Further, since light having a wavelength more than 380 nm is light of a wavelength which this compound hardly absorbs, a photoreaction hardly occurs and therefore it is not preferred from the viewpoint of production.

Here, irradiation time of light is appropriately changed in accordance with wavelength of light, intensity of light, type of a light source, type of the compound and the like.

Examples of the light source include a low-pressure mercury lamp, a high-pressure mercury lamp, an ultra high-pressure mercury lamp, a xenone lamp, a sodium lamp, a gas laser using nitrogen or the like, a liquid laser of an organic dye solution, a solid laser using an inorganic single crystal containing rare-earth ions, and the like. Further, as a light source giving monochromatic light other than a laser, light with a specific wavelength, in which a broadband line spectrum or a continuous spectrum is extracted by use of an optical filter such as a band-pass filter or a cut-off filter, may be employed. As the light source, a high-pressure mercury lamp or an ultra high-pressure mercury lamp is preferred because a large area can be irradiated at once.

In the present invention, an embodiment of a compound to be formed by the method of dimerizing the compound (A) and the compound (B) by light irradiation includes a compound in which the compound (A) and the compound (B) are bound together by a cycloalkene structure or a cycloalkane structure.

For example, when an anthracene backbone of the compound (A) and an anthracene backbone of the compound (B) are photodimerized, the obtained compound has a structure of 5,12:6,11-di[1,2]benzeno-5,6,11,12-tetrahydrodibenzo[a,e]cyclooctene.

In the present invention, specific examples of the compound formed by binding the compound (A) and the compound (B) together by a cycloalkene structure or a cycloalkane structure are as follows.

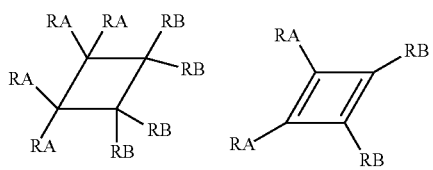

-continued

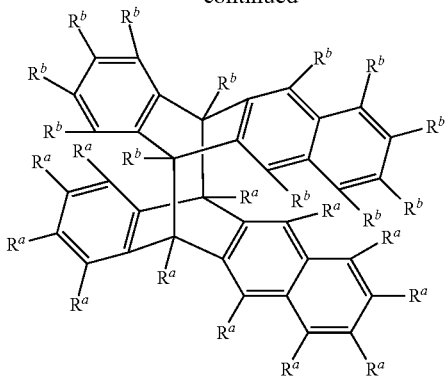

In the formulae, $R^a$ and $R^b$ respectively represent the same meanings as those described above.

[Chem. 44]

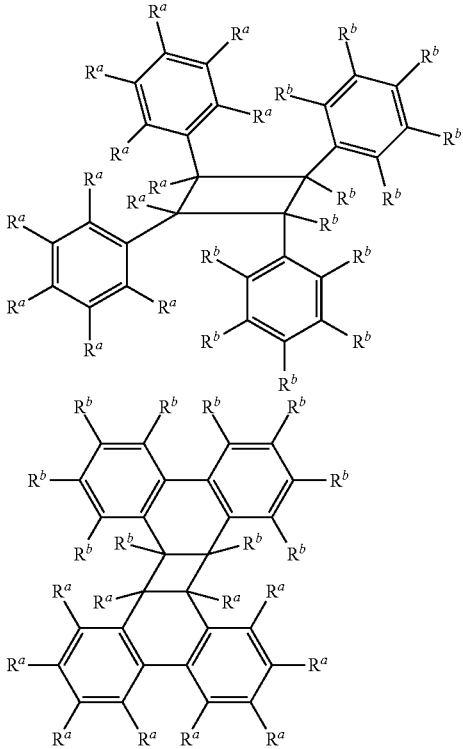

In the formulae, $R^a$ and $R^b$ respectively represent the same meanings as those described above.

A method of patterning a lyophilic region and a liquid-repellent region by using the compound of the present invention will be described below.

First, a substrate such as glass, a substrate with ITO (indium tin oxide) or a silicon wafer is cleaned by using a usual wet cleaning method/dry cleaning method. Then, a solution obtained by dissolving the compound (A) in an organic solvent is applied onto the substrate. A solvent to be used is not particularly limited as long as the compound (A) is soluble therein, but alcohols such as methanol, ethanol, isopropanol and the like; esters such as ethyl acetate, butyl acetate and the like; hydrocarbons such as hexane and the like; and aromatics such as toluene, xylene and the like are preferred. Concentration of the compound (A) in the solution is preferably 0.01 to 50% by weight, and more preferably 0.1 to 10% by weight.

A method of applying the solution is not particularly limited, and coating methods such as spin coating, dip coating, wire bar coating, blade coating, roll coating and the like, printing methods such as ink-jetting, flexo printing and the like, and the like can be employed. Application is preferably performed at room temperature. Next, the substrate having a film formed thereon is heated and dried in the air or in a nitrogen stream. When the compound (A) contains a group having titanium or silicon and contains a group serving as a so-called titanium coupling agent or silane coupling agent, the group reacts with a hydroxyl group on the substrate through the above-mentioned heating and drying to fix the compound (A) onto the substrate.

After heating and drying the substrate, a solution obtained by dissolving the compound (B) in an organic solvent is applied onto the surface on which a film is formed by applying the compound (A). A solvent to be used is not particularly limited as long as the compound (B) is soluble therein, but alcohols such as methanol, ethanol, isopropanol and the like; esters such as ethyl acetate, butyl acetate and the like; hydrocarbons such as hexane and the like; and aromatics such as toluene, xylene and the like are preferred, and among these, a solvent containing a fluorine atom is more preferred. Concentration of the compound (B) in the solution is preferably 0.01 to 50% by weight, and more preferably 0.1 to 10% by weight.

After applying the compound (B), the substrate is heated and dried in a nitrogen stream, and then irradiated with light. Light used in light irradiation is as described above. Light irradiation is preferably carried out through a photomask. By this method, it is possible to initiate a photodimerization reaction only in a desired region at the surface of a film and to obtain a treated substrate in which the lyophilic region and the liquid-repellent region form a desired pattern. An atmosphere of light irradiation can be selected arbitrarily, but it is more preferred to perform light irradiation in an atmosphere of an inert gas such as a nitrogen gas. Other inert gases include a gas selected from argon, helium, xenone, carbon dioxide and the like, and a nitrogen gas is most preferable because it is available at low cost.

After the light irradiation, the unreacted compound (B) present at the surface of the substrate is removed. As a method of removing the unreacted compound (B), a method of washing the substrate with a solvent in which the unreacted compound (B) is soluble is preferred. The solvent used in washing is not particularly limited as long as it is a solvent in which the compound (B) is soluble but the compound (A) is insoluble, and a solvent containing a fluorine atom is preferred.

Since the compound obtained by dimerizing the compound (A) and the compound (B) is present in the region thus irradiated with light, the region exhibits liquid-repellency by the effect of a liquid-repellent group of the compound (B). On the other hand, the region which is not irradiated with light does not exhibit liquid-repellency and becomes relatively lyophilic since the compound (B) is removed by washing and therefore the compound (A) is bonded to the substrate.

In accordance with the production method of the present invention, a lyophilic region and a liquid-repellent region can be patterned by light irradiation without using a large-scale apparatus and a light source. For example, when a solution containing a functional material is applied to the patterned surface by a slot coating method, a spraying method or the like, the solution is not applied to the liquid-repellent region and is held only in the lyophilic region, and therefore a thin film in which the functional material is elaborately patterned is obtained after drying. The patterned functional thin film thus obtained can be usefully used in the field of an organic thin film transistor device, an organic thin film solar cell, an organic EL display and the like.

EXAMPLES

Hereinafter, the present invention will be described with reference to the examples, but the present invention is not limited to these examples.

Synthesis Example 1

Synthesis of Compound 1

[Chem. 45]

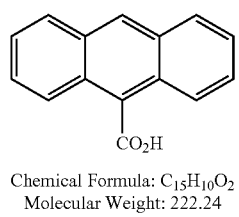

Chemical Formula: $C_{15}H_{10}O_2$
Molecular Weight: 222.24

APS, DCC, HOBt, Et$_3$N
dry CH$_2$Cl$_2$

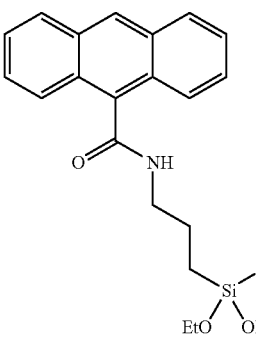

Chemical Formula: $C_{24}H_{31}NO_4Si$
Molecular Weight: 425.59
(Compound 1)

Into a 200 ml two-necked eggplant flask, 1.0 g (4.5 mmol) of 9-anthracenecarboxilic acid, 0.93 g (4.5 mmol) of DCC (N,N'-dicyclohexylcarbodiimide) and 0.61 g (4.5 mmol) of HOBt (1-hydroxybenzotriazole) were put, and the flask was deaerated and the atmosphere in the flask was replaced with argon. To this, 360 ml of dry CH$_2$Cl$_2$ (dehydrated methylene chloride), 1.0 g (4.5 mmol) of APS (3-aminopropyltrimethoxysilane) and 0.45 g (4.5 mmol) of Et$_3$N (triethylamine) were added, and the resulting mixture was magnetically stirred at room temperature for 24 hours. Since the progress of a reaction was confirmed by use of TLC (developing solvent: chloroform), the reaction was terminated, and after the solvent was distilled off under a reduced pressure, the product was purified by column chromatography (silica gel, developing solvent: chloroform). The yield was 360 mg (0.85 mmol, percent yield 20%).

$^1$H NMR (CDCl$_3$): δ=8.46 (s, 1H), 8.07 (d, 2H), 7.99 (d, 2H), 7.48 (m, 4H), 6.42 (s, 1H), 3.75 (m, 6H), 1.90 (m, 2H), 1.25 (m, 2H), 1.12 (m, 9H), 0.77 (t, 2H)

Synthesis Example 2

Synthesis of Compound 2-1

[Chem. 46]

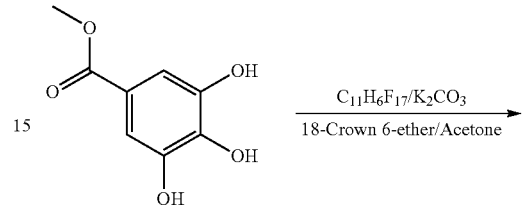

Chemical Formula: $C_8H_8O_5$
Molecular Weight: 184.15

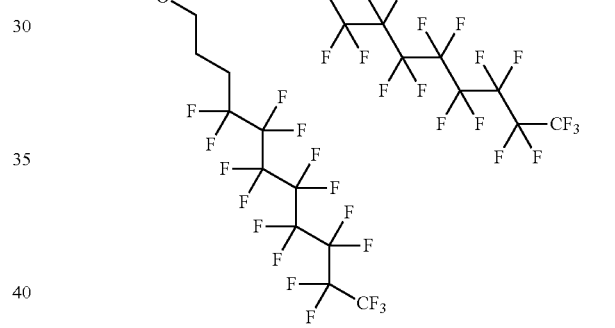

Chemical Formula: $C_{41}H_{23}F_{51}O_5$
Molecular Weight: 1564.54
(Compound 2-1)

Into a three-necked round-bottom flask equipped with a Dimroth condenser and a septum cover, 268 mg (1.5 mmol, 1.0 eq.) of methyl gallate, 3.0 g (0.51 mmol, 3.5 eq.) of heptadecafluoroundecyliodo, 115 mg (0.043 mmol, 0.3 eq.) of 18-crown 6-ether, and 760 mg of potassium carbonate were put, and the flask was deaerated and the atmosphere in the flask was replaced with argon. 20 ml of dehydrated acetone was added and the resulting mixture was refluxed for 3 days. After confirming that the raw material was dissipated by use of TLC (developing solvent: hexane/ethyl acetate=5/1), the reactant was washed with distilled water and dried over anhydrous sodium sulfate, and then the solvent was distilled off under a reduced pressure. Purification of the product was carried out through recrystallization (acetone). The yield of a compound 2-1 was 2.0 g (1.3 mmol, percent yield 89%).

$^1$H NMR (CDCl$_3$): δ=7.28 (s, 2H), 4.11 (t, 3H), 4.05 (t, 2H), 3.89 (s, 3H), 2.33 (m, 6H), 2.15 (m, 4H), 2.08 (m, 2H)

Synthesis Example 3

Synthesis of Compound 2-2

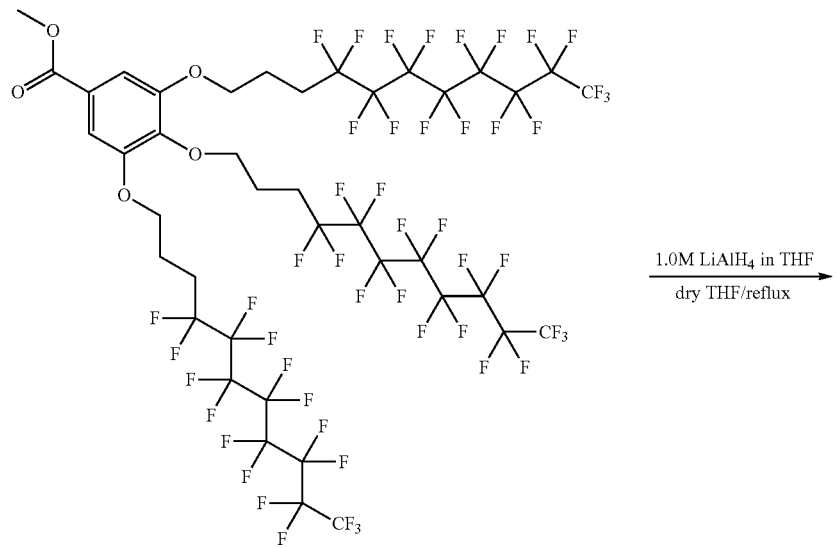

Chemical Formula: $C_{41}H_{23}F_{51}O_5$
Molecular Weight: 1564.54

(Compound 2-1)

[Chem. 47]

1.0M LiAlH₄ in THF / dry THF/reflux

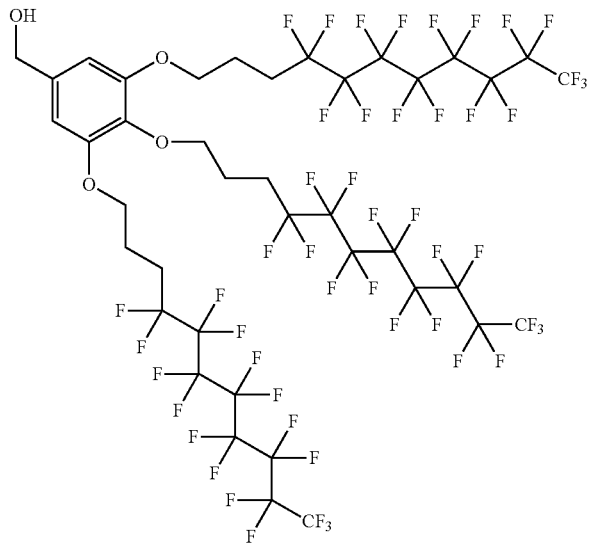

Chemical Formula: $C_{40}H_{23}F_{51}O_4$
Molecular Weight: 1536.53

(Compound 2-2)

Into a 100 ml three-necked round-bottom flask equipped with a Dimroth condenser and a septum cover, 49.5 mg (1.9 mmol, 2.0 eq.) of lithium aluminum hydride was put, and the flask was deaerated and the atmosphere in the flask was replaced with argon. To this, 10 ml of dehydrated THF (tetrahydrofuran) and 1.5 g (1.0 mmol) of the compound 2-1 were added and the resulting mixture was refluxed for 2 hours. After confirming that the raw material was dissipated by use of TLC (developing solvent: hexane/ethyl acetate=1/1), the solvent was distilled off under a reduced pressure. Purification of the product was carried out through recrystallization (acetone). The yield of a compound 2-2 was 1.4 g (0.91 mmol, percent yield 91%).

$^1$H NMR (CDCl$_3$): δ=6.59 (s, 2H), 4.60 (d, 2H), 4.06 (t, 4H), 3.97 (t, 2H), 2.33 (m, 6H), 2.15 (m, 4H), 2.08 (m, 2H)

Synthesis Example 4

Synthesis of Compound 2

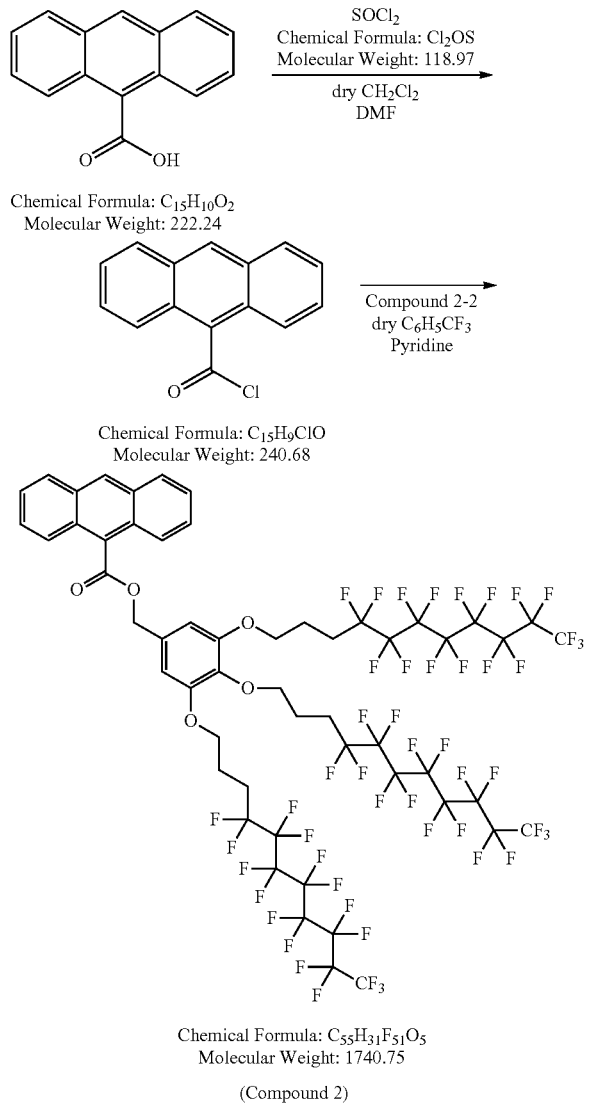

(Compound 2)

Into a 100 ml two-necked eggplant flask equipped with a Dimroth condenser, 17.3 mg (0.078 mmol) of 9-anthracenecarboxilic acid was put, and the flask was deaerated and the atmosphere in the flask was replaced with argon. To this, 5 ml of dry CH$_2$Cl$_2$ (dehydrated dichloromethane), 50 ml of DMF (N,N-dimethylformamide) and 13 mg (16.7 mmol) of thionylchloride were added, and the resulting mixture was refluxed for 0.5 hour at room temperature and then for 4 hours. After stirring the solution, the solvent was distilled off under a reduced pressure, and 100 mg (0.065 mmol) of the compound 2-2, 10 ml of dehydrated trifluorotoluene and 0.5 ml of pyridine were added and the resulting mixture was magnetically stirred at room temperature for 24 hours. After the reaction, the reactant was washed with distilled water, dried over anhydrous sodium sulfate, and then purified through recrystallization (acetone). The yield of a compound 2 was 31 mg (0.018 mmol, percent yield 27%).

Embodiment 1

Organic EL Display

An embodiment of the present invention will be described by way of drawings. The organic EL display of the present invention includes an organic EL device composed of a plurality of pixels and in general, a plurality of organic EL devices are arranged in a matrix form.

FIG. 1(a) is a sectional view showing a cross-section of an organic EL device of an embodiment of the present invention. FIG. 1(b) is a plan view of the organic EL device shown in FIG. 1(a). FIG. 1(a) is a sectional view of FIG. 1(b) taken on line A-A'.

Since the organic EL device shown in FIG. 1 is premised on a top-emission type organic EL display, the organic EL device is laminated on a switching element 2. In addition, the present invention may be applied to a bottom-emission type organic EL display, and in this case, the switching element may be formed in the same plane as the organic EL device In FIG. 1, the switching element 2 is disposed on a substrate 1, and a planarization film 3 for planalizing the bumps and dips of the switching element 2 is disposed on the switching element 2. A first electrode (pixel electrode) 4 is disposed on the planarization film and is electrically connected to a terminal of the switching element 2. A light-emitting layer 7, which is a functional thin film, is disposed on the first electrode 4, and an electron transporting layer 8 and a second electrode (common electrode) 10 are provided on the light-emitting layer 7. A counter substrate 11 for protecting the organic EL device is disposed on the second electrode 10. If a voltage is applied between the first electrode 4 and the second electrode 10 by an action of the switching element 2, charges injected from the first electrode 4 and the second electrode 10 into the light-emitting layer are recombined in the light-emitting layer 7 to emit light and perform a display action.

Herein, a liquid-repellent region 12a prevents the light-emitting layer 7 from flowing out of the fine pixel region in applying the light-emitting layer 7, the functional thin film, by a printing method and plays a role of holding the light-emitting layer 7 only in a desired region to pattern the layer. Thus, an organic EL device, in which the light-emitting layer 7 is arranged only in a desired region, can be configured.

A material of the substrate is not particularly limited, but a material having an insulating property is preferred. Examples of the material of the substrate include glass, PET (polyethylene terephthalate), PEN (polyethylene naphthalate), PI (polyimide) and the like. Of course, when a bottom-emission type organic EL display is employed, it is necessary to use a material having a high light-transmitting property for visible light.

A plurality of pixel electrodes are arranged on a substrate surface and in general, they are arranged in a matrix form. The pixel electrode is preferably an anode, but it may be a cathode. The pixel electrode is preferably connected to, for example, a source electrode or a drain electrode of a switching element.

When the top-emission type organic EL display is used, light-reflecting properties are required of the pixel electrode. As a material of the pixel electrode having the light-reflecting properties, metals such as Ag, Al, Cu and the like and alloys thereof are preferred, and examples of the alloys include a Ag—Pd—Cu alloy, a Ag—Rb—Au alloy, a Mo—Cr alloy, a Ni—Cr alloy and the like.

On the other hand, in the case of a bottom-emission type organic EL display, since a light-transmitting property is required of the substrate and the pixel electrode, it is preferred that the substrate is made of glass, PET, PEN or the like and the anode is made of ITO, IZO (indium zinc oxide), tin oxide or the like. When a plurality of pixel electrodes are formed on the substrate, the electrodes are formed by vapor deposition or sputtering of a material of the electrode or alternatively, of course the electrodes can be formed by using a photolithography method. In this case, the electrodes are preferably arranged in a line shape or in a matrix form on the substrate.

The organic EL display of an embodiment of the present invention has a functional thin film covering a part or the whole area of the first electrode (pixel electrode) on the substrate. In Embodiment 1, as shown in FIG. 1(b), the light-emitting layer 7, which is the functional thin film, is disposed covering the top surface of the first electrode 4.

FIG. 1(c) illustrates another embodiment different from the plan view shown in FIG. 1(b). In FIG. 1(c), the light-emitting layer 7 is disposed on a part of the first electrode 4. A functional material composing the functional thin film may be a low-molecular weight material or a high-molecular weight material, or a combination thereof.

As described above, in accordance with an embodiment of the present invention, in a region surrounding the region where the functional thin film is formed, there is formed a film containing a compound in which a group containing fluorine and a π-conjugated system are bound together by a cycloalkene structure or a cycloalkane structure. Thereby, it is possible to prevent the molecules in a member present in a region surrounding the functional thin film from diffusing in the functional thin film. As a result of this, degradation of characteristics of the functional thin film or deterioration of life characteristics can be prevented and a device adequately exhibiting functions of the functional thin film can be constructed.

Figure 2:
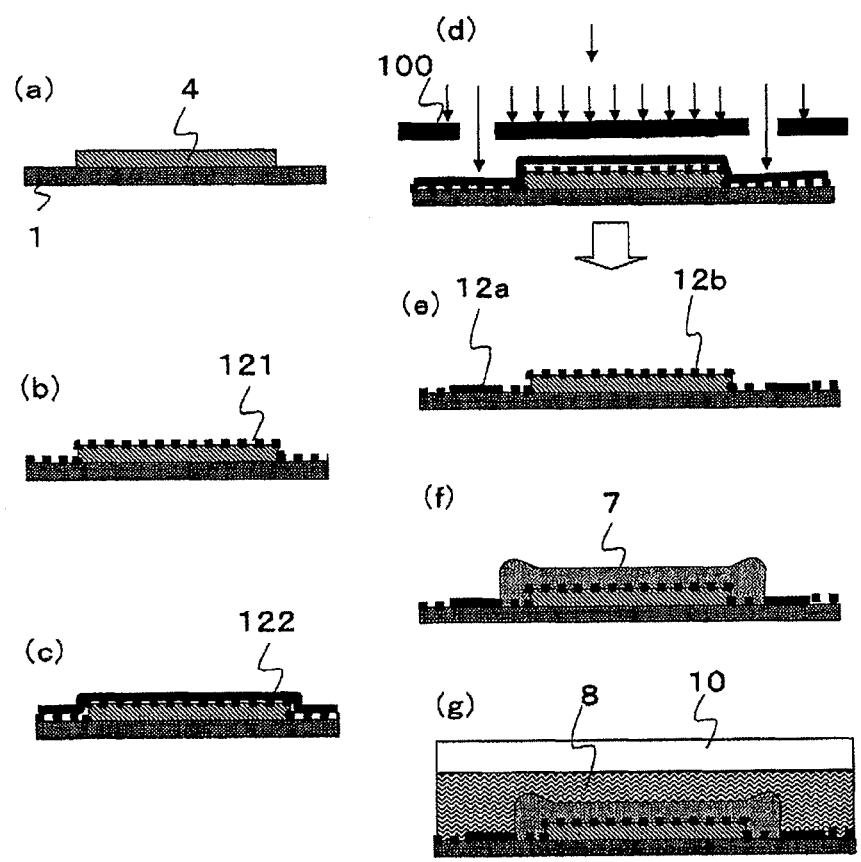
FIG. 2 is a method for producing an organic EL device in Embodiment 1.

FIG. 2 shows a method for producing an organic EL device in Embodiment 1 described above. In FIG. 2, the substrate 1 includes a switching element and a planarization film (not shown).

First, a first electrode 4 is disposed on a substrate 1 as shown in FIG. 2(a). Next, as shown in FIG. 2(b), the compound (A) of the present invention is applied onto the substrate 1 and dried to form a first film 121. Next, as shown in FIG. 2(c), a second film 122 formed by applying and drying the compound (B) is disposed. Then, as shown in FIG. 2(d), the substrate 1 is irradiated with ultraviolet light with a wavelength of 365 nm through a photomask 100 for selective light irradiation. The photomask 100 has openings at locations corresponding to regions where liquid-repellency is to be exhibited and these regions are irradiated with light to be liquid-repellent regions. A region not subjected to light irradiation is lyophilic. In this way, liquid-repellent regions 12a can be provided in a region surrounding the lyophilic region 12b as shown in FIG. 2(e). As shown in FIG. 2(f), an ink containing a functional material is applied to the lyophilic region 12b. A film of the ink containing a functional material is formed in a region within the liquid-repellent regions defined by treatment of the present invention by ink-jetting; dispenser, nozzle coating, spin coating, intaglio printing, anastatic printing or the like.

Thereby, a light-emitting layer 7, which is the functional thin film, can be easily formed with relatively good accuracy without spreading the ink to the liquid-repellent regions outside the lyophilic region 12b. On the light-emitting layer 7, an electron transporting layer 8 and a second electrode 10 are formed so as to stride the light-emitting layer 7 as shown FIG. 2(g). Thus, the organic EL device of the embodiment can be produced.

The functional thin film formed by the coating method can include at least a light-emitting layer, a hole injection layer, an intermediate layer, an electron transporting layer and the like. These layers are laminated on a pixel electrode.

Examples of an organic light-emitting material composing the light-emitting layer include polyphenylenevinylene and derivatives thereof, polyacetylene and derivatives thereof, polyphenylene and derivatives thereof, poly(p-phenyleneethylene) and derivatives thereof, poly(3-hexylthiophene) and derivatives thereof, polyfluorene and derivatives thereof, a dendrimer and the like. Further, the organic light-emitting material is not limited to a high-molecular weight material and may be a low-molecular weight light-emitting material having high solubility and a good film-forming property or an oligomer.

The hole injection layer is a charge injection layer provided on the anode side and has a function of enhancing injection efficiency of a hole from the pixel electrode. As examples of an inorganic oxide used as a hole injection layer, transition metal oxides are preferably used. Examples of the inorganic oxide include molybdenum oxide, tungsten oxide, vanadium oxide, nickel oxide, titanium oxide and the like. Examples of the organic material include PEDOT:PSS, poly(3,4-ethylenedioxythiophene) and derivatives thereof and the like. When F4-TCNQ having a large value of the lowest unoccupied molecular orbital level (LUMO level) or derivatives thereof are used for further improving an injection property, the injection property is improved further (Non-Patent Document: Applied physical letter, vol. 94, p. 359, 2003).

A cathode is disposed on the light-emitting layer or the electron injection layer. A material of the cathode of the bottom-emission type organic EL display is not particularly limited as long as it reflects light, and the cathode is composed of a metal layer of aluminum, silver or the like. A material of the cathode of the top-emission type organic EL display is not particularly limited as long as it is a material that easily transmits visible light, and for example, an ITO film, an IZO film or the like is used. Further, the anode and the cathode may be reversed, and in the case where a cathode is formed on the substrate as a pixel electrode, a light-reflecting metal layer can be used in the bottom-emission type display, and a light-transmitting ITO film or IZO film can be used in the top-emission type display.

Moreover, the organic EL device may have a sealing film arranged on the cathode or the anode. The sealing film prevents the functional thin film of the organic EL device from being exposed to moisture or air.

Further, the functional thin film formed by coating may have a two-layer structure of the intermediate layer (inter-layer) and the light-emitting layer. In this case, the intermediate layer is disposed on the first electrode between the first electrode and the light-emitting layer. The intermediate layer has a role of blocking electron transport from the light-emitting layer to the hole injection layer and a role of transporting a hole efficiently to the light-emitting layer. Examples of a material of the intermediate layer include triphenylamine and derivatives thereof, polyaniline and derivatives thereof and the like.

The electron injection layer is a charge injection layer provided on the cathode side and injects/transports an electron injected from the cathode to the light-emitting layer. Examples of a material of the electron injection layer include organics such as aluminum quinoline complex, phthalocyanine and the like; alkali metals and alkaline earth metals such as lithium, calcium, barium and the like; oxides thereof such as barium oxide and the like; halides such as lithium fluoride, sodium fluoride and the like; oxides such as titanium oxide, magnesium oxide and the like; and combinations thereof.

Moreover, each organic EL device of the organic EL display of the present invention has a liquid-repellent film to define a region of an electrode or a functional thin film. The liquid-repellent film comprises a compound in which the compound (A) and the compound (B) of the present invention are bound together by a cycloalkane structure or a cycloalkene structure, and a region where this compound is present is the liquid-repellent region 12a. On the other hand, a region where only the compound (A) is left on the substrate is the lyophilic region 12b having lyophilicity. Among these, the lyophilic region 12b is a pixel where the functional thin film is provided.

The lyophilic region where only the compound (A) is left on the substrate may have a pixel shape or a line shape. When the lyophilic region having a pixel shape is employed, a region of the functional thin film of the organic EL device is defined for each organic EL device. When the lyophilic region having a line shape is employed, a region of the functional thin film of a plurality of organic EL devices forming a line of organic EL devices arranged in a matrix form is defined. Accordingly, the functional thin films of adjacent organic EL devices are coupled with one another.

When the lyophilic region having a pixel shape is employed, a raw material ink of the functional thin film is applied by dropping to the lyophilic region defined by the compound (A) by an ink-jet method or the like. When the lyophilic region having a line shape is employed, application of the ink is easy since a raw material ink of the functional thin film can be applied continuously to the lyophilic region defined by the compound (A). Moreover, there is also an advantage that uniformity of thickness of the functional thin film is improved.

As the bank which has hitherto been used as a reservoir to place an ink in the pixel region (for example, refer to Japanese Patent Laid-open Publication No. 2002-334782), it is known that a bank obtained by patterning a photosensitive resin material by photolithography and developing is used, but moisture or impurities remain in the bank of the photosensitive resin material to adversely affect luminous efficiency of the functional thin film and driving life. By applying the present invention to employ a constitution not using the bank, adverse effects caused by remaining moisture and impurities can be eliminated, and maximum performance inherent to the material can be drawn out.

Figure 3:
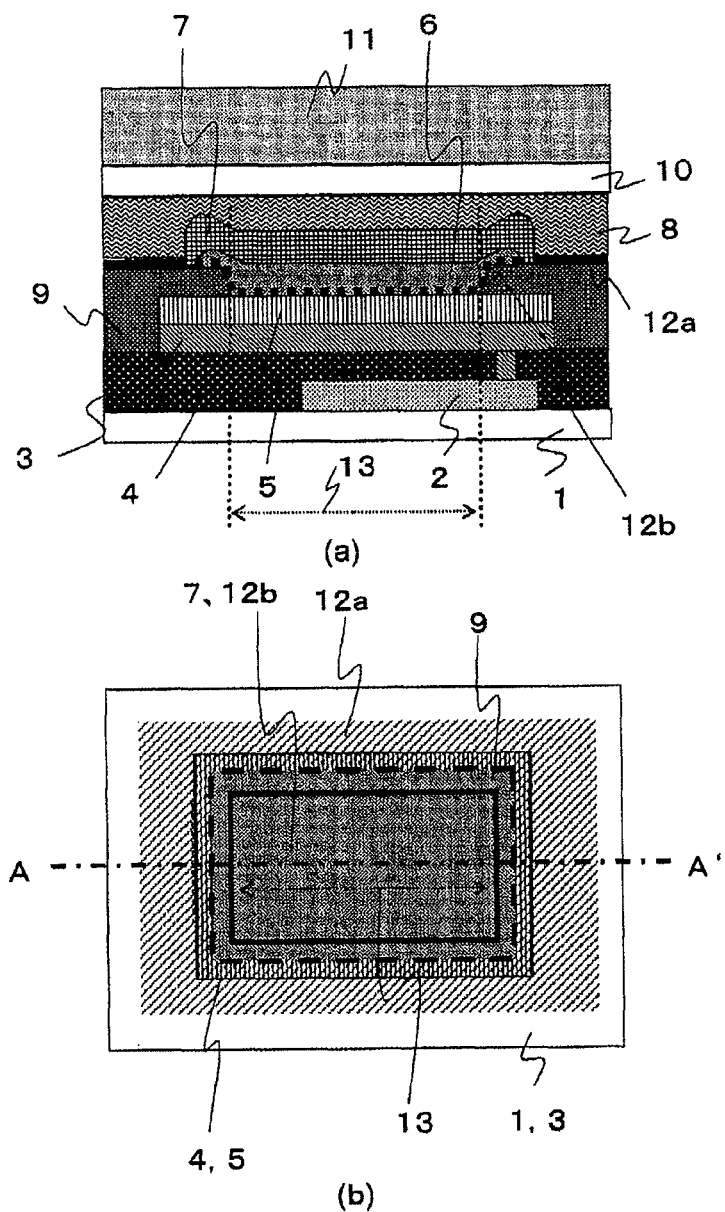
FIG. 3 is a structural drawing of an organic EL device in another example of Embodiment 1.

Another example of an organic EL device composing the organic EL display of the present invention is shown in FIG. 3. FIG. 3(a) is a sectional view showing a cross-section of an organic EL device of another embodiment of the present invention. FIG. 3(b) is a plan view of the organic EL device shown in FIG. 3(a). FIG. 3(a) is a sectional view of FIG. 3(b) taken on line A-A'.

The organic EL device shown in the embodiment of FIG. 3 is different from the organic EL device shown in the embodiment of FIG. 1 in that the device has a charge injection layer 5 on the first electrode 4. The charge injection layer is a hole injection layer when the first electrode 4 is an anode. The charge injection layer plays a role of injecting a charge into the light-emitting layer, and can improve luminous efficiency. When the charge injection layer is a hole injection layer, more preferably, the charge injection layer 5 can be composed of an inorganic oxide.

Moreover, a regulating layer 9 for regulating a pixel is disposed on the hole injection layer 5. The regulating layer 9 regulates an effective region 13 of the functional thin film, namely a pixel region, and can be composed of an inorganic insulating layer such as a silicon oxide film, an organic insulating layer such as a photosensitive resin material, or the like. In accordance with the constitution of the present invention, film thickness of a peripheral portion of the lyophilic region may become nonuniform in applying the functional thin film, but by regulating a region of the pixel with the regulating layer 9, it is possible to avoid the use of a region of the peripheral portion, in which film thickness is nonuniform, as the pixel region to obtain uniform light emission. The regulating layer 9 is formed by patterning by photolithography and etching of a photosensitive resin material.

After forming the first electrode 4 and the charge injection layer 5, the regulating layer 9 having openings in the pixel region is formed. Thereafter, in the liquid-repellent region 12a, a compound in which a first film composed of the compound (A) and a second film composed of the compound (B) are bound together is formed, and in the lyophilic region 12b, a first film composed of the compound (A) is formed. A part of the liquid-repellent region 12a and a part of the regulating layer 9 overlap one another. An intermediate layer 6 and a light-emitting layer 7 are laminated in the lyophilic region 12b. These are preferably formed by a coating method. Moreover, a cathode 10 and a sealing film 11 are laminated. The electron transporting layer 8, the cathode 10 and the sealing film 11 may be connected to an adjacent organic EL device across the region regulated by the regulating layer 9. The sealing film may be formed on the cathode side or on the cathode to contact the atmosphere. The sealing film can be formed of a resin, silicon nitride, silicon oxide or the like.

In order to define the liquid-repellent region and the lyophilic region, first, the first film composed of the compound (A) is formed and then the second film composed of the compound (B), in which a liquid-repellent group is introduced, is formed on the first film. Subsequently, a predetermined area is irradiated with ultraviolet light to proceed a photoreaction between the first film and the second film to obtain a liquid-repellent film. Thereafter, the film is washed with a fluorine-based organic solvent to remove the unreacted second film. The step of forming the first film and the second film comprises two steps of (a) applying a material and (b) baking the material for evaporating the solvent. Examples of a method of applying a material include a dipping method, a spin coating method, a slit coating method and the like. Conditions of ultraviolet light irradiation has only to be a condition with which the photoreaction adequately proceeds.

Films of compounds exhibiting lyophilicity and liquid-repellency are formed by the process described above. As described above, the lyophilic region may have a line shape or a pixel shape, but it preferably has a line shape. A part of the first film composed of the compound (A) and a part of the second film composed of the compound (B) have only to be irradiated with light through a mask in order to selectively irradiate them.

The lyophilic region and the liquid-repellent region are provided in this way, and then the functional thin film is formed in the lyophilic region by a coating method. As described above, it is preferred that an ink containing a functional material is applied by an ink-jet method, a dispenser method, a nozzle coating method, a spin coating method, an intaglio printing method, an anastatic printing method or the like, and dried to form a layer. After the formation of the functional thin film, a cathode is laminated and a sealing film is formed, and thereby an organic EL device can be prepared.

Next, the present invention will be described in more detail with reference to specific examples.

Example 1

Next, examples will be described. First, a glass substrate was cleaned by the following procedure. That is, the substrate was subjected to ultrasonic cleaning using acetone for 30 minutes and then subjected to UV ozone cleaning for 15 minutes.

Next, the compound 1 prepared in Synthesis Example 1 was dissolved in a mixed solvent of equal parts of dehydrated dichloroethylene and dehydrated toluene at a concentration of 4 mM with respect to the solvent to form a solution of the compound 1. The glass substrate subjected to ultrasonic cleaning was immersed in the solution of the compound 1 for 20 minutes.

Thereafter, the glass substrate was taken out and dried at 110° C. for 20 minutes in the air with a hot plate. After drying, chloroform was poured over the glass substrate to remove the excess compound 1 and form a film containing the compound 1.

Next, the compound 2 prepared in Synthesis Example 2 was dissolved in chloroform at a concentration of 1 mM with respect to chloroform to form a solution of the compound 2. The above-mentioned substrate having the applied compound 1 was immersed in the solution of the compound 2 for 20 minutes. Thereafter, the glass substrate was taken out and naturally dried in the air to form a film containing the compound 2 on the film containing the compound 1.

Next, the film containing the compound 2 was irradiated with ultraviolet light. The ultraviolet irradiation was performed at the intensity of 51 mW/cm² for 20 minutes by use of light with a wavelength of 365 nm with a high-pressure mercury lamp. After irradiation, trifluorotoluene was poured over the whole substrate to remove the unreacted compound 2.

The compound 1 and the compound 2 were photodimerized in the part irradiated with light to produce the following compound. The following compound contains a group having liquid-repellency and the reaction region is a liquid-repellent region.

Example 2

First, a glass substrate was cleaned by the following procedure.

That is, the substrate was subjected to ultrasonic cleaning using acetone for 30 minutes and then subjected to UV ozone cleaning for 15 minutes.

Next, the compound 1 prepared in Synthesis Example 1 was dissolved in a mixed solvent of equal parts of dehydrated dichloroethylene and dehydrated toluene at a concentration of 4 mM with respect to the solvent to form a solution of the compound 1. The glass substrate subjected to ultrasonic cleaning was immersed in the solution of the compound 1 for 20 minutes.

Thereafter, the glass substrate was taken out and dried at 110° C. for 20 minutes in the air with a hot plate. After drying, chloroform was poured over the glass substrate to remove the excess compound 1 and form a film containing the compound 1.

Next, the compound 2 prepared in Synthesis Example 2 was dissolved in chloroform at a concentration of 1 mM with respect to chloroform to form a solution of the compound 2. The above-mentioned substrate having the applied compound 1 was immersed in the solution of the compound 2 for 20 minutes. Thereafter, the glass substrate was taken out and naturally dried in the air to form a film containing the compound 2 on the film containing the compound 1.

Next, trifluorotoluene was poured over the whole substrate to remove the unreacted compound 2. When the light irradiation is not carried out, since the film containing the compound 2 is removed and the film containing the compound 1 is present at the surface of a region where the film containing the compound 2 has been removed, the region is a lyophilic region.

[Chem. 49]

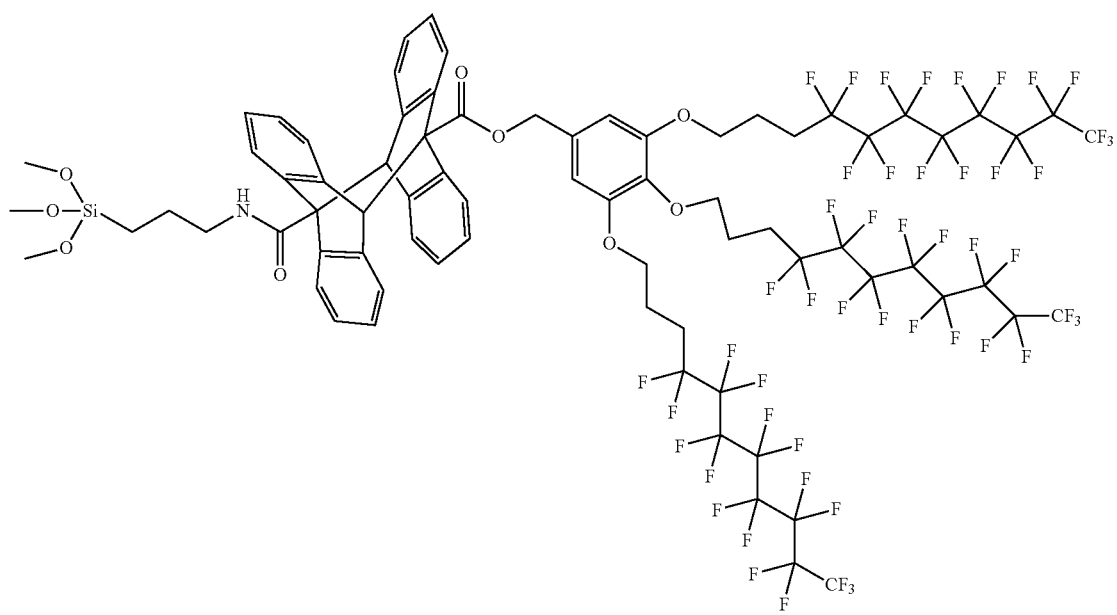

Contact angle of anisole on the substrate thus prepared was measured with a contact angle meter (OCA-30 manufactured by Data Physics Corporation), and consequently it was 25°.

Contact angle of anisole on the substrate thus prepared was measured with a contact angle meter (OCA-30 manufactured by Data Physics Corporation), and consequently it was 5°.

Example 3

Pixel electrodes (190 μm×60 μm, thickness: 50 nm) of a first electrode were arranged in a matrix form on a glass substrate by a sputtering method. The first electrode was an anode and its material was a Ag—Pd—Cu alloy.

Next, a hole injection layer was formed on the anode in a thickness of 40 nm by a sputtering method. A material of the hole injection layer was tungsten oxide (WOx) formed by reactive sputtering.

Next, in the same manner as in Example 1, the compound 1 was formed on the hole injection layer and a liquid-repellent region having a compound, in which the compound 1 and the compound 2 were bound together, was formed on the hole injection layer so as to surround the lyophilic region and the anode. A solution (solvent: anisole) containing TFB (triphenylamine) in an amount of 0.8% by weight was applied to a lyophilic region (surface of the hole injection layer) having a line shape, and dried to form an intermediate layer (thickness: 20 nm). Then, a solution (solvent: cyclohexylbenzene) containing polyfluorene in an amount of 1.3% by weight was applied, and dried to form a light-emitting layer (thickness: 85 nm). The solution was applied by using an ink-jet method.

Next, barium was deposited by vacuum deposition to form an electron injection layer (thickness: 5 nm).

On the electron injection layer, a cathode (material: ITO, thickness: 100 nm) was formed by a facing targets sputtering method. Finally, a sealing film was formed. A material of the sealing film is silicon oxide, and a CVD (chemical vapor deposition) method was employed as a formation method. The sealing film having a thickness of 1 μm was formed to obtain an organic EL device.

Further, an organic EL display in which the compound of the present invention was not formed was simultaneously prepared as a reference.

Light-emitting characteristics of the reference device were measured, and consequently the driving voltage was 7.5 V and the luminous efficiency was 14.7 cd/A. Meanwhile, the organic EL device formed by the production method of the present invention had almost the same characteristics.

Embodiment 2

Thin Film Transistor

The present invention also provides a thin film transistor described below.

First, an example of a thin film transistor having a bottom-gate structure will be described.

FIG. 4(a) is a sectional view showing a cross-section of a thin film transistor having a bottom-gate structure of an embodiment of the present invention. FIG. 4(b) is a plan view of the thin film transistor shown in FIG. 1(a). FIG. 4(a) is a sectional view of FIG. 41(b) taken on line A-A'.

Figure 4:
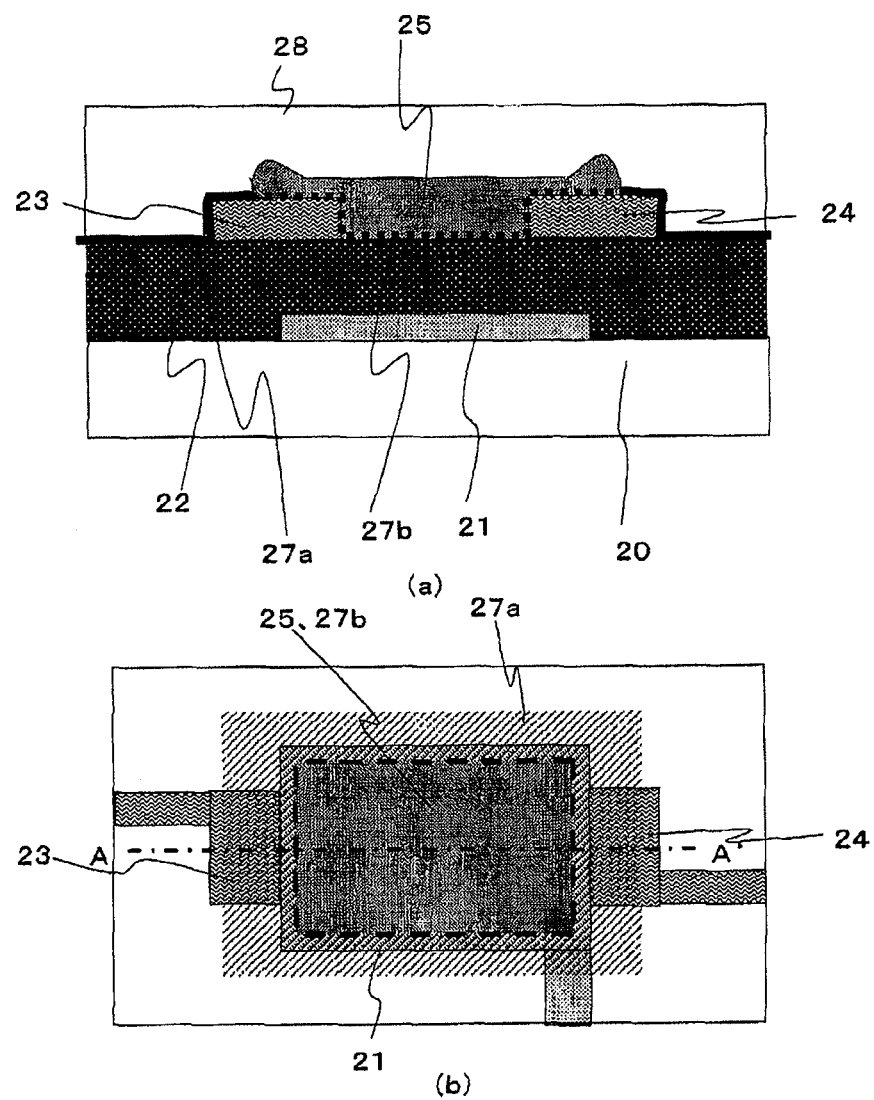
FIG. 4 is a structural drawing of a bottom-gate type thin film transistor of the present invention.

In FIG. 4, on a substrate 20, a gate electrode 21 arranged on the substrate 20, a gate insulating film 22 covering the gate electrode 21, a source electrode 23 arranged on the gate insulating film 22, and a drain electrode 24 are disposed. A lyophilic region 27b, in which the compound (A) is provided so as to cover a channel region and a part of the source electrode 23 and the drain electrode 24, is present, and a semiconductor layer 25 is disposed thereon as a functional thin film. A liquid-repellent region 27a, in which the compound (A) and the compound (B) are bound together to form a liquid-repellent film, is disposed in regions other than the channel region and other than a part of the source electrode and the drain electrode. An overcoat layer 28 is provided so as to cover the liquid-repellent film and the semiconductor layer 25.

Herein, the liquid-repellent region 27a prevents the semiconductor layer 25 from flowing out of the fine channel region in applying the semiconductor layer 25, which is the functional thin film, by a printing method and plays a role of holding the semiconductor layer 25 only in a desired region to pattern the layer. Thus, a thin film transistor, in which the semiconductor layer 25 is arranged only in a desired region, can be configured.

In addition, another example of a thin film transistor having a bottom-gate structure is shown below although not shown in the drawings. This thin film transistor includes a substrate, a gate electrode arranged on the substrate, a gate insulating film covering the gate electrode, a lyophilic region, in which the compound (A) to define a channel region as a lyophilic region is provided on the gate insulating film, and a liquid-repellent region to define a region other than the channel region as a liquid-repellent region in which the compound (A) and the compound (B) are bound together to form a liquid-repellent film. This thin film transistor also includes a semiconductor layer disposed in the lyophilic region, a source electrode and a drain electrode disposed above the semiconductor layer and the gate insulating film with a channel portion interposed therebetween, and an overcoat layer.

As described above, in accordance with an embodiment of the present invention, also in the thin film transistor having a bottom-gate structure, a film containing a compound in which a group containing fluorine and the π-conjugated system are bound together by a cycloalkene structure or a cycloalkane structure, is formed in a region surrounding the region where the functional thin film is formed. Thereby, it is possible to prevent the molecules in a member present in a region surrounding the functional thin film from diffusing in the functional thin film. As a result of this, degradation of characteristics of the functional thin film or deterioration of life characteristics can be prevented and a device adequately exhibiting functions of the functional thin film can be constructed.

Next, an example of a thin film transistor having a top-gate structure will be described.

Figure 5:
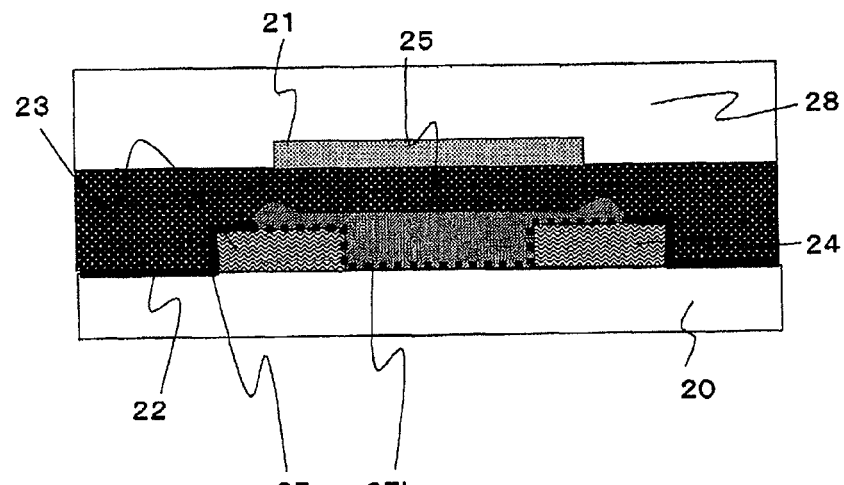
FIG. 5 is a structural drawing of a top-gate type thin film transistor of the present invention.

FIG. 5 shows a cross-section of a thin film transistor having a top-gate structure of an embodiment of the present invention.

In FIG. 5, the device can have a configuration in which a substrate 20, a source electrode 23 and a drain electrode 24, respectively arranged on the substrate 20, a film which defines a channel region between the source electrode 23 and the drain electrode 24 as a lyophilic region 27b and other regions 27a as a liquid-repellent region, a semiconductor layer 25 disposed in the lyophilic region, and a gate electrode 21 above the semiconductor layer 25 with the gate insulating film 22 interposed therebetween are provided.

Further, it is preferred that a buffer layer (not shown) composed of an inorganic oxide is disposed between the source electrode 23 or the drain electrode 24 and the semiconductor layer 25. The buffer layer is a layer composed of an inorganic substance such as a transition metal oxide and is patterned collectively together with the source electrode 23 and the drain electrode 24. The buffer layer facilitates the injection of charge from the source electrode 23 or the drain electrode 24 and enables to realize a good transistor characteristic.

As described above, in accordance with an embodiment of the present invention, also in the thin film transistor having a top-gate structure, a film containing a compound in which a group containing fluorine and the π-conjugated system are bound together by a cycloalkene structure or a cycloalkane structure, is formed in a region surrounding the region where the functional thin film is formed. Thereby, it is possible to prevent the molecules in a member present in a region surrounding the functional thin film from diffusing in the functional thin film. As a result of this, degradation of characteristics of the functional thin film or deterioration of life characteristics can be prevented and a device adequately exhibiting functions of the functional thin film can be constructed.

In the above-mentioned thin film transistor, a thin film transistor, in which a desired region is formed as a channel by defining a liquid-repellent region and a lyophilic region, applying an ink containing a dissolved semiconductor material to a lyophilic region, and drying the ink, can be produced by use of the same method as that (refer to FIG. 2) described in the above-mentioned production method of the organic EL device, in both of a thin film transistor having a bottom-gate structure and a thin film transistor having a top-gate structure. As a functional material in the case where the semiconductor material is dissolved in an ink, applied and dried to obtain a semiconductor layer, organic semiconductor materials and semiconductor materials for forming an inorganic oxide semiconductor from In, Ga, Zn or the like can be used. In the thin film transistor, as a method of forming a semiconductor layer, printing methods such as an ink-jet method and the like, and coating methods such as a spin coating method, a slit coating method and the like can be used. In the application of a light-emitting layer in the organic EL display, it is necessary to apply three colors of RGB separately, but in the thin film transistor, it is unnecessary to apply colors separately and therefore a method which is higher in productivity, such as a slit coating method, is applicable.

Example 4

A film of molybdenum is formed in a thickness of 150 nm on a glass substrate as a gate electrode, and patterned by steps of photolithography and etching. Next, a silicon nitride a film is formed in a thickness of 50 nm as a gate insulating film. Then, a film of aluminum is formed in a thickness of 150 nm on the gate insulating film and subsequently a film of molybdenum oxide is formed in a thickness of 20 nm, and these two films are collectively patterned by photolithography and etching to form a source electrode and a drain electrode respectively composed of an aluminum layer, and a buffer layer composed of molybdenum oxide. Subsequently, by the same method as in Example 1, a region between the source electrode and the drain electrode is designated as a lyophilic region and the other region is designated as a liquid-repellent region. An ink containing an organic semiconductor material can be applied to the lyophilic region by an ink-jet method and dried. Subsequently, an overcoat layer comprising an organic material can be formed to complete a thin film transistor.

Embodiment 3

Photoelectric Conversion Element

An embodiment, in which a material capable of being applied is disposed as a functional thin film of a photoelectric conversion element, will be described.

Figure 6:
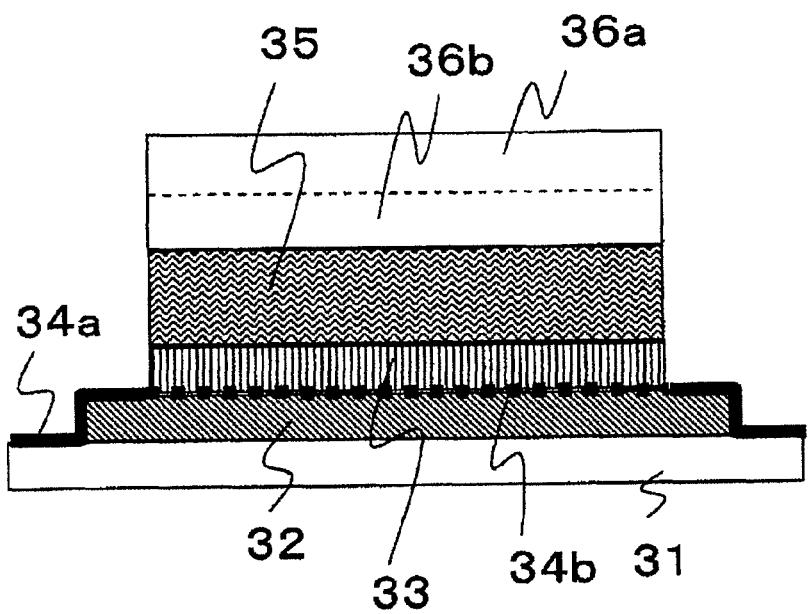
FIG. 6 is a sectional view of a photoelectric conversion element in Embodiment 3.

FIG. 6 is a sectional view showing a cross-section of a photoelectric conversion element of an embodiment of the present invention. A material of the functional thin film is not particularly limited as long as it can be applied, but it is preferably a so-called bulk heterojunction type photoelectric conversion layer. This can be obtained as a mixture of an organic semiconductor, a fullerene derivative and a carbon nanotube derivative, or by mixing p-type and n-type organic semiconductor materials and inorganic semiconductor nanoparticles.

In FIG. 6, in the photoelectric conversion element of the present embodiment, an anode 32 is formed on a substrate 31. A film 34 of a compound defining a liquid-repellent region 34a and a lyophilic region 34b is formed on the anode 32. A charge transporting layer 33 on the anode side is formed in the lyophilic region 34b of the film 34 of the compound, and an organic photoelectric conversion layer 35 is formed on the charge transporting layer 33 as a functional thin film. A metal electrode 36a and a layer 36b for improving efficiency of electron extraction on the cathode side is formed on the organic photoelectric conversion layer 35.

Herein, the liquid-repellent region 34a prevents the organic photoelectric conversion layer 35 from flowing out of the region for photoelectric conversion in applying the organic photoelectric conversion layer 35, which is the functional thin film, by a printing method and plays a role of arranging the organic photoelectric conversion layer 35 only in a desired region to pattern the layer. Thus, a photoelectric conversion element, in which the organic photoelectric conversion layer 35 is arranged only in a desired region, can be configured.

By employing this constitution, in accordance with an embodiment of the present invention, also in the photoelectric conversion element, a film containing a compound in which a group containing fluorine and the π-conjugated system are bound together by a cycloalkene structure or a cycloalkane structure, is formed in a region surrounding the region where the functional thin film is formed. Thereby, it is possible to prevent the molecules in a member present in a region surrounding the functional thin film from diffusing in the functional thin film. As a result of this, degradation of characteristics of the functional thin film or deterioration of life characteristics can be prevented and a device adequately exhibiting functions of the functional thin film can be constructed.

In order to pattern the organic photoelectric conversion layer or the like, in general, a wall called a bank is formed by photolithography by using a material such as a photosensitive resin. However, when the bank is employed, characteristics are deteriorated due to problems of outgas or residues. On the other hand, when the compound of the present invention is employed, it is thought that these problems are solved and highly efficient characteristics can be achieved.

As the substrate 31, in general, glass is used, but a flexible material such as a plastic film can be used in order to make use of flexibility of the organic material. Further, various high-molecular weight materials such as polyethylene terephthalate, polycarbonate, polymethylmethacrylate, polyethersulfone, polyvinyl fluoride, polypropylene, polyethylene, polyacrylate, amorphous polyolefin, fluorine-based resins and the like; compound semiconductor substrates such as silicon wafer, gallium arsenide, gallium nitride and the like; and the like can be applied.

As the anode 32, ITO, ATO ($SnO_2$ doped with Sb), AZO (ZnO doped with Al) and the like can be applied. As the cathode 36, metal materials such as Al, Ag, Au and the like can be applied. In this case, since the material of the anode 32 has a light-transmitting property, light from the substrate 31 can enter the organic photoelectric conversion layer 35, but when light from the cathode 36 is received, film thickness has to be adjusted so as to have a light-transmitting property.

The cathode 36 is formed in a two-layer structure of the metal electrode 36a such as aluminum and the layer 36b for improving efficiency of electron extraction on the cathode side, for example, a thin film of an inorganic dielectric such as LiF or the like, a metal fluoride or a metal oxide. In addition, the layer 36b is not essential in the present invention and may be used as required.

As the charge transporting layer 33 on the anode side, a PEDOT:PSS layer can be applied. In addition, when an inorganic material of a transition metal oxide such as MoOx, WOx or the like is used in place of PEDOT as the charge transporting layer, it is possible to further improve the life.

The organic photoelectric conversion layer 35 contains an electron donating organic material and an electron accepting material.

As the electron donating organic material, phenylenevinylenes such as methoxyethylhexoxy-polyphenylenevinylene (MEH-PPV) and the like; polymers having, as a repeating unit, a derivative such as fluorene, carbazole, indole, pyrene, pyrrole, picoline, thiophene, acetylene, diacetylene or the like, and copolymers thereof with other monomers; derivatives thereof; and a group of polymer materials collectively called a dendrimer.

In addition, the electron donating organic material is not limited to polymers, and porphyrin compounds such as porphine, tetraphenylporphine copper, phthalocyanine, copper phthalocyanine, titanium phthalocyanine oxide and the like; aromatic tertiary amines such as 1,1-bis{4-(di-P-tolylamino) phenyl}cyclohexane, 4,4',4"-trimethyltriphenylamine, N,N,N',N'-tetrakis(P-tolyl)-P-phenylenediamine, 1-(N,N-di-p-tolylamino)naphthalene, 4,4'-bis(dimethylamino)-2-2'-dimethyltriphenylmethane, N,N,N',N'-tetraphenyl-4,4'-diaminobiphenyl, N,N'-diphenyl-N,N'-di-m-tolyl-4,4'-diaminobiphenyl, N-phenylcarbazole and the like; stilbene compounds such as 4-di-P-tolylaminostilbene, 4-(di-P-tolylamino)-4'-[4-(di-P-tolylamino)styryl]stilbene and the like; triazole derivatives, oxadiazole derivatives, imidazole derivatives, polyarylalkane derivatives, pyrrazoline derivatives, pyrrazolone derivatives, phenylenediamine derivatives, arylamine derivatives, amino-substituted chalcone derivatives, oxazole derivatives, styrylanthracene derivatives, fluolenone derivatives, hydrazone derivatives, silazane derivatives, polysilane-aniline-based copolymers, high-molecular-weight oligomers, styrylamine compounds, aromatic dimethylidyne compounds, poly 3-methylthiophene and the like are also applicable.

Further, as the electron accepting material, fullerenes such as C60 and C70, carbon nanotubes, and derivatives thereof; oxadiazole derivatives such as 1,3-bis(4-t-butylphenyl-1,3,4-oxadiazolyl)phenylene (OXD-7) and the like; anthraquinodimethane derivatives, diphenylquinone derivatives and the like can be applied.

In addition, the organic photoelectric conversion layer 35 is not limited to the above-mentioned materials. The material may be one containing, for example, materials having, in the film, a functional group such as acrylic acid, acetamide, a dimethylamino group, a cyano group, a carboxyl group, a nitro group or the like; materials to serve as an acceptor to accept an electron, such as a benzoquinone derivative, tetracyanoethylene, and tetracyanoquinodimethane and derivatives thereof; materials having a functional group such as an amino group, a triphenyl group, an alkyl group, a hydroxyl group, an alkoxy group, a phenyl group or the like, substituted amines such as phenylenediamine; and materials to serve as a donor being an electron donating material such as anthracene, benzoanthracene, substituted benzoanthracenes, pyrene, substituted pyrene, carbazole and derivatives thereof, tetrathia fulvalene and derivatives thereof, and being doped.

Herein, doping means that an electron accepting molecule (acceptor) or an electron donating molecule (donor) is introduced into an organic semiconductor film comprising an electron accepting material as a dopant. Accordingly, the doped organic semiconductor film is a film containing the above-mentioned fused polycyclic aromatic compound and the dopant. As the dopant used in the present invention, both of the acceptor and the donor can be used. Examples of the acceptor include halogens such as $Cl_2$, $Br_2$, $I_2$, ICl, $ICl_3$, IB, IF and the like; Lewis acids such as $PF_5$, $AsF_5$, $SbF_5$, $BF_3$, $BCl_3$, $BBr_3$, $SO_3$ and the like; proton acids such as HF, HCl, $HNO_3$, $H_2SO_4$, $HClO_4$, $FSO_3H$, $ClSO_3H$, $CF_3SO_3H$ and the like; organic acids such as acetic acid, formic acid, amino acid and the like; transition metal compounds such as $FeCl_3$, FeOCl, $TiCl_4$, $ZrCl_4$, $HfCl_4$, $NbF_5$, $NbCl_5$, $TaCl_5$, $MoCl_5$, $WF_5$, $WCl_6$, UF6, $LnCl_3$ (Ln=lanthanoid (La, Ce, Nd, Pr, or the like) and Y) and the like; electrolyte anions such as $Cl^-$, $Br^-$, $I^-$, $ClO_4^-$, $PF_6^-$, $AsF_5^-$, $SbF_6^-$, $BF_4^-$, a sulfonic acid anion and the like; and the like. Examples of the donor includes alkali metals such as Li, Na, K, Rb, Cs and the like; alkaline earth metals such as Ca, Sr, Ba and the like; rare earth metals such as Y, La, Ce, Pr, Nd, Sm, Eu, Gd, Tb, Dy, Ho, Er, Yb and the like; an ammonium ion, $R_4P^+$, $R_4As^+$, $R_3S^+$, acetylcholine and the like.

As a method of introducing these dopants, either of a method in which an organic semiconductor film is formed in advance and the dopant is introduced later, and a method in which the dopant is introduced at the time of forming an organic semiconductor film, can be employed. Examples of a doping method in the former method include gas phase doping using a gaseous dopant, liquid phase doping in which a solution or liquid dopant is brought into contact with the thin film to perform doping, solid phase doping in which a dopant in a solid state is brought into contact with the thin film to perform diffusion doping, and the like. Further, in the liquid phase doping, by performing electrolysis, it is possible to adjust doping efficiency and dopant concentration. In the latter method, the organic semiconductor compound and a mixed solution or a dispersion of the dopant may be simultaneously applied and dried. For example, when the vacuum deposition method is used, by co-depositing the dopant together with the organic semiconductor compound, the dopant can be introduced. Further, when the thin film is formed by a sputtering method, by performing sputtering by using a binary target of the organic semiconductor compound and the dopant, it is possible to introduce the dopant into the thin film.

Examples of a method for forming the organic semiconductor film include a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, a bar coating method, a die coating method, an LB method and the like, and these can be used according to a material. Among these, from the viewpoint of productivity, a spin coating method, a blade coating method, a dip coating method, a roll coating method, a bar coating method, a die coating method and the like are preferred since they are capable of forming a thin film easily and precisely by use a solution of an organic semiconductor. Thickness of the thin film composed of these organic semiconductors is not particularly limited, but characteristics of the resulting photoelectric conversion element often significantly depend on the thickness of the organic semiconductor film. Thickness of the thin film is generally 1 μm or less, and preferably 10 to 300 nm although it depends on the kind of the organic semiconductor.

As the cathode, a conductive thin film of a metal or the like is generally used, and for example, metals such as gold, copper, aluminum, platinum, chromium, palladium, indium, nickel, magnesium, silver, gallium and the like and alloys thereof, semiconductors of oxides such as tin-indium oxide, polysilicon, amorphous silicon, tin oxide, indium oxide, titanium oxide and the like, semiconductors of compounds such as gallium arsenide, gallium nitride and the like, and the like can be applied.

Example 5

Next, examples will be described. First, an ITO film 32 having a thickness of 150 nm was formed on the glass substrate 31 by a sputtering method, and a resist material (manufactured by TOKYO OHKA KOGYO CO., LTD., OFPR-800) was applied to an upper portion of the ITO film by a spin coating method to form a resist film having a thickness of 5 μM. Then, the substrate with the resist film was subjected to masking and light irradiation, and developed to pattern the resist into a shape of the anode 32.

Thereafter, the glass substrate 31 was immersed in a 18 N aqueous hydrochloric acid solution of 60° C. to etch the ITO film 32 at a location where the resist film was not formed and washed with water, and finally, the resist film was removed to form the anode 32 composed of the ITO film having a predetermined patterned shape.

Next, the glass substrate 31 was subjected to cleaning in the order of ultrasonic cleaning by a detergent (manufactured by Furuuchi Chemical Corporation, Semico Clean) for 5 minutes, ultrasonic cleaning by pure water for 10 minutes, ultrasonic cleaning by a solution obtained by mixing 1 part of hydrogen peroxide water and 5 part of water to 1 part of ammonia water for 5 minutes and ultrasonic cleaning by pure water of 70° C. for 5 minutes, and then moisture adhered to the glass substrate 31 was removed by a nitrogen blower and the glass substrate 31 was heated at 250° C. to dry.

Then, the compound to define a lyophilic region and a liquid-repellent region was formed on the glass substrate 31 having the ITO film 32 formed thereon. A first film was formed and then a second film was formed thereon. Irradiation of a predetermined area of this laminated film with ultraviolet light allows a photoreaction of the compound 1 prepared in Synthesis Example 1 as the first film and the compound 2 prepared in Synthesis Example 2 as the second film to proceed to obtain a compound. Thereafter, the film is washed with a fluorine-based organic solvent to remove the unreacted second film. The step of forming the first film and the second film comprises the step of baking for applying a material and evaporating the solvent. Examples of a method of applying a material include a dipping method, a spin coating method and the like. Conditions of ultraviolet light irradiation has only to be a condition with which the photoreaction adequately proceeds. For example, the film is irradiated at illuminance of 10 mW/cm$^2$ for 1 hour with ultraviolet light with a wavelength of 365 nm. Thus, a liquid-repellent compound 34$a$ and a lyophilic compound 34$b$ were formed on the ITO film 32 and a lyophilic region was defined on the ITO film 32.

Subsequently, PEDOT:PSS was formed in the region designated as a lyophilic region. The PEDOT:PSS was heated for 10 minutes in a clean oven maintained at 200° C. to form a charge transporting layer 33 having a thickness of 60 nm. The formation of the layer was performed, for example, by selectively applying and forming a layer by an ink-jet method.

A chlorobenzene solution composed of MEH-PPV serving as an electron donating organic material and [5,6]-phenyl C61-butylic acid methylester ([5,6]-PCBM) serving as an electron accepting material at a ratio of 1:4 by weight was formed by an ink-jet method or the like and then heated for 30 minutes in a clean oven of 100° C. to form an organic photoelectric conversion layer 35 having a thickness of about 100 nm.

In addition, MEH-PPV is a p-type organic semiconductor and [5,6]-PCBM is an n-type organic semiconductor. Electrons of an exciter generated by light absorption are diffused in a conduction band and donated to [5,6]-PCBM, and holes are diffused in a valence band and donated to MEH-PPV, and these are transmitted to the cathode 36 and the anode 32.

The [5,6]-PCBM is a modified fullerene and has a very large electron mobility, and in addition, since a mixture of the [5,6]-PCBM and the MEH-PPV of an electron donating material can be used, a pair of electron and hole can be separately transported with efficiency, and has an advantage that photoelectric conversion efficiency is high and production cost is low.

Finally, on the organic photoelectric conversion layer 35, LiF 36$b$ was formed in a thickness of about 1 nm and subsequently Al 36$a$ was formed in a thickness of about 10 nm in a resistive heating evaporation apparatus decompressed to a degree of vacuum of 0.27 mPa (=2×10$^{-6}$ Torr) to form a cathode 36.

Thereafter, a passivation film, not shown, was formed thereon to obtain an organic photoelectric conversion element.

Although a detailed description is omitted, by a production method using the compound of the present invention, a contrast between the lyophilicity and the liquid-repellency is made on a substrate, and a material such as ink of R, G, B or a metal paste is applied and thereby a color filter or a metal wiring can be produced.

DESCRIPTION OF THE REFERENCE NUMERALS AND SYMBOLS

1 substrate
2 switching element
3 planarization film
4 first electrode (pixel electrode)
5 charge injection layer
6 intermediate layer
7 light-emitting layer
8 electron transporting layer
9 regulating layer
10 second electrode (common electrode)
11 sealing film

The invention claimed is:
1. A device comprising:
a substrate,
a first electrode formed on the substrate,
a functional thin film formed above the first electrode, and
a second electrode disposed above the functional thin film,
the device being characterized by further comprising, in a region surrounding the region where the functional thin film is formed, a film containing a compound in which a group containing fluorine and a π-conjugated system are bound together by a cycloalkene structure or a cycloalkane structure.

2. The device according to claim 1, wherein
the functional thin film is present in a region of the first electrode, and
the film containing the compound is present in a region surrounding that region of the first electrode.

3. The device according to claim 1, wherein
the first electrode is present in a first region of the substrate,
the functional thin film covers at least part of the first electrode and is present in a second region that includes, in at least a portion thereof, the first region of the substrate, and
the film containing the compound is present in a region surrounding the second region of the substrate.

4. The device according to claim 1, the device being characterized in that the device has an organosilicon compound having a π-conjugated system between the functional thin film and the first electrode.

5. The device according to claim 1, the device being characterized in that
the device has a charge injection layer comprising an inorganic oxide between the first electrode and the functional thin film, and
the device has an organosilicon compound having a π-conjugated system between the charge injection layer and the functional thin film.

6. The device according to claim 1, the device being characterized in that
the device has a regulating layer which is present on the substrate so as to cover at least part of the surrounding of the first electrode and regulates an effective region of the functional thin film, and
the film containing the compound is present in a region of the surface of the regulating layer, the region being present in a region surrounding the region where the functional thin film is present.

7. The device according to claim 6, the device being characterized in that
the device has a charge injection layer comprising an inorganic oxide between the first electrode and the functional thin film, and
the device has an organosilicon compound having a π-conjugated system between the charge injection layer and the functional thin film.

8. The device according to claim 1, the device being characterized in that the functional thin film contains a current injection light-emitting material.

9. The device according to claim 1, the device being characterized in that the functional thin film contains a photoelectric conversion material.

10. The device according to claim 1, the device being characterized in that the compound is a compound formed by irradiating, with light, a first film formed by applying a solution containing a compound (A) being an organosilicon compound having a π-conjugated system onto the substrate, and a second film formed by applying a solution containing a compound (B) containing a π-conjugated system and fluorine onto the first film to bind the π-conjugated system of the compound (A) with the π-conjugated system of the compound (B).

11. The device according to claim 1, the device being characterized in that the compound in which a group containing fluorine and a π-conjugated system are bound together by a cycloalkene structure or a cycloalkane structure is a compound obtained by a photodimerization reaction of a compound represented by the following general formula (1) and a compound represented by the following general formula (4):

[Chem. 1]

C-D  General Formula (1)

wherein C is a group represented by the following general formula (2-1) or the following general formula (2-2), and D represents a group represented by the following general formula (3):

[Chem. 2]

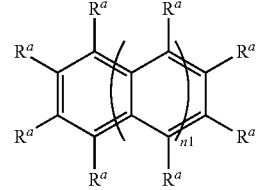

[General Formula (2-1)]

wherein $R^a$ independently at each occurrence represents a hydrogen atom, a substituent or a bond with D, any two adjacent $R^a$s may be coupled with each other to form a ring that is selected from among saturated hydrocarbon rings, unsaturated hydrocarbon rings, aromatic hydrocarbon rings and heterocycles and may have a substituent, at least one of the $R^a$s is a bond with D, and n1 represents an integer of 0 or more,

[Chem. 3]

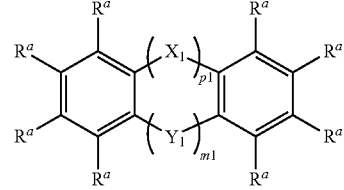

General Formula (2-2)

wherein $R^a$ independently at each occurrence represents a hydrogen atom, a substituent or a bond with D, $X_1$ and $Y_1$ may be the same or different and represent —C($R^a$)$_2$—, —N($R^a$)—, —O—, —S—, —Si($R^a$)$_2$—, —B($R^a$)— or —C($R^a$)=C($R^a$)—, any two adjacent $R^a$s may be coupled with each other to form a ring that is selected from among saturated hydrocarbon rings, unsaturated hydrocarbon rings, aromatic hydrocarbon rings and heterocycles and may have a substituent, at least one of the $R^a$s is a bond with D, and p1 and m1 are the same or different and represent an integer of 0 or more,

[Chem. 4]

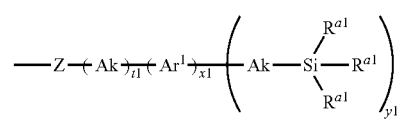

General Formula (3)

wherein Z represents —C(=O)O—, —OC(=O)—, —OC(=O)O—, —C(=O)—, —N($R^c$)—, —C(=O)N($R^c$)—, —N($R^c$)C(=O)—, —N($R^c$)C(=O)N($R^c$)—, -Ak-C(=O)O—, -Ak-OC(=O)—, -Ak-OC(=O)O—, -Ak-C(=O)—, -Ak-N(R$^c$)—, -Ak-C(=O)N(R$^c$)—, -Ak-N(R$^c$)C(=O)—, -Ak-N(R$^c$)C(=O)N(R$^c$)—, —O—, —S— or -Ak-, Ar$^1$ represents an aromatic hydrocarbon group having a valence of (1+y1) or a heterocyclic group having a valence of (1+y1), Ak represents an alkylene group having 1 to 12 carbon atoms, R$^{a1}$ represents a hydrogen atom, a halogen atom, a hydroxyl group, an alkoxy group or an alkyl group, R$^c$ represents a hydrogen atom or a substituent, and where there are a plurality of R$^c$s, these R$^c$s may be the same or different, t1 represents 0 or 1, x1 represents 0 or 1, and y1 represents an integer of 1 or more, the plurality of R$^{a1}$s may be the same or different, and where there are a plurality of Aks, these Aks may be the same or different,

[Chem. 5]

E-F      General Formula (4)

wherein E is a group represented by the following general formula (5-1) or the following general formula (5-2) or the following general formula (5-3), and F represents a group represented by the following general formula (6-1) or the following general formula (6-2):

[Chem. 6]

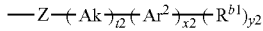

General Formula (5-1)

wherein Z represents —C(=O)O—, —OC(=O)—, —OC(=O)O—, —C(=O)—, —N(R$^c$)—, —C(=O)N(R$^c$)—, —N(R$^c$)C(=O)—, —N(R$^c$)C(=O)N(R$^c$)—, -Ak-C(=O)O—, -Ak-OC(=O)—, -Ak-OC(=O)O—, -Ak-C(=O)—, -Ak-N(R$^c$)—, -Ak-C(=O)N(R$^c$)—, -Ak-N(R$^c$)C(=O)—, -Ak-N(R$^c$)C(=O)N(R$^c$)—, —O—, —S— or -Ak-, Ak represents an alkylene group having 1 to 12 carbon atoms, R$^c$ represents a hydrogen atom or a substituent, and where there are a plurality of R$^c$s, these R$^c$s may be the same or different, Ar$^2$ represents an aromatic hydrocarbon group having a valence of (1+y2) or a heterocyclic group having a valence of (1+y2), R$^{b1}$ represents a monovalent organic group containing a fluorine atom, t2 represents 0 or 1, x2 represents 0 or 1, y2 represents an integer of 1 or more, and where there are a plurality of R$^{b1}$s, these R$^{b1}$s may be the same or different,

[Chem. 7]

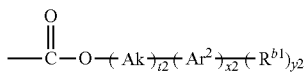

General Formula (5-2)

wherein Ar$^2$, R$^{b1}$, Ak, t2, x2 and y2 respectively represent the same meanings as those described above,

[Chem. 8]

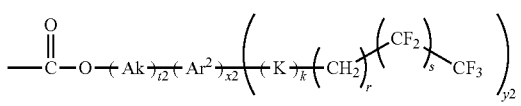

General Formula (5-3)

wherein Ar$^2$, Ak, t2, x2 and y2 respectively represent the same meanings as those described above, K represents —O—, —S—, —NH— or —NR—, R represents an alkyl group or an aryl group, k represents 0 or 1, r represents an integer of 0 to 3, s represents an integer of 0 to 15, and where there are a plurality of k's, these k's may be the same or different, where there are a plurality of r's, these r's may be the same or different, and where there are a plurality of s's, these s's may be the same or different,

[Chem. 9]

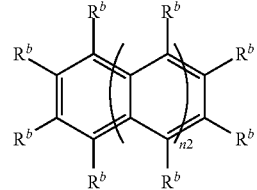

General Formula (6-1)

wherein R$^b$ independently at each occurrence represents a hydrogen atom, a substituent or a bond with E, any two adjacent R$^b$s may be coupled with each other to form a ring that is selected from among saturated hydrocarbon rings, unsaturated hydrocarbon rings, aromatic hydrocarbon rings and heterocycles and may have a substituent, at least one of the R$^b$s is a bond with E, and n2 represents an integer of 0 or more,

[Chem. 10]

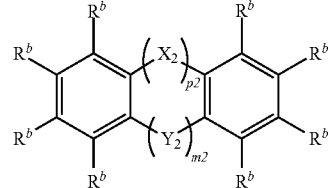

General Formula (6-2)

wherein R$^b$ independently at each occurrence represents a hydrogen atom, a substituent or a bond with E, X$_2$ and Y$_2$ may be the same or different and represent —C(R$^b$)$_2$—, —N(R$^b$)—, —O—, —S—, —Si(R$^b$)$_2$—, —B(R$^b$)— or —C(R$^b$)=C(R$^b$)—, any two adjacent R$^b$s may be coupled with each other to form a ring that is selected from among saturated hydrocarbon rings, unsaturated hydrocarbon rings, aromatic hydrocarbon rings and heterocycles and may have a substituent, at least one of the R$^b$s is a bond with E, and p2 and m2 are the same or different and represent an integer of 0 or more.

12. A thin film transistor comprising:
a substrate,
a gate electrode formed on the substrate,
an insulating film formed on the gate electrode,
a source electrode formed on the insulating film,
a drain electrode formed in a region on the insulating film, the region being separate from from the region where the source electrode is formed, and
a functional thin film formed so as to cover a region on the insulating film between the source electrode and the drain electrode and ends of the source electrode and the drain electrode,
the thin film transistor being characterized by further comprising a film containing a compound in which a group containing fluorine and a π-conjugated system are bound together by a cycloalkene structure or a cycloalkane structure, in a region surrounding the region where the functional thin film on the source electrode and the drain electrode is formed.

13. The thin film transistor according to claim 12, characterized in that the compound is a compound formed by irradiating, with light, a first film formed by applying a solution containing a compound (A) being an organosilicon compound having a π-conjugated system onto the substrate, and a second film formed by applying a solution containing a compound (B) containing a π-conjugated system and fluorine onto the first film to bind the π-conjugated system of the compound (A) with the π-conjugated system of the compound (B).

14. The thin film transistor according to claim 12 characterized in that a buffer layer is included between the source electrode and the functional thin film or between the drain electrode and the functional thin film.

15. A thin film transistor comprising:
a substrate,
a source electrode formed on the substrate,
a drain electrode formed in a region on the substrate, the region being separate from the region where the source electrode is formed,
a functional thin film formed so as to cover a region on the substrate between the source electrode and the drain electrode and ends of the source electrode and the drain electrode,
an insulating film formed so as to cover the functional thin film, and
a gate electrode formed on the insulating film,
the thin film transistor being characterized by further comprising a film containing a compound in which a group containing fluorine and a π-conjugated system are bound together by a cycloalkene structure or a cycloalkane structure, in a region surrounding the region where the functional thin film on the source electrode and the drain electrode is formed.

16. A method for producing a device, the method being characterized by comprising:
a first step of applying a solution containing a compound (A) being an organosilicon compound having a π-conjugated system onto the surface of a substrate having a first electrode formed thereon to form a first film;
a second step of subsequently applying a solution containing a compound (B) containing a π-conjugated system and fluorine to form a second film on the first film;
a third step of irradiating the first film and the second film with light to bind the π-conjugated system of the compound (A) with the π-conjugated system of the compound (B);
a fourth step of applying a solution containing a functional material onto a base to form a functional thin film; and
a fifth step of disposing a second electrode on the functional thin film.

17. The method for producing a device according to claim 16, the method being characterized in that light used in light irradiation has a wavelength of 200 nm or more and 380 nm or less.

18. The method for producing a device according to claim 16, the method being characterized in that the compound (A) being an organosilicon compound having a π-conjugated system is a compound represented by the following general formula (1) and the compound (B) containing a π-conjugated system and fluorine is a compound represented by the following general formula (4):

[Chem. 11]

C-D        General Formula (1)

wherein C is a group represented by the following general formula (2-1) or the following general formula (2-2) and D represents a group represented by the following general formula (3):

[Chem. 12]

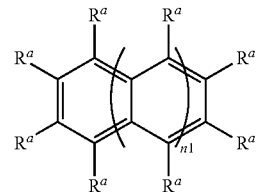

[General Formula (2-1)]

wherein $R^a$ independently at each occurrence represents a hydrogen atom, a substituent or a bond with D, the plurality of $R^a$s may be the same or different, any two adjacent $R^a$s may be coupled with each other to form a ring that is selected from among saturated hydrocarbon rings, unsaturated hydrocarbon rings, aromatic hydrocarbon rings and heterocycles and may have a substituent, at least one of the $R^a$s is a bond with D, and n1 represents an integer of 0 or more,

[Chem. 13]

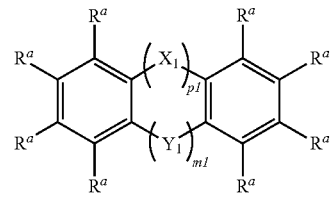

General Formula (2-2)

wherein $R^a$ independently at each occurrence represents a hydrogen atom, a substituent or a bond with D, $X_1$ and $Y_1$ may be the same or different and represent —C($R^a$)$_2$—, —N($R^a$)—, —O—, —S—, —Si($R^a$)$_2$—, —B($R^a$)— or —C($R^a$)=C($R^a$)—, any two adjacent $R^a$s may be coupled with each other to form a ring that is selected from among saturated hydrocarbon rings, unsaturated hydrocarbon rings, aromatic hydrocarbon rings and heterocycles and may have a substituent, at least one of the $R^a$s is a bond with D, and p1 and m1 are the same or different and represent an integer of 0 or more,

[Chem. 14]

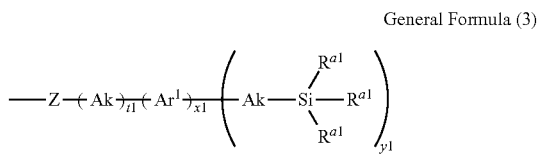

General Formula (3)

wherein Z represents —C(=O)O—, —OC(=O)—, —OC(=O)O—, —C(=O)—, —N($R^c$)—, —C(=O)N($R^c$)—, —N($R^c$)C(=O)—, —N($R^c$)C(=O)N($R^c$)—, -Ak-C(=O)O—, -Ak-OC(=O)—, -Ak-OC(=O)O—, -Ak-C(=O)—, -Ak-N($R^c$)—, -Ak-C(=O)N($R^c$)—, -Ak-N($R^c$)C(=O)—, -Ak-N($R^c$)C(=O)N($R^c$)—, —O—, —S— or -Ak-, $Ar^1$ represents an aromatic hydrocarbon group having a valence of (1+y1) or a heterocyclic group having a valence of (1+y1), Ak represents an alkylene group having 1 to 12 carbon atoms, $R^{a1}$ represents a hydrogen atom, a halogen atom, a hydroxyl group, an alkoxy group or an alkyl group, $R^c$ represents a hydrogen atom or a substituent, and where there are a plurality of $R^c$s, these $R^c$s may be the same or different, t1 represents 0 or 1, x1 represents 0 or 1, y1 represents an integer of 1 or more, the plurality of $R^{a1}$s may be the same or different, and where there are a plurality of Aks, these Aks may be the same or different,

[Chem. 15]

E-F   General Formula (4)

wherein E is a group represented by the following general formula (5-1) or the following general formula (5-2) or the following general formula (5-3), and F represents a group represented by the following general formula (6-1) or the following general formula (6-2):

[Chem. 16]

General Formula (5-1)

—Z—(Ak)$_{t2}$—(Ar$^2$)$_{x2}$—(R$^{b1}$)$_{y2}$ wherein Z represents —C(=O)O—, —OC(=O)—, —OC(=O)O—, —C(=O)—, —N(R$^c$)—, —C(=O)N(R$^c$)—, —N(R$^c$)C(=O)—, —N(R$^c$)C(=O)N(R$^c$)—, -Ak-C(=O)O—, -Ak-OC(=O)—, -Ak-OC(=O)O—, -Ak-C(=O)—, -Ak-N(R$^c$)—, -Ak-C(=O)N(R$^c$)—, -Ak-N(R$^c$)C(=O)—, -Ak-N(R$^c$)C(=O)N(R$^c$)—, —O—, —S— or -Ak-, Ak represents an alkylene group having 1 to 12 carbon atoms, $R^c$ represents a hydrogen atom or a substituent, and where there are a plurality of $R^c$s, these $R^c$s may be the same or different, Ar$^2$ represents an aromatic hydrocarbon group having a valence of (1+y2) or a heterocyclic group having a valence of (1+y2), $R^{b1}$ represents a monovalent organic group containing a fluorine atom, t2 represents 0 or 1, x2 represents 0 or 1, y2 represents an integer of 1 or more, and where there are a plurality of $R^{b1}$s, these $R^{b1}$s may be the same or different,

[Chem. 17]

General Formula (5-2)

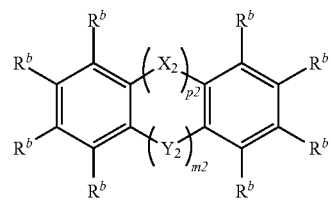

wherein Ar$^2$, $R_{b1}$, Ak, t2, x2 and y2 respectively represent the same meanings as those described above,

[Chem. 18]

General Formula (5-3)

wherein Ar$^2$, Ak, t2, x2 and y2 respectively represent the same meanings as those described above, K represents —O—, —S—, —NH— or —NR—, R represents an alkyl group or an aryl group, k represents 0 or 1, r represents an integer of 0 to 3, s represents an integer of 0 to 15, and where there are a plurality of k's, these k's may be the same or different, where there are a plurality of r's, these r's may be the same or different, and where there are a plurality of s's, these s's may be the same or different,

[Chem. 19]

General Formula (6-1)

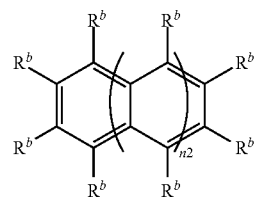

wherein $R^b$ independently at each occurrence represents a hydrogen atom, a substituent or a bond with E, any two adjacent $R^b$s may be coupled with each other to form a ring that is selected from among saturated hydrocarbon rings, unsaturated hydrocarbon rings, aromatic hydrocarbon rings and heterocycles and may have a substituent, at least one of the $R^b$s is a bond with E, and n2 represents an integer of 0 or more,

[Chem. 20]

General Formula (6-2)

wherein $R^b$ independently at each occurrence represents a hydrogen atom, a substituent or a bond with E, $X_2$ and $Y_2$ may be the same or different and represent —C($R^b$)$_2$—, —N($R^b$)—, —O—, —S—, —Si($R^b$)$_2$—, —B($R^b$)— or —C($R^b$)=C($R^b$)—, any two adjacent $R^b$s may be coupled with each other to form a ring that is selected from among saturated hydrocarbon rings, unsaturated hydrocarbon rings, aromatic hydrocarbon rings and heterocycles and may have a substituent, at least one of the $R^b$s is a bond with E, and p2 and m2 are the same or different and represent an integer of 0 or more.

19. A method for producing a thin film transistor, the method being characterized by comprising the steps of:
    forming a gate electrode on a substrate and forming a gate insulating film on the gate electrode;
    forming a drain electrode and a source electrode on the gate insulating film;
    applying a solution containing a compound (A) being an organosilicon compound having a π-conjugated system onto the gate insulating film, onto the drain electrode and onto the source electrode to form a first film;
    applying subsequently a solution containing a compound (B) containing a π-conjugated system and fluorine to form a second film on the first film;

irradiating the first film and the second film with light to bind the π-conjugated system of the compound (A) with the π-conjugated system of the compound (B); and forming a functional thin film in a region between the source electrode and the drain electrode.

20. The method for producing a thin film transistor according to claim 19, the method being characterized in that light used in light irradiation has a wavelength of 200 nm or more and 380 nm or less.

21. A method for producing a thin film transistor, the method being characterized by comprising the steps of:

applying a solution containing a compound (A) being an organosilicon compound having a π-conjugated system onto a substrate having a source electrode and a drain electrode both formed on the substrate, to form a first film;

applying subsequently a solution containing a compound (B) containing a π-conjugated system and fluorine to form a second film on the first film;

irradiating the first film and the second film with light to bind the π-conjugated system of the compound (A) with the π-conjugated system of the compound (B);

forming a functional thin film; and forming a gate insulating film on the functional thin film and subsequently forming a gate electrode.

* * * * *